United States Patent
Hampden-Smith et al.

(10) Patent No.: US 7,098,163 B2
(45) Date of Patent: Aug. 29, 2006

(54) METHOD OF PRODUCING MEMBRANE ELECTRODE ASSEMBLIES FOR USE IN PROTON EXCHANGE MEMBRANE AND DIRECT METHANOL FUEL CELLS

(75) Inventors: Mark J. Hampden-Smith, Albuquerque, NM (US); Toivo T. Kodas, Albuquerque, NM (US); Paolina Atanassova, Albuquerque, NM (US); Rimple Bhatia, Placitas, NM (US); Ross A. Miesem, Albuquerque, NM (US); Paul Napolitano, Albuquerque, NM (US); Gordon L. Rice, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 102 days.

(21) Appl. No.: 10/417,417

(22) Filed: Apr. 16, 2003

(65) Prior Publication Data
US 2004/0038808 A1    Feb. 26, 2004

Related U.S. Application Data

(63) Continuation-in-part of application No. 10/265,351, filed on Oct. 4, 2002, and a continuation-in-part of application No. 09/815,380, filed on Mar. 22, 2001, which is a continuation-in-part of application No. 09/589,710, filed on Jun. 8, 2000, now Pat. No. 6,753,108, which is a continuation-in-part of application No. 09/532,917, filed on Mar. 22, 2000, now Pat. No. 6,660,680, which is a continuation-in-part of application No. 09/141,397, filed on Aug. 27, 1998, now Pat. No. 6,103,393.

(60) Provisional application No. 60/327,620, filed on Oct. 5, 2001.

(51) Int. Cl.
| | |
|---|---|
| H01M 4/88 | (2006.01) |
| H01M 4/86 | (2006.01) |
| H01M 4/90 | (2006.01) |
| H01M 4/96 | (2006.01) |

(52) U.S. Cl. .................. 502/101; 429/40; 429/41; 429/42; 429/43; 429/44

(58) Field of Classification Search ............... 502/101; 429/40–44
See application file for complete search history.

(56) References Cited

U.S. PATENT DOCUMENTS

| 4,256,545 | A | * | 3/1981 | Deborski .............. 204/290.01 |
| 5,181,050 | A | * | 1/1993 | Bibl et al. ................ 347/148 |
| 5,759,712 | A | * | 6/1998 | Hockaday .................. 429/30 |
| 5,843,519 | A | * | 12/1998 | Tada ........................ 427/115 |
| 5,900,386 | A | * | 5/1999 | Freund et al. ............. 502/330 |
| 6,007,934 | A | * | 12/1999 | Auer et al. .................. 429/44 |
| 6,187,467 | B1 | * | 2/2001 | Zhang et al. ................ 429/42 |
| 6,196,479 | B1 | * | 3/2001 | Edlinger ...................... 241/1 |
| 6,660,680 | B1 | * | 12/2003 | Hampden-Smith et al. . 502/180 |

* cited by examiner

Primary Examiner—J. A. Lorengo
Assistant Examiner—Patricia L. Hailey
(74) Attorney, Agent, or Firm—Marsh Fischmann & Breyfogle LLP

(57) ABSTRACT

Compositions and methods for the manufacture of electrodes for fuel cells. The compositions and methods are particularly useful for the manufacture of anodes and cathodes for proton exchange membrane fuel cells, particularly direct methanol fuel cells. The methods can utilize direct-write tools to deposit ink compositions and form functional layers of a membrane electrode assembly having controlled properties and enhanced performance.

48 Claims, 27 Drawing Sheets

METHOD OF PRODUCING MEMBRANE ELECTRODE ASSEMBLIES FOR USE IN PROTON EXCHANGE MEMBRANE AND DIRECT METHANOL FUEL CELLS

CROSS-REFERENCE TO RELATED APPLICATIONS

This application is a continuation-in-part of U.S. patent application Ser. No. 10/265,351 filed Oct. 4, 2002, which claims the benefit of U.S. Provisional Patent Application Ser. No. 60/327,620 filed Oct. 5, 2001, each of which is incorporated herein by reference in their entirety. This application is also a continuation-in-part of U.S. patent application Ser. No. 09/815,380, filed Mar. 22, 2001, which is a continuation-in-part of U.S. patent application Ser. No. 09/589,710, now U.S. Pat. No. 6,753,108, filed on Jun. 8, 2000, which is a continuation-in-part of U.S. patent application Ser. No. 09/532,917, now U.S. Pat. No. 6,660,680, filed on Mar. 22, 2000, which is a continuation-in-part of U.S. patent application Ser. No. 09/141,397, filed on Aug. 27, 1998, now U.S. Pat. No. 6,103,393. Each of these applications are incorporated herein by reference in their entirety.

STATEMENT REGARDING FEDERALLY FUNDED RESEARCH

This invention was made under Cooperative Agreement No. 70NANB2H3021 with the National Institute of Standards and Technology (NIST). The government has certain rights in this invention.

BACKGROUND OF THE INVENTION

1. Field of Invention

The present invention relates to methods for manufacturing membrane electrode assemblies useful in proton exchange membrane and direct methanol fuel cells, including compositions useful for the deposition of the various layers in the membrane electrode assemblies. The methods enable rapid production of the membrane electrode assemblies and layers used therein. The present invention also relates to membrane electrode assemblies, including the gas and fluid distribution layers used therein, as well as proton exchange membrane and direct methanol fuel cells produced by the method.

2. Description of Related Art

Fuel cells are electrochemical devices that are capable of converting the energy of a chemical reaction into electrical energy without combustion and with virtually no pollution. A typical fuel cell includes a stack of membrane electrode assemblies (MEAs). Generally, MEAs comprise an anode, a cathode and a solid or liquid electrolyte disposed between the anode and the cathode. Different types of fuel cells are categorized by the electrolyte used in the fuel cell, the five main types being alkaline (including metal-air fuel cells), molten carbonate, phosphoric acid, solid oxide and proton exchange membrane (PEM) or solid polymer electrolyte fuel cells (PEFCs). A particularly preferred fuel cell for portable applications, due to its compact construction, power density, efficiency and operating temperature, is a proton exchange membrane fuel cell (PEMFC) which can utilize methanol directly without the use of a fuel reformer. This type of fuel cell is referred to as a direct methanol fuel cell (DMFC). Other liquid fuels may also be used in a liquid fueled fuel cell including formic acid, formaldehyde, ethanol and ethylene glycol. DMFCs are related to PEMFCs because both types employ a proton exchange membrane and oxygen as an oxidant on the cathode, but they are different in that DMFCs utilize liquid methanol as the fuel on the anode whereas a PEMFC utilizes a gas feed containing hydrogen. The hydrogen feed for a PEMFC can originate from a reformed methanol fuel feed as well as other fuel sources such as methane or propane. DMFCs are attractive for applications that require relatively low power because the anode achieves the combined function of "reforming" the methanol directly into hydrogen ions that can be delivered to the cathode through the PEM. This avoids the need for a separate methanol reforming system thereby reducing the size, and potentially the cost, of the overall system.

A DMFC is comprised of membrane electrode assemblies (MEAs). A cross-sectional view of a typical MEA is illustrated in FIG. 1 (not to scale). The MEA 100 comprises a PEM 102, an anode 104 and a cathode 110, and anode and cathode fluid distribution layers 106 and 112. The anode and cathode each include an electrocatalyst layer 120 and 122 which sandwich the PEM. The gas or fluid distribution layers, 106 and 112, typically include a carbon-based substrate and each layer is located next to its respective electrode. Bipolar plates 108 and 114 are disposed between the anode and cathode of sequential MEA stacks and comprise current collectors and flow fields, 116 and 118, for directing the flow of incoming reactant fluid to the appropriate electrode. Two end plates (not shown), similar to the bipolar plates, are used to complete the fuel cell stack.

The bipolar plates serve as electrically conductive separator elements between two adjacent MEAs, and (1) have reactant distributing grooves on both external faces thereof, (2) conduct electrical current between the anode of one MEA and the cathode of the adjacent MEA in the stack, and (3) in most cases, have internal passages which are defined by internal heat exchange faces and through which coolant flows to remove heat from the stack. Bipolar plates are often fabricated from graphite which is lightweight, corrosion resistant and electrically conductive in the PEM fuel cell environment. In certain cases, bipolar plates may also be fabricated from metals including expanded metals, metal foams and porous metal sheets. Bipolar plates are also gas impermeable to prevent mixing of the two reactants, which would lead to direct oxidation of the methanol. Bipolar plates are described in more detail in, for example, U.S. Pat. No. 5,776,624 by Neutzler and U.S. Pat. No. 6,255,012 by Wilson, et al, which are incorporated herein by reference in their entirety.

During operation of the DMFC, methanol is supplied to the anode and oxygen (air) is supplied to the cathode to create the reactants necessary to operate the fuel cell. Methanol flows through the flow fields 116 of bipolar plate 108, through the anode fluid distribution layer 106 and to the anode electrocatalyst layer 120, where it is oxidized. Oxygen flows through the flow fields 118 of bipolar plate 114 through the cathode fluid distribution layer 112, and to the cathode electrocatalyst layer 122 where the oxygen molecules are reduced to oxygen ions. Electrons from the oxidized methanol are routed to the cathode 110 through an external circuit 130 connecting the bipolar plates 108 and 114 to produce electrical current. Protons from the oxidized methanol pass from the anode to the cathode through the PEM 102 and recombine with the electrons and ionized oxygen to form water. Carbon dioxide is produced at the anode and is removed through the exhaust of the cell. The foregoing reactions can be written as follows:

Anode: $CH_3OH+H_2O \rightarrow CO_2+6H^++6e^-$ (1)

Cathode: $6H^++6e^-+3/2O_2 \rightarrow 3H_2O$ (2)

Overall: $2CH_3OH+3O_2 \rightarrow 2CO_2+6H_2O+energy$ (3)

Although the theory behind fuel cell operation has been known for over 100 years, there has been difficulty producing commercially viable fuel cells due to technological barriers, and also due to the availability of more cost-effective energy sources such as petroleum. However, devices using petroleum products, such as the automobile, produce significant pollution and may eventually become obsolete with the depletion of petroleum resources. As a result, there is a need for an alternative means for producing energy. Fuel cells are a promising alternative source of energy in that they are relatively pollution-free and utilize hydrogen, a seemingly infinite fuel source.

Among the critical issues that must be addressed for the successful commercialization of fuel cells are cell cost, cell performance and operating lifetime. For stationary applications, improved power density is critical. For automotive applications, high voltage efficiencies are necessary. In terms of cell performance and operating lifetime, it is important that the fuel cell be constructed to minimize kinetic, ohmic and mass transport losses within individual MEAs. A major technical challenge is enabling the efficient transport of methanol, water, oxygen, carbon dioxide, protons and electrons to and from the relevant locations in the MEA. The efficient transport of these reactants and by-products will increase both the cell performance and the operating lifetime of the fuel cell. Most current manufacturing methods are not capable of forming structures that enable all around efficient transport of reactants and by-products within the MEA.

Aside from optimizing the cell performance by improving the aforementioned transport characteristics of the MEA, the successful commercialization of fuel cells depends on producing MEAs at a reasonable cost. The ideal MEA manufacturing process is one that rapidly and continuously produces MEAs having good transport characteristics, and with reduced manufacturing down-time and reduced capital costs associated with the MEAs. One way to decrease capital costs, without decreasing cell performance, is to place the required materials only where needed within the MEA structure, especially the expensive catalyst materials.

Fuel cells operate most efficiently when the electrocatalytically active sites are in direct contact with both the PEM and the supply fuel. This location within the electrode is known as the three-phase interface. Most, conventional methods for manufacturing MEAs cannot deposit catalyst and other materials in predetermined locations to increase the catalyst utilization. As a result, an unnecessarily large amount of catalyst is deposited. Depositing the catalyst in relation to other materials such that the catalyst is located only in the areas where the three-phase interface (discussed below) occurs would decrease the capital cost of the MEA without sacrificing performance.

There are many different methods for producing the layers of an MEA including physical vapor deposition, screen printing, dry powder lamination, spraying, extrusion (a.k.a., slot die), electrostatic printing, and dry powder vacuum deposition. However, there are many drawbacks to these manufacturing methods. Many of the processes are laboratory methods, which cannot be used in full-scale manufacturing processes. Many of the processes are slow and require significant amounts of down-time to change patterns. Many of the processes cannot directly deposit materials on flexible or low-temperature surfaces such as thin polymer membranes. Many of the processes cannot precisely control the volume or concentration of the deposited materials on selected microscopic areas of the substrate and many of the processes cannot deposit the materials on the substrate in a pattern or cannot deposit patterns with a small line width. As a result, controlled gradients in composition, concentration or porosity within layers are difficult to fabricate. Many of the processes are not compatible with all of the required materials which results in the use of different deposition methods during the fabrication of the MEA. This increases the number of deposition steps, which in itself is inefficient and may lead to alignment errors within the MEA and lead to unnecessary handling and breakage of fragile components such as the thin PEM.

Lamination is well-known in the art and in the context of MEA manufacture refers to a process where two components, e.g., a PEM and an electrode, are bonded together using heat, pressure and/or an adhesive. U.S. Pat. No. 6,197,147 by Bonsil et al. discloses a laminating process for producing MEAs. The process comprises laminating an ion-conductive membrane, a catalytically active substance and a gas permeable electron conductive material. It is disclosed that the membrane and/or conductive material can be contacted with a compound such as hexachloroplatinic acid, which is then reduced to form platinum metal.

Decalcomania is generally defined as a process for transferring designs printed on a specially prepared transfer substrate to materials such as glass or metal. In the context of MEA assembly, the designs are the deposition patterns used to create the various layers of the MEA which are then transferred to a MEA substrate, such as a PEM, gas or fluid distribution layer or bipolar plate. In practice, an ink composition is deposited onto a blank cartridge, herein referred to as a transferring substrate. The transferring substrate and the MEA substrate are then sandwiched together and pressed in a heated environment. The heat cures the ink to the substrate thereby releasing it from the transferring substrate and depositing it on the substrate. The transferring substrate is then removed by peeling it from the deposited ink layer.

U.S. Pat. No. 5,211,984 by Wilson discloses a method of producing MEAs by decalcomania. An ink composition comprising a supported platinum catalyst and a proton conducting polymer is painted on a release blank to form a thin film decal. The decal is then transferred to the surface of a PEM using a heat press.

Decalcomania and lamination are advantageous in that they can deposit materials on fragile surfaces and are relatively simple to operate. Lamination also provides a high throughput. However, decal and lamination methods cannot produce fine patterns or gradients in composition without additional processing. Moreover, aligning the various MEA layers can be difficult.

U.S. Pat. No. 6,187,467 by Zhang et al. discloses the manufacture of electrodes using sequential impregnation and printing. First, a proton conducting polymer is impregnated onto a surface of a substrate, such as carbon fiber paper. The impregnation may be accomplished using a variety of techniques such as dipping the substrate into a solution comprising the proton conducting polymer. An electrocatalyst is then applied to the impregnated substrate. It is disclosed that the electrocatalyst can be applied to the substrate in the form of an aqueous ink including a proton conducting ionomer in solution by any known method including spraying, screen printing and ink-jet printing.

International (WIPO) Publication No. WO 0205365 by Gascoyne et al. discloses an ink composition useful in fabricating the anode of a PEMFC. The ink comprises a liquid medium, which may be aqueous or organic, one or more electrocatalyst, one or more proton-conducting polymer and one or more water retaining materials. It is disclosed that the ink may be applied to a substrate by any variety of methods known in the art such as filtration, vacuum deposition, spray deposition, casting, extrusion, rolling, printing or decal transfer. The substrate may be either the fluid distribution layer or the PEM.

Methods to produce MEAs using ink compositions containing carbon particles and zero-valent Pt compounds have been disclosed by Starz et al. in U.S. Pat. No. 6,500,217. This patent discloses a process for applying electrode layers to the front and back of a polymer electrolyte membrane strip.

Ink-jet deposition of platinum sols has been disclosed by Shah et al. (Langmuir, 1999, Vol. 15, pp., 1584–1587) for use as a catalyst in electroless copper deposition for microelectronic applications.

U.S. Pat. No. 5,672,439 by Wilkinson et al. discloses an MEA for a DMFC wherein crossover of the liquid methanol from the anode to the cathode is reduced. To reduce crossover, catalyst particles that promote the oxidation of the methanol in the anode can be concentrated on a surface of the anode.

U.S. Pat. No. 6,024,848 by Dufner et al. discloses an electrochemical cell such as a PEMFC. The cell can include a bi-layer for enhancing the transport of fluids within the cell. The bi-layer is in contact with an electrode and includes a hydrophobic phase of carbon black and a hydrophobic polymer, as well as a hydrophilic phase including a mixture of carbon black and a proton exchange resin. The bi-layer can be formed by a filter transfer process.

U.S. Pat. No. 6,156,449 by Zuber et al. discloses a catalyst layer, such as in a PEMFC, which includes a proton-conducting polymer, electrically conductive carbon particles and fine particles of a precious metal such as platinum. The layer is formed from an ink composition that includes carbon particles and at least one organic precious metal complex compound in a solution of the ionomer. The composition is applied and dried wherein the complex compounds are thermally decomposed during drying to form precious metal particles.

There is a need for a manufacturing process which can rapidly and economically produce MEAs with the aforementioned transport characteristics. That is where: methanol is transported within the MEA directly to the active sites within the electrocatalyst layer but away from the PEM to prevent cross-over; electrons are transported quickly from the anode electrocatalyst layer to the electrically conductive portions of the anode bipolar plate; water is transported through the anode and PEM quickly to deliver methanol to the active sites, maintain the hydration of the PEM and prevent back-pressure on the PEM; and $CO_2$ is transported out of the anode in its dissolved state to prevent the removal of the methanol fuel.

It would be advantageous to provide an MEA manufacturing process which is capable of depositing all desired materials on fragile or durable substrates in a desired pattern and in a desired concentration. It would be advantageous to provide a single deposition method which is capable of depositing all materials in desired patterns and concentrations. It would be advantageous to provide an MEA manufacturing process which is capable of depositing materials quickly and without substantial changes in materials or downtime. The MEA manufacturing process for a DMFC should be able to construct liquid diffusion electrodes for the DMFC anode and gas diffusion electrodes for the cathode. The design elements of the DMFC gas diffusion cathode can also be incorporated into the design of a gas diffusion anode and therefore used for other types of fuel cells including PEMFC.

SUMMARY OF THE INVENTION

The present invention provides a method to manufacture MEAs for PEMFC and DMFC applications at high volumes with electrode structures that result in improved performance.

One important aspect of the present invention is the ability to print or coat layers that comprise the electrodes in the MEA, where the layers are specifically designed for the liquid and gas transport and electrocatalytic reactions of liquid fuels, for example methanol in the case of anodes for DMFCs and gaseous reagents in the case of DMFC cathodes and PEMFC anodes and cathodes. The electrode structures according to one embodiment of the present invention are produced by printing or coating individual layers with different compositions such that a gradient in composition is produced in the vertical or horizontal direction, or a combination of the horizontal and vertical directions.

In a further aspect of the present invention, the gradient structures that comprise the electrodes are produced by a direct-write printing method, preferably including direct-write tools such as ink-jet devices and syringe dispense devices.

The gradient structures can include gradients of composition, microstructure and/or porosity. The gradient in composition can include gradients in concentration of electrocatalyst, ionomer, hydrophobic materials and carbon.

In a further aspect of the present invention, it is advantageous to use a direct write, preferably non-contact printing method to produce the gradient layer structures to enable the sequential coating of layers which can be printed/coated while the layers are still wet at one extreme, or substantially dry at the other extreme, to control the compositional gradient at the interface between the adjacent layers.

According to one embodiment of the present invention, a method for the fabrication of a catalyst layer is provided comprising the steps of depositing an ink composition onto a substrate, the ink composition including a liquid vehicle, a particulate support phase and a molecular precursor to an active species phase. The ink composition is heated to a temperature of not greater than about 200° C. to convert the molecular precursor to an active species phase dispersed on the support phase and form a catalyst layer. The depositing step can include depositing the ink composition using a direct-write tool, such as an ink-jet device. The substrate can be, for example, ion exchange membrane. The particulate support phase can be a metal oxide or carbon.

According to another embodiment of the present invention, an ink composition useful for the formation of an electrocatalyst layer is provided. The ink composition includes a liquid vehicle, a molecular precursor to an active species phase, wherein the molecular precursor can be converted to the active species phase at a temperature of not greater than about 200° C., and particulate carbon.

According to another embodiment of the present invention, a method for the manufacture of an electrode for a fuel cell is provided, including the steps of depositing a first ink composition including at least a first material selected from the group consisting of electrocatalyst particles, a proton conducting polymer, a hydrophobic material and particulate carbon on at least a portion of a substrate to form a first material layer and depositing a second ink composition on at least a portion of the first material layer, wherein the second ink composition is different than the first ink composition. In one embodiment, the second ink composition includes the first material in a concentration that is different than the concentration of the first material in the first ink composition.

According to another embodiment of the present invention, an electrode for a direct methanol fuel cell is provided, that includes a proton exchange membrane, a first electrocatalyst layer having first electrocatalyst particles disposed on the proton exchange membrane and a second electrocatalyst layer having second electrocatalyst particles disposed on the first electrocatalyst layer, wherein the second electrocatalyst particles have an average particle size that is larger than the first electrocatalyst particles. A fluid distribution layer can be disposed over the second electrocatalyst layer.

According to another embodiment of the present invention, a method for the fabrication of an electrode for a direct methanol fuel cell is provided, including the steps of providing a proton exchange membrane, depositing a first ink composition having first electrocatalyst particles on the proton exchange membrane to form a first electrocatalyst layer, depositing a second ink composition comprising second electrocatalyst particles on at least a portion of the first electrocatalyst layer, wherein the second electrocatalyst particles have an average particle size that is larger than the first electrocatalyst particles, and attaching a fluid distribution layer over the first and second electrocatalyst layers.

According to another embodiment of the present invention, an electrode for a direct methanol fuel cell is provided comprising a proton exchange membrane, a first electrocatalyst layer including first electrocatalyst particles disposed on first regions of the proton exchange membrane, a second electrocatalyst layer comprising second electrocatalyst particles disposed on second regions of the proton exchange membrane, wherein the second electrocatalyst particles have an average particle size that is larger than the first electrocatalyst particles, and a fluid distribution layer disposed over the first and second electrocatalyst layers.

According to another embodiment of the present invention, a method for making an electrode for a direct methanol fuel cell is provided. The method includes the steps of providing a proton exchange membrane, depositing a first ink composition including first electrocatalyst particles on first regions of the proton exchange membrane to form a first electrocatalyst layer and depositing a second ink composition comprising second electrocatalyst particles on second regions of the proton exchange membrane to form a second electrocatalyst layer, wherein the second electrocatalyst particles have an average particle size that is larger than the electrocatalyst particles. A fluid distribution layer can then be deposited over the first and second electrocatalyst layers.

According to another embodiment of the present invention, a method for the manufacture of a membrane electrode sub-assembly is provided, comprising the steps of providing an ion exchange membrane having mutually opposed first and second sides and depositing a first ink composition including an electrocatalyst onto the first side of the ion exchange membrane using a direct-write tool to form a first material layer.

According to another embodiment of the present invention, a method for the manufacture of a membrane electrode assembly is provided, including the steps of depositing a first ink composition including an electrocatalyst onto a transfer substrate using a direct-write tool to form a first material layer and transferring the first material layer to a second substrate, the second substrate comprising an ion exchange membrane.

According to another embodiment of the present invention, a method for the manufacture of a liquid diffusion layer in a direct methanol fuel cell electrode is provided, including the steps of providing an ink composition including a hydrophobic material and depositing the ink composition onto a direct methanol fuel cell electrode.

According to another embodiment of the present invention, a method for the deposition of electrocatalyst layers on an ion exchange membrane is provided, including the steps of providing an ion exchange membrane having opposed first and second surfaces, moving the ion exchange membrane to a position disposed between at least first and second direct-write tools, depositing a first ink composition on the first surface using the first direct-write tool, depositing a second ink composition on the second surface using the second direct-write tool, and drying the first and second deposited ink compositions to form electrocatalyst layers on the opposed first and second surfaces.

According to another embodiment of the present invention, a method for the fabrication of an electrocatalyst layer is provided. The method includes the steps of depositing an ink composition onto a substrate, the ink composition including a liquid vehicle, particulate carbon and a molecular precursor to an active species phase, and reacting the ink composition with a reducing agent to convert the active species phase precursor to an active species phase and form an electrocatalyst layer.

According to another embodiment of the present invention, a method for the fabrication of an electrocatalyst layer is provided, including the steps of depositing an ink composition onto a substrate, the ink composition including a liquid vehicle, particulate carbon and a molecular precursor to an active species phase, and reacting the ink composition with a form of radiation, such as ultraviolet radiation, to convert the active species phase precursor to an active species phase and form an electrocatalyst layer.

According to another embodiment of the present invention, a method for the manufacture of an electrode for a fuel cell is provided, comprising the steps of depositing a first ink composition on at least a portion of a substrate to form a first material layer and depositing a second ink composition adjacent to at least a portion of the first material layer, wherein the second ink composition is different than the first ink composition.

According to another embodiment of the present invention, a method for the fabrication of a catalyst layer is provided, comprising the steps of depositing an ink composition onto a substrate, the ink composition comprising a liquid vehicle, a first particulate material and a second particulate material including nanoparticles, and converting the ink composition into a catalyst layer.

DETAILED DESCRIPTION OF THE INVENTION

According to the present invention, a method is provided for manufacturing MEAs which are useful in PEMFC and particularly in DMFC. Whereas a PEMFC requires gas diffusion electrodes on both the anode and the cathode, a DMFC requires a liquid diffusion electrode on the anode and a gas diffusion electrode on the cathode. Since the DMFC contains the two different types of electrode structures that are the subject of this invention, it is described below in some detail. However, it will be recognized that the gas diffusion electrode described herein applies to other fuel cells that employ a gas feed to the anode.

To appreciate the utility of the present invention, it is important to understand the structure and functionality of a PEMFC and DMFC. PEMFCs and DMFCs generally include a power section, also known as the fuel cell stack, a power conditioner and the balance of the plant. The power conditioner converts the DC electricity created by the fuel cell stack into a form appropriate for the end use application. The balance of the plant entails the remainder of the fuel cell such as operational modules, electrical and fuel interfaces and the like.

The power section, or fuel cell stack, which is the focus of the present invention, is where the electrochemical reactions occur that produce the power. Each fuel cell stack includes a number of MEAs. The fuel (methanol in the case of a DMFC or a hydrogen-rich gas in the case of a PEMFC) and air are delivered to the MEAs where the conversion of chemical to electrical energy takes place, catalyzed by catalytic materials. Each MEA in the fuel cell stack will generate useful voltage of from about 0.4 V to 0.8 V and the number of MEAs stacked in series dictates the voltage of the overall system.

Figure 1:
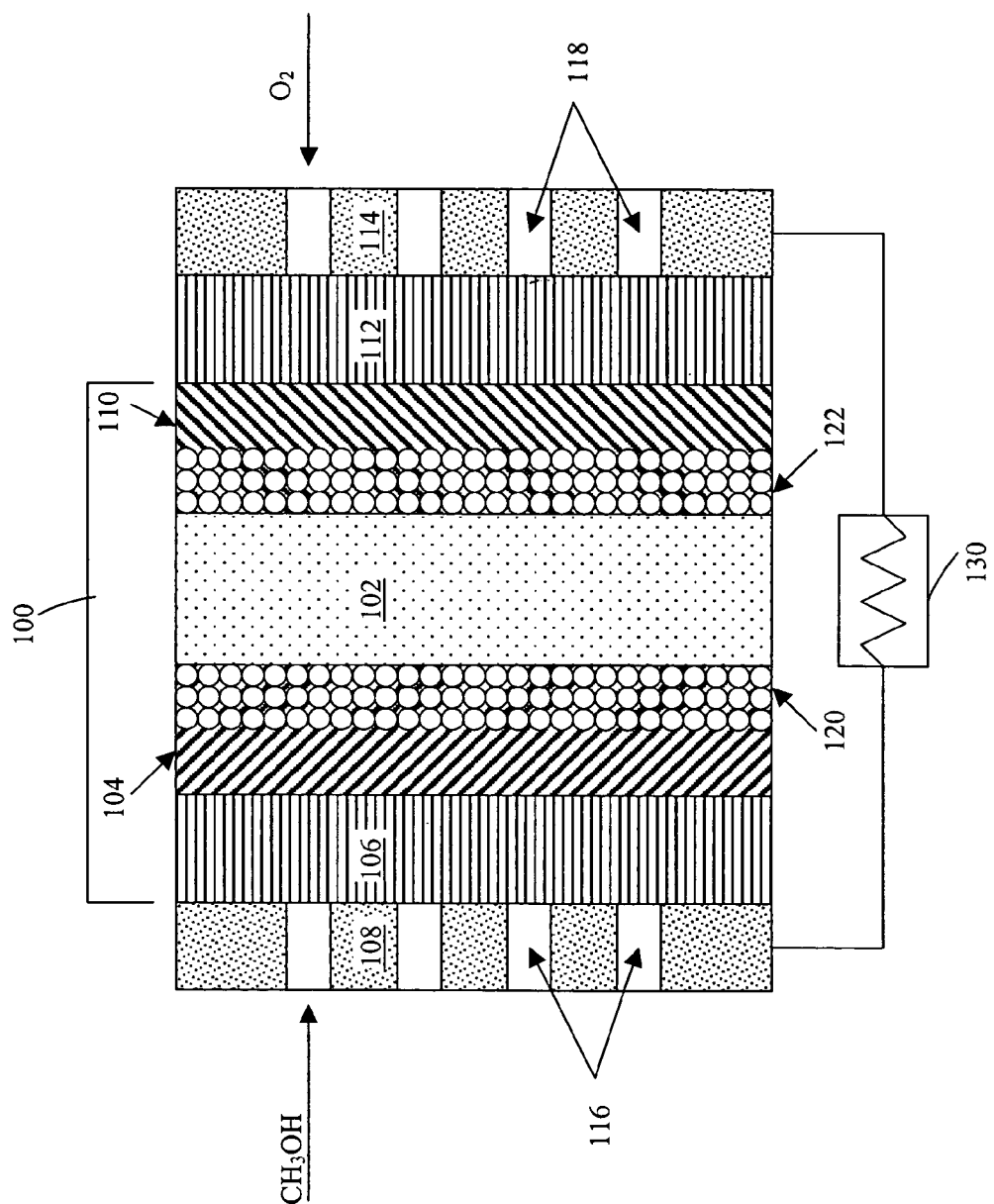
FIG. 1 illustrates a cross-sectional view of a conventional MEA for a direct methanol fuel cell.
Figure 2:
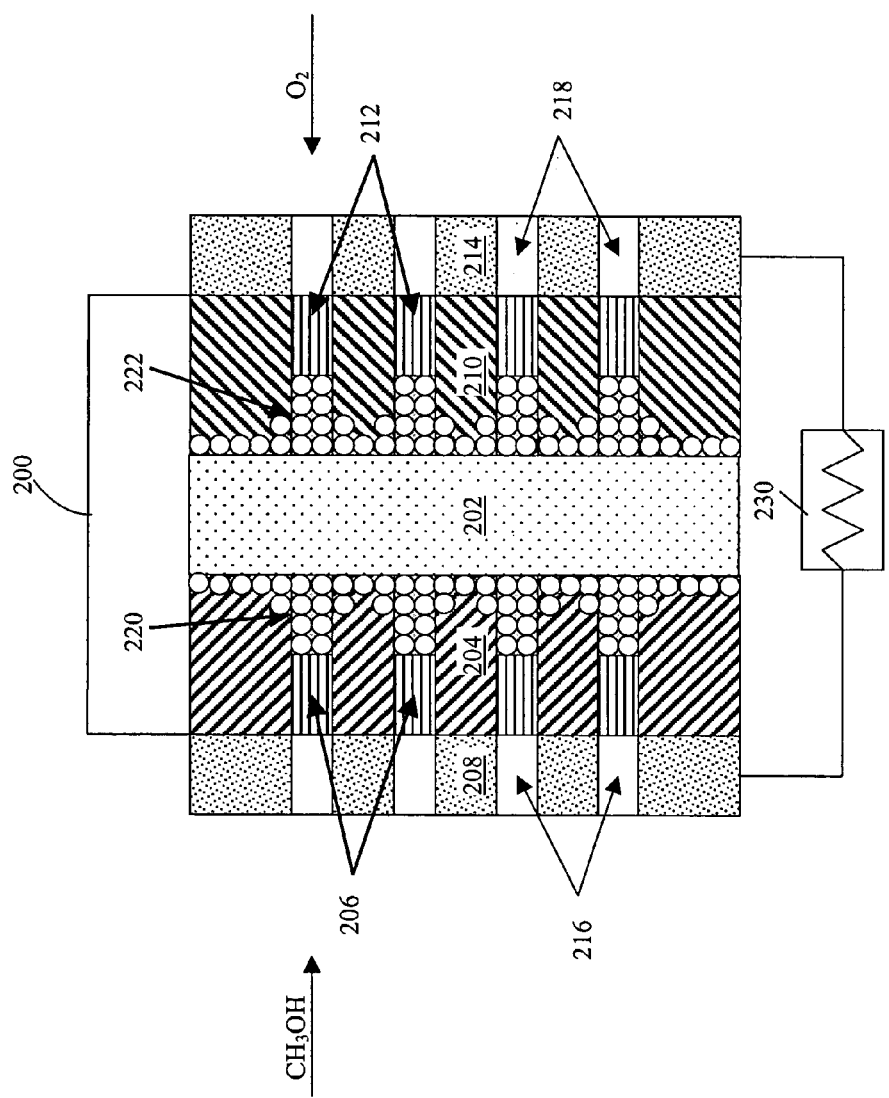
FIG. 2 illustrates a cross-sectional view of an MEA useful in accordance with an embodiment of the present invention.

A cross-sectional view of an MEA useful in accordance with an embodiment of the present invention is illustrated in FIG. 2 (not to scale). The MEA 200 comprises a PEM 202 disposed between an anode 204 and a cathode 210, which each comprise electrocatalyst layers 220 and 222 and fluid distribution layers 206 and 212. Bipolar plates 208 and 212 are disposed between the anode and cathode of sequential MEA stacks and include current collectors to capture electrons and flow fields 216 and 218 to direct the flow of incoming fluid to the appropriate electrode. Two end plates, similar to the bipolar plates, are used to complete the MEA stack. The fluid distribution layer according to the present invention can be optimized for transport of a liquid, transport of a gas or a combination of the two and as used herein the term fluid refers to a liquid or gas.

According to the present invention, standard bipolar plates may be used without further modification. Alternatively, the electrical properties of the bipolar plates according to one embodiment of the present invention may be modified by depositing metal powders or coatings such as silver (Ag), gold (Au) or nickel (Ni) on the bipolar plates using a direct-write tool, described hereinbelow.

Figure 3:
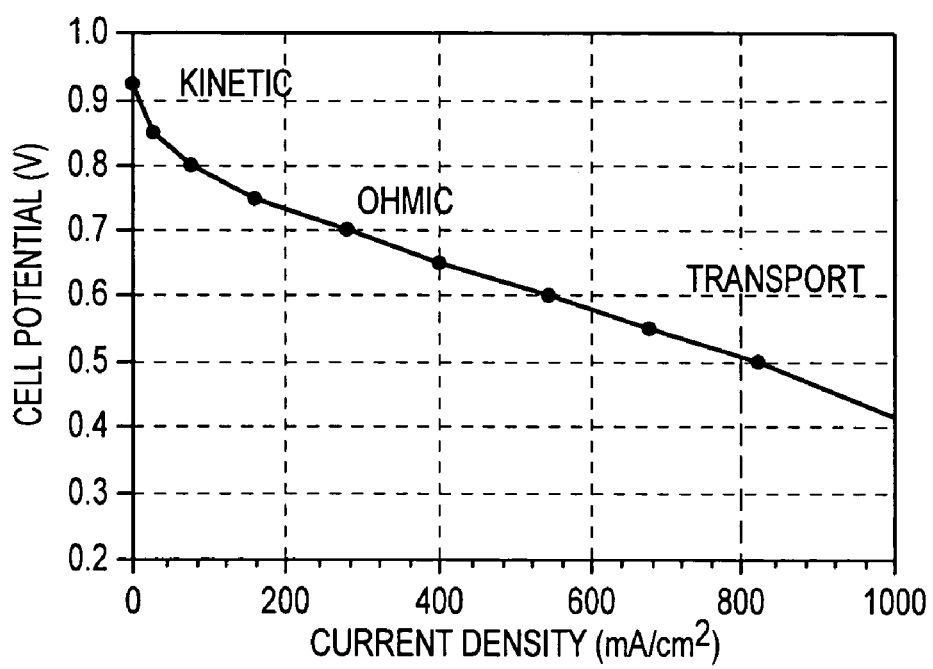
FIG. 3 illustrates a polarization curve for a membrane electrode assembly.

The performance of an MEA is primarily judged by reference to the relationship between MEA cell potential in volts and current density in milliamps per square centimeter ($mA/cm^2$). This relationship can be represented graphically in the form of a polarization curve and an example of a polarization curve for a PEMFC is illustrated in FIG. 3. The polarization curve shows the typical relationship between cell potential and current density. For a given level of MEA performance (e.g., a specific polarization curve), if better fuel efficiency and operating efficiency are required, then it is desirable to move to a higher voltage. Operating a PEMFC or DMFC at higher voltage generally leads to higher efficiency, but also requires a larger cell because the power density is lower. This increases capital cost in the construction of the cell but results in a lower operating cost. For a given polarization curve, operating at lower voltage generally leads to lower efficiency, but requires a smaller cell (because the power density is higher) and therefore smaller capital costs, but higher operating costs. It is particularly advantageous to move the vertical position of the curve higher, that is, to achieve a higher current density at a higher voltage.

The vertical position of the polarization curve is strongly influenced by a number of material and operating factors, including the level of catalyst loading. More catalyst yields better results, but increasing the amount of catalyst significantly contributes to the capital cost. In terms of fuel cell cost, current fuel cell stacks employ MEA's that include platinum electrocatalysts with a total loading of about 1 milligram of platinum per square centimeter of electrode (1 $mgPt/cm^2$), including both the anode and cathode. At a typical cell performance of 0.42 watts per square centimeter, about 2.4 grams of platinum per kilowatt is required (1 $mgPt/cm^2$ over 0.42 $watts/cm^2$). Platinum metal is very expensive and a significant cost reduction in the electrocatalyst is necessary for these cells to become economically viable. However, reducing the amount of precious metal per se is not a suitable solution to reduce cost, because the performance of the fuel cell may suffer.

Other operating parameters include temperature, fuel composition and fuel utilization, all of which influence the operating cost and reliability of the fuel cell. The goal in designing an MEA is to maximize the vertical position of the polarization curve (i.e., performance) while minimizing the capital cost and operating costs.

The connection between the shape of the polarization curve and the structure of an MEA is well understood and can be divided into different regions of the polarization curve. As is illustrated in FIG. 3, these regions are the kinetic region, ohmic region and transport-limited region for a PEMFC.

In the kinetic region, up to about 200 $mA/cm^2$, the performance of the PEMFC MEA is primarily dictated by the kinetic performance, or reactivity, of the catalyst. A catalyst having high activity yields a higher cell potential at a given current density. The catalyst structure and the number of available active sites dictate the overall activity of the catalyst. The reactivity of the catalyst also has an effect on the performance in the ohmic and transport limited regions. Ideally, catalyst loading within the MEA is minimized while maximizing the kinetic activity of the MEA. As used herein, an active site refers to any location within the electrocatalyst layer where catalyst material is accessible by the methanol, i.e., any place within the electrocatalyst material where the methanol is able to react with the catalyst material.

In the ohmic region, from about 200 $mA/cm^2$ to about 600 $mA/cm^2$, the performance is primarily dictated by the ability to transport ions and electrons. Better performance results from good connectivity between highly conductive particles for electrical conductivity and a good network of proton conducting polymer connecting the active sites of the catalyst to the PEM. Ideally, electrons are transported out of the anode and protons are transferred through the PEM quickly to prevent ohmic losses. One way of achieving this goal is by producing electrocatalyst layers that are both electrically conductive (to transport electrons to and from the bipolar plates and fluid distribution layers) and protonically conductive (to transport protons from the electrocatalyst layer to the PEM). Ideally, the fluid distribution layers are electrically conductive and are porous to enable efficient transport of both electrons and inlet fluids.

In the transport limited region, above about 600 $mA/cm^2$, the performance is primarily dictated by the diffusion of a fluid species (e.g., methanol and oxygen) to and from the active sites of the catalyst. Better performance is manifest by rapid diffusion of the fluid from outside the MEA to the electrocatalyst layers. The performance in this region is largely affected by the fuel cell operating conditions such as fluid pressure, flow rate and the like. The materials used to facilitate fluid distribution and the thickness of the material layers also affect performance in this region.

In conventional DMFC MEAs, methanol transport and utilization is typically poor. In addition, significant amounts of methanol can cross-over the PEM with a resulting reduction in performance and efficiency of the fuel cell. While there are ways to reduce methanol cross-over by reducing the relative rate of methanol transport relative to protons in the PEM, it is advantageous to use the methanol more efficiently in the anode layer and reduce the amount of methanol that reaches the PEM. The anode fluid distribution substrate is typically suited for the diffusion of gases and not for the transport of liquid. This is mainly due to the fact that most PEM fuel cells use hydrogen as the fuel and the diffusion layers are not designed specifically for the distribution of a liquid fuel. Moreover, conventional anode fluid distribution materials sporadically mix electrically conductive material with fluid distribution channels. These conventional anode fluid distribution substrates are ineffective mainly due to their thickness and inability to separate electron transport areas from fluid transport areas. The method of the present invention provides for the deposition of thin, tailored fluid distribution layers which distribute the liquid fuel and transport the electrons.

After the methanol crosses the fluid distribution layer, it should be transported directly to the active sites in the anode electrocatalyst layers and converted into protons. Cross-over, as known by those skilled in the art, is when the fuel, e.g. methanol, is transported from the anode, through the electrolyte and into the cathode. Methanol cross-over is undesirable for several reasons. First, the methanol that crosses-over is not available to react at the anode, thereby decreasing fuel efficiency. Second, when the methanol reaches the cathode it can react exothermically with oxygen, heating the fuel cell and decreasing the amount of oxygen available at the anode. Third, methanol can interact with the active sites in the cathode electrocatalyst layers, which poisons the cathode catalyst. All these factors contribute to a decrease in fuel cell performance and operating lifetime.

Ideally, methanol is transported directly to the active sites after it passes through the fluid distribution layer, but is not transported to the PEM. As such, methanol should be transported in a direction lateral (parallel) to the PEM within the electrocatalyst layer. Conventional MEAs do not address this methanol transport issue. The method of the present invention provides for the deposition of thin electrocatalyst and fluid distribution layers which facilitate the transport of methanol in a direction lateral to the PEM.

Transport of water out of the cathode and to the anode and PEM is also important for a number of reasons. First, a build-up of water in the cathode can cause a back-pressure on the water flowing from the PEM and anode which decreases the delivery rate of the methanol fuel. Methanol requires either potential-or kinetic energy to reach the active sites in the anode. Transport of water in and to the anode supplies the kinetic energy needed to deliver methanol to the active sites in the electrocatalyst layer is A back-pressure on the PEM and anode can decrease the efficiency of the fuel cell due to reduced fuel transport.

Second, when the PEM becomes dry, proton conductivity decreases markedly. It is therefore important that the PEM remains hydrated during operation. One method of maintaining the hydration of the PEM is the use of a humidification system. However, humidification systems are complex and add to the capital cost of the fuel cell. A more cost-effective solution is to transport the water generated in the cathode to the PEM. This is best accomplished in a DMFC by transferring the water created in the cathode out of the cathode to the methanol reservoir and then using this to feed the anode.

Efficient transport of $CO_2$ out of the anode is also important. At higher current densities, the large amount of $CO_2$ evolved in the anode may result in the formation of gas bubbles. Upon their production, these gas bubbles are generally saturated by methanol and water. These saturated bubbles exit the MEA with the methanol and water, thereby decreasing methanol and water concentration within the anode.

Referring back to FIG. 2, the PEM 202 is a proton conductive and electronically insulative ion exchange membrane that, when in the presence of water, selectively transports protons formed at the anode electrocatalyst layer 220 to the cathode 210 where the cathode electrocatalyst layer 222 catalyzes the reaction with oxygen ions to form water. Generally, the PEM is a solid, organic polymer, preferably, poly[perfluorosulfonic] acid, but may comprise polysulfones, perfluorocarbonic acid, polyvinylidene fluoride (PVDF) and styrene-divinylbenzene sulfonic acid. A particularly preferred PEM material is NAFION (du Pont de Nemours and Co., Wilmington, Del., USA), which comprises the base of the copolymer of tetrafluoroethylene and perfluorovinyl ether, on which sulfonate groups are present as ion-exchange groups. The chemical structure of NAFION is illustrated in FIG. 4.

Figure 4:
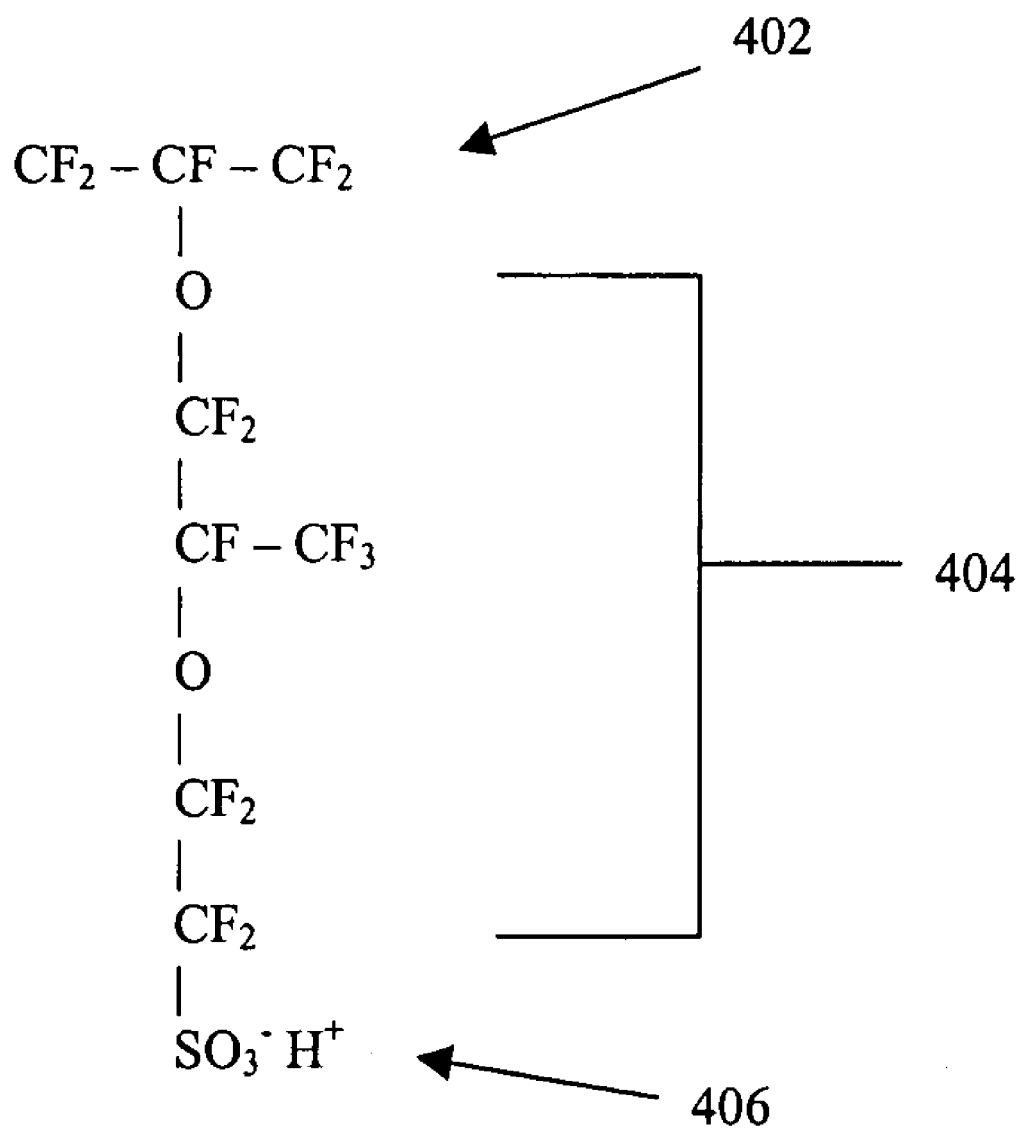
FIG. 4 illustrates the chemical composition of a typical proton exchange membrane material.

A typical PEM material comprises three regions, as illustrated in FIG. 4: (1) the polymer backbone 402, which is typically hundreds of repeating $CF_2$ units in length; (2) the side chains 404, typically repeating $O-CF_2-CF$ bonds, which connect the polymer backbone to the ion clusters, described below; and (3) the ion clusters 406, which typically are sulfonic acid ions, e.g., $SO_3^-$ and $H^+$. The negative ions, such as $SO_3^-$, are permanently attached to the side chain and cannot move. However, when the membrane becomes hydrated by absorbing water, the hydrogen ions become mobile and are conducted through the membrane via various $SO_3^-$ sites. As a result, protons ($H^+$) are conducted through the membrane and to the cathode.

Since the movement of protons through the PEM is carried out through the functional groups of the polymer, e.g., $SO_3^-$, a higher density of functional groups within the PEM will decrease the protonic resistance of the PEM. Additionally, the resistivity of the PEM is decreased with the addition of water to the membrane. Therefore, it is desirable to use PEM materials that are relatively high in functional group density and which are relatively hydrophilic to maintain hydration of the PEM.

In addition to the foregoing, other ion exchange groups can be used such as phosphoric acid groups incorporated into organic polymers such as polybenzimidazole (PBI). Other proton conducting materials have also been investigated for use as a PEM in a fuel cell including various inorganic metal oxides and hydroxides. These materials are often embedded into a polymer matrix to provide the mechanical support and a leak-free medium. In other cases, a solid inorganic proton conducting membrane may also be useful for proton conduction.

Issues associated with the performance of the PEM include the operational temperature and the mechanical strength of the PEM. Operating the fuel cell at a higher temperature allows for higher current density. However, the operating temperature of the fuel cell is limited by the thermal stability of the PEM and the temperature at which water remains a liquid. Operating DMFCs at temperatures in excess of 100° C. is possible under pressurized conditions, but may shorten the life of the fuel cell. PEMFCs can be operated at higher temperatures provided a thermally stable membrane is provided.

It is desirable to use a high speed manufacturing process to produce large volumes of MEA's, which is likely to be based on reel-to-reel web drives. Preferably, the PEM is thin-enough to minimize ohmic losses within the MEA, but thick-enough to withstand the production process and resist deterioration during normal operating conditions. Conventional PEMs have a thickness of not greater than about 200 μm, such as from about 25 μm to about 175 μm.

Referring back to FIG. 2, the anode and cathode electrocatalyst layers 220 and 222 are adapted to facilitate the preferred oxidation and reduction reactions, gas and liquid diffusion, and selective proton and electron conductivity. To this end, the electrocatalyst layers generally comprise catalyst materials in the form of electrocatalyst particles or powders, as well as proton-conducting polymer materials, hydrophobic materials and electrically conductive materials.

The electrocatalyst particles according to the present invention may be manufactured by a powder manufacturing method such as solution precipitation routes, solution infiltration or spray-based powder production, or the electrocatalyst particles may be produced in-situ by delivering molecular precursors to the catalytically active species phase and converting the precursors after deposition, as described below.

As used herein, the term electrocatalyst particles or powders means at least one of three types: (1) unsupported catalyst particles, such as platinum black; (2) supported catalysts, such as aggregate particles; or (3) nanoparticles. Combinations of the foregoing electrocatalyst types can also be used. Unsupported catalyst particles are catalyst particles that are not supported on the surface of another material. These include such materials as platinum black and platinum/ruthenium black. Supported catalysts include an active species phase that is dispersed on a support phase. Thus, one or more highly dispersed active species phases, typically metal or metal oxide clusters or crystallites, with dimensions on the order of about 1 nanometers to 10 nanometers that are dispersed over the surface of larger support particles. The support particles can be aggregated to form larger aggregate particles. For example, the support particles can be chosen from a metal oxide. (e.g., $RuO_2$, $In_2O_3$, ZnO, $IrO_2$, $SiO_2$, $Al_2O_3$, $CeO_2$, $TiO_2$ or $SnO_2$), aerogels, xerogels, carbon or a combination of the foregoing. In the following discussion, carbon is used as an example. According to one embodiment, the carbon particles supporting the dispersed active species phase do not exist as individual particles but tend to associate to form structures that contain a number of individual particles that are aggregated.

Catalyst nanoparticles are particles which have an average size of not greater than 100 nanometers, such as in the range of 1 to 50 nanometers, and may be unsupported but often have surfaces that are protected to prevent nanoparticle agglomeration. In one embodiment, the nanoparticles have an average size of from about 2 to 20 nanometers. Catalyst nanoparticles may comprise metals, metal oxides, metal carbides, metal nitrides or any other material that exhibits catalytic activity. Metal nanoparticles can be produced by first selecting a molecular precursor of a metal such as platinum, ruthenium, palladium, silver, nickel or gold. For example, molecular precursors such as hydrogen hexachloroplatinate, ruthenium chloride hydrate, hydrogen hexachloropallidate, silver nitrate, nickel acetate or potassium tetrachloroaurate can be reduced to form nanoparticles. The reducing agent can be any number of alcohols, diols or other reducing compounds such as methanol, ethanol, n-propanol, 2-propanol, n-butanol, 2-butanol, ethylene glycol, formaldehyde or N,N-dimethyl formamide. The particles are stabilized from aggregation by the adsorption of stabilizing polymer molecules on the particle surfaces. The stabilizing polymer can be selected from the group consisting of polyvinyl pyrollidone (PVP), PVDF, PBI or NAFION. A number of methods to produce Pt nanoparticles are described in Shah et al. (*Langmiur*, 1999, Vol. 15, pp. 1584–1587) which is incorporated herein by reference in its entirety.

Throughout the present specification, with respect to supported catalysts, the larger structures formed from the association of discrete carbon particles supporting the dispersed active species phase are referred to as aggregates or aggregate particles, and typically have a size in the range from 0.3 to 100 µm. In addition, the aggregates can further associate into larger "agglomerates". The aggregate morphology, aggregate size, size distribution and surface area of the electrocatalyst powders are characteristics that have a critical impact on the performance of the catalyst. The aggregate morphology, aggregate size and size distribution determines the packing density and the surface area determines the type and number of surface adsorption centers where the active species are formed during synthesis of the electrocatalyst.

The aggregate structure may include smaller primary particles, such as carbon or metal oxide primary particles, constituting the support phase. Two or more types of primary particles can be mixed to form the support phase. For example, two or more types of particulate carbon (e.g., amorphous and graphitic carbon) can be combined to form the support phase. The two types of particulate carbon can have different performance characteristics in a selected application and the combination of the two types in the aggregate structure can enhance the performance of the catalyst.

Among the forms of carbon available for the support phase, graphitic carbon is preferred for long-term operational stability of fuel cells. Amorphous carbon is preferred when a smaller crystallite size is desired for the supported active species phase. The carbon support particles typically have sizes in the range of about 10 nanometers to 5 µm, depending on the nature of the carbon material. However, carbon particulates having sizes up to 25 µm can be used as well.

The compositions and ratios of the aggregate particle components can be varied independently and various combinations of carbons, metals, metal alloys, metal oxides, mixed metal oxides, organometallic compounds and their partial pyrolysis products can be used. The electrocatalyst particles can include two or more different materials as the dispersed active species. As an example, combinations of Ag and $MnO_x$ dispersed on carbon can be useful for some electrocatalytic applications. Other examples of multiple active species are mixtures of metal porphyrins, partially decomposed metal porphyrins, Co and CoO. Although carbon is a preferred material for the support phase, other materials such as metal oxides can also be useful for some electrocatalytic applications.

The supported electrocatalyst particles preferably include a carbon support phase with at least about 1 weight percent active species phase, more preferably at least about 5 weight percent active species phase and even more preferably at least about 10 weight percent active species phase. In one embodiment, the particles include from about 20 to about 80 weight percent of the active species phase dispersed on the support phase. It has been found that such compositional levels give rise to the most advantageous electrocatalyst properties for many applications. However, the preferred level of the active species supported on the carbon support will depend upon the total surface area of the carbon, the type of active species phase and the application of the electrocatalyst. A carbon support having a low surface area will require a lower percentage of active species on its surface to achieve a similar surface concentration of the active species compared to a support with higher surface area and higher active species loading.

Metal-carbon electrocatalyst particles include a catalytically active species of at least a first metal phase dispersed on a carbon support phase. The metal active species phase can include any metal and the particularly preferred metal will depend upon the application of the powder. The metal phase can be a metal alloy wherein a first metal is alloyed with one or more alloying elements. As used herein, the term metal alloy also includes intermetallic compounds between two or more metals. For example, the term platinum metal phase refers to a platinum alloy or platinum-containing intermetallic compound, as well as pure platinum metal. The metal-carbon electrocatalyst powders can also include two or more metals dispersed on the support phase as separate active species phases.

Preferred metals for the supported electrocatalytically active species include the platinum group metals and noble metals, particularly Pt, Ag, Pd, Ru, Os and their alloys. The metal phase can also include a metal selected from the group Ni, Rh, Ir, Co, Cr, Mo, W, V, Nb, Al, Ta, Ti, Zr, Hf, Zn, Fe, Cu, Ga, In, Si, Ge, Sn, Y, La, lanthanide metals and combinations or alloys of these metals. Preferred metal alloys include alloys of Pt with other metals, such as Ru, Os, Cr, Ni, Mn and Co. Particularly preferred among these is PtRu for use in the DMFC anode and PtCrCo or PtNiCo for use in the cathode.

Alternatively, metal oxide-carbon electrocatalyst particles that include a metal oxide active species dispersed on a carbon support phase may be used. The metal oxide can be selected from the oxides of the transition metals, preferably those existing in oxides of variable oxidation states, and most preferably from those having an oxygen deficiency in their crystalline structure. For example, the metal oxide active species can be an oxide of a metal selected from the group consisting of Au, Ag, Pt, Pd, Ni, Co, Rh, Ru, Fe, Mn, Cr, Mo, Re, W, Ta, Nb, V, Hf, Zr, Ti or Al. A particularly preferred metal oxide active species is manganese oxide ($MnO_x$, where x is 1 to 2). The supported active species can include a mixture of different oxides, solid solutions of two or more different metal oxides or double oxides. The metal oxides can be stoichiometric or non-stoichiometric and can be mixtures of oxides of one metal having different oxidation states. The metal oxides can also be amorphous.

It is preferred that the average size of the active species is such that the electrocatalyst particles include small single crystals or crystallite clusters, collectively referred to herein as clusters, of the active species dispersed on the support phase. Preferably, the average active species cluster size (diameter) is not greater than about 10 nanometers, more preferably is not greater than about 5 nanometers and even more preferably is not greater than about 3 nanometers. Preferably, the average cluster size of the active species is from about 0.5 to 5 nanometers. Preferably, at least about 50 percent by number, more preferably at least about 60 percent by number and even more preferably at least about 70 percent by number of the active species phase clusters have a size of not greater than about 3 nanometers. Electrocatalyst powders having a dispersed active species phase with such small crystallite clusters advantageously have enhanced catalytic properties as compared to powders including an active species phase having larger clusters.

Figure 5:
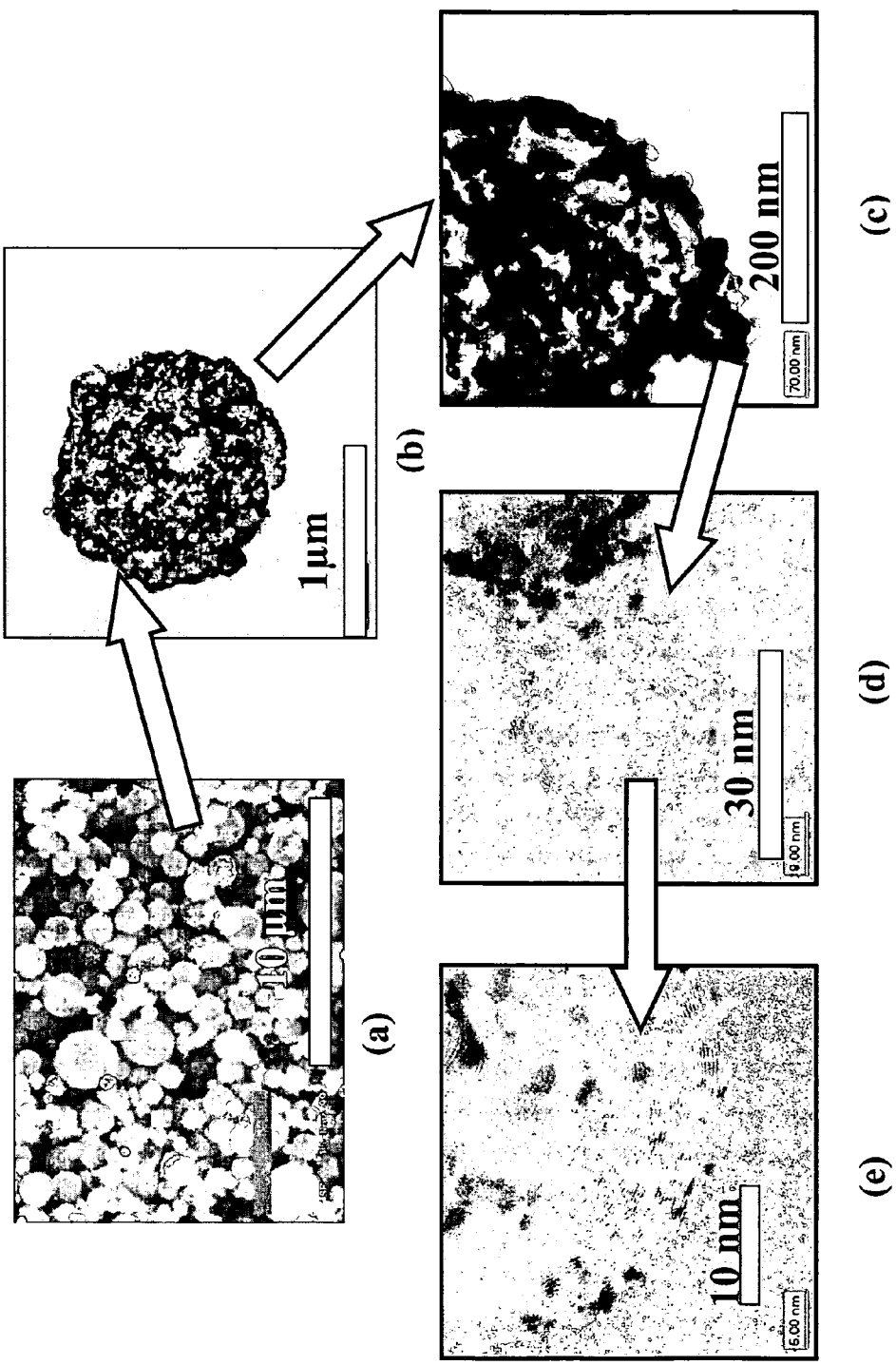
FIGS. 5a to 5e illustrate the structure of aggregate electrocatalyst particles that are useful in accordance with the present invention.

FIG. 5 illustrates the morphology and structure of a preferred aggregate electrocatalyst powder according to an embodiment of the present invention. FIG. 5(a) illustrates a plurality of the aggregate electrocatalyst particles in a powder batch. FIG. 5(b) illustrates one electrocatalyst particle having a size of about 1.2 µm. FIG. 5(c) illustrates the structure of the particle of FIG. 5(b) in greater detail, wherein the individual support particles can be seen. FIGS. 5(d) and 5(e) illustrate the active species dispersed on the support phase of the aggregate particle. Thus, the preferred electrocatalyst powders are not mere physical admixtures of different particles, but are comprised of support phase particles that include a dispersed phase of an active species.

Preferably, the composition of the aggregate electrocatalyst particles is homogeneous. That is, the different phases of the electrocatalyst are well dispersed within a single aggregate particle. It is also possible to intentionally provide compositional gradients within the individual electrocatalyst aggregate particles. For example, the concentration of the dispersed active species phase in a composite particle can be higher or lower at the surface of the secondary support phase than near the center and gradients corresponding to compositional changes of 10 to 100 weight percent can be obtained. When the aggregate particles are deposited by a direct-write tool, discussed below, the aggregate particles preferably retain their structural morphology and therefore the functionality of the compositional gradient can be exploited in the device.

The electrocatalyst particles should have certain physical attributes to be useful in ink compositions for direct write tools, discussed below. These physical attributes can include density, porosity, settling velocity and spherical morphology.

The particles should remain well-dispersed in the ink composition for extended periods of time such that the cartridge or reservoir into which the suspension is placed will have a long shelf-life. In some instances, substantially fully dense particles can be adequately dispersed and suspended. Depending upon the density of the particle compound, however, particles with a high density relative to the liquid in which they are dispersed and with a size in excess of about 0.5 µm cannot be suspended in a liquid that has a sufficiently low viscosity to be deposited using a direct-write tool, particularly an ink-jet device. In most cases, the apparent density of the particles must therefore be substantially lower than the theoretical density.

More specifically, it is desirable to maintain a substantially neutral buoyancy of the particles in the suspension while maintaining a relatively large physical size. The buoyancy is required for ink stability while the larger size maintains ink properties, such as viscosity, within useful ranges. Stated another way, it is desirable to provide particles having a low settling velocity but with a sufficiently large particle size. The settling velocity of the particles is proportional to the apparent density of the particle ($\rho_s$) minus the density of the liquid ($\rho_L$). Ideally, the particles will have an apparent density that is approximately equal to the density of the liquid, which is typically about 1 g/cm³ (i.e., the density of water). It is preferable that the apparent density of such particles be a small percentage of the theoretical density. According to one embodiment, the particles have an apparent density that is not greater than about 50 percent of the theoretical density for the particle, more preferably not greater than about 20 percent of the theoretical density. Such particles would have small apparent sizes when measured by settling techniques, but larger sizes when measured by optical techniques.

Related to the density of the aggregates is the porosity of the aggregates. As noted above, lower aggregate densities allow easier suspension of the aggregates in an ink composition. Moreover, as is discussed below, porosity within certain layers of the MEA plays a critical role in the performance of the fuel cell. High porosity within the aggregate particles is advantageous for rapid transport of species into and out of the various structures of the MEA. It is preferred that the accessible (i.e., open) porosity in the aggregate electrocatalyst particles is at least about 5 percent. More preferably, it is preferred that the open porosity is at least about 40 percent and even more preferably is at least about 60 percent.

It will be appreciated that varying particle morphologies can be utilized while maintaining an apparent density within the desired range. For example, the electrocatalyst particles can have a sufficient porosity to yield a particle having an apparent density that is lower than the theoretical density. Open (surface) porosity can also decrease the apparent density if the surface tension of the liquid medium does not permit penetration of the surface pores by the liquid.

Thus, the particles according to the present invention preferably have a low settling velocity in a liquid medium. The settling velocity according to Stokes Law is defined as:

$$V = \frac{D_{st}^2 (\rho_s - \rho_l) g}{18\eta} \quad (4)$$

where:
$D_{st}$=Stokes diameter
$\eta$=fluid viscosity
$\rho_s$=apparent density of the particle
$\rho_l$=density of the liquid
V=settling velocity
g=acceleration due to gravity Preferably, the average settling velocity of the particles is sufficiently low such that the suspensions have a useful shelf-life without the necessity of frequent mixing. Thus, it is preferred that a large mass fraction of the particles, such as at least about 50 weight percent, remains suspended in the liquid. The particles preferably have an average settling velocity that is not greater than 50 percent and more preferably not greater than 20 percent of a theoretically dense particle of the same composition. Further, the particles can be completely redispersed after settling, such as by mixing, to provide the same particle size distribution in suspension as measured before settling.

The aggregate electrocatalyst particles are preferably substantially spherical in shape. That is, the particles are preferably not jagged or irregular in shape. Spherical aggregate particles can advantageously be deposited using a variety of techniques, including deposition by a direct-write tool, and can form layers that are thin and have a high packing density. In some cases, however, a low packing density is more preferable to achieve a highly porous feature.

In addition to the physical characteristics necessary to enable the particles to be useful in an ink composition, the electrocatalyst particles preferably are also catalytically active and electrically conductive. Preferably, the anode electrocatalyst particles catalyze the oxidization of hydrogen or methanol and are electrically conductive to enable the conduction of electrons out of the electrocatalyst layer. Preferably, the cathode electrocatalyst particles catalyze both the reduction of the oxygen and formation of water and are electrically conductive to enable the conduction of electrons into the electrocatalyst layer.

The electrocatalyst powders preferably also have a well-controlled surface area. High surface area combined with high dispersion of the active species generally leads to increased catalytic activity in an energy device. Surface area is typically measured using the BET nitrogen adsorption method, which is indicative of the surface area of the powder including the internal surface area of accessible pores within the aggregate particles. Preferably, the electrocatalyst particles have a surface area of at least about 10 m²/g, more preferably at least about 25 m²/g, more preferably at least about 90 m²/g and even more preferably at least about 600 m²/g, as measured by BET $N_2$ adsorption.

Preferably, the aggregate particles also retain the spherical morphology when incorporated into the fuel cell electrode. It has been found that when a substantial fraction of the aggregate particles retain their spherical morphology in the electrocatalyst layer, the device has improved electrocatalytic properties.

As is discussed below, the porosity of certain layers of the MEA will affect the transport characteristics of the MEA. Also, the formation of thin electrocatalyst layers is advantageous for producing MEAs. A narrow aggregate particle size distribution is more likely to give a low packing density when the pores (spaces) between the aggregate particles have dimensions that are on the same length scale as the particles themselves. Therefore, it is preferred that the electrocatalyst powders have a well-controlled average aggregate particle size to help tailor the porosity of such layers. Preferably, the volume average aggregate particle size (diameter) is not greater than about 100 μm, more preferably is not greater than about 20 μm and even more preferably is not greater than about 10 μm. Further, it is preferred that the volume average aggregate particle size is at least about 0.3 μm, more preferably is at least about 0.5 μm and even more preferably is at least about 1 μm. As used herein, the average particle size is the median particle size ($d_{50}$). Powder batches having an average aggregate particle size satisfying the preferred parameters enable the formation of thin electrocatalytic layers and are capable of forming features having the desired packing density.

The particle size distributions of the aggregate particles, the support phase particles, and the supported active species are important in determining catalytic performance. Narrower aggregate particle size distributions are preferred to allow deposition of the aggregate particles through a narrow orifice without clogging the print-head of the direct-write tool and to enable the formation of thin layers. For example, it is preferred that at least about 75 volume percent of the particles have a size of not greater than about two times the volume average particle size. The particle size distribution can also be bimodal or trimodal. A bimodal or trimodal particle size distribution can advantageously provide improved packing density and hence a denser aggregate particle layer structure in the MEA.

Electrocatalyst particles and powders which have the foregoing properties and which are useful in accordance with the present invention are disclosed in commonly-owned U.S. patent application Ser. No. 09/815,380, which is incorporated herein by reference in its entirety.

Electrocatalyst particles useful in accordance with the present invention are preferably manufactured using spray processing, spray conversion or spray pyrolysis, the methods, collectively referred to herein as spray processing.

Spray processing generally includes the steps of: providing a liquid precursor which includes a precursor to the support phase (e.g., carbon) and a precursor to the active species (e.g., Pt); atomizing the precursor to form a suspension of liquid precursor droplets; and removing liquid from liquid precursor droplets to form the powder. For electrocatalysts that are not supported, such as platinum black or alloys such as PtRu or PtNiCo, the precursor to the support phase is not necessary. Typically, at least one component of the liquid precursor is chemically converted into a desired component of the powder.

Preferably, the spray processing method combines the drying of the precursors and the conversion to a catalytically active species in one step, where both the removal of the solvent and the conversion of a precursor to the active species occur essentially simultaneously. In another embodiment, the spray processing method achieves the drying of the precursors and the conversion to a catalytically active species can occur in a second step. Combined with a short reaction time, this enables control over the distribution of the active species on the support, the oxidation state of the active species and the crystallinity of the active species. By varying reaction time, temperature, type of support material and type of precursors, the preferred spray method can produce catalyst morphologies and supported active species structures that yield improved catalytic performance.

Preferably, with the spray processing method, the electrocatalyst aggregate particles are formed while the precursor to the active species phase is in intimate contact with the surface of the support phase particles that ultimately form the aggregate particle. Preferably, the active species precursor is rapidly reacted on the surface of the support phase particles. The reaction and formation of the supported active species preferably occurs over a very short period of time such that the growth of large active species clusters is reduced. Preferably, the active species precursor is exposed to the elevated reaction temperature to form the active species for not more than about 600 seconds, more preferably not more than about 100 seconds and even more preferably not more than about 10 seconds. The means by which the active species precursor is reacted is discussed in detail below.

Preferably, the spray processing method is capable of simultaneously forming a spherical aggregate particle structure. The spherical aggregate particles form as a result of the formation and drying of the droplets during spray processing and the properties of the support structure are influenced by the characteristics of the support phase particles such as the particle size, particle size distribution and surface area of the support phase particles.

Spray processing methods for electrocatalyst production can be grouped by reference to several different attributes of the apparatus used to carry out the method. These attributes include: the main gas flow direction (vertical or horizontal); the type of atomizer (submerged ultrasonic, ultrasonic nozzle, two-fluid nozzle, single nozzle pressurized fluid); the type of gas flow (e.g., laminar with no mixing, turbulent with no mixing, co-current of droplets and hot gas, countercurrent of droplets and gas or mixed flow); the type of heating (e.g., hot wall system, hot gas introduction, combined hot gas and hot wall, plasma or flame); and the type of powder collection system (e.g., cyclone, bag house, electrostatic or settling).

For example, metal/carbon or metal oxide/carbon electrocatalyst powders can be prepared by starting with an aqueous-based precursor liquid consisting of colloidal carbon and a dissolved metal salt. The processing temperature of the precursor droplets can be controlled so the metal salt precursor decomposes leaving the carbon intact.

The first step in the process is the evaporation of the solvent (typically water) as the droplet is heated resulting in a particle of dried solids and metal salts. A number of methods to deliver heat to the particle are possible: horizontal hot-wall tubular reactors, spray drier and vertical tubular reactors can be used, as well as plasma, flame and laser reactors. As the particles experience either higher temperature or longer time at a specific temperature, the metal precursor decomposes. Preferably with the spray processing method, the temperature and time that the droplets/particles experience can be controlled and therefore the degree of crystallinity and dispersion of the supported active species phase can also be controlled.

The atomization technique for generating the precursor droplets has a significant influence over the characteristics of the final electrocatalyst powder such as the spread of the aggregate particle size distribution (PSD), as well as the production rate of the powder. In extreme cases, some techniques cannot atomize fluids with even moderate particle loadings or high viscosities. Several methods exist for the atomization of precursor compositions containing suspended particulates such as carbon. These methods include but are not limited to: ultrasonic transducers (usually at a frequency of 1–3 MHz); ultrasonic nozzles (usually at a frequency of 10–150 KHz); rotary atomizers; two-fluid nozzles; and pressure atomizers.

Ultrasonic transducers are generally submerged in a liquid and the ultrasonic energy produces atomized droplets on the surface of the liquid. Two basic ultrasonic transducer disc configurations, planar and point source, can be used. Deeper fluid levels can be atomized using a point source configuration since the energy is focused at a point that is some distance above the surface of the transducer. The scale-up of submerged ultrasonic transducers can be accomplished by placing a large number of ultrasonic transducers in an array. Such a system is illustrated in U.S. Pat. No. 6,103,393 by Kodas et al., the disclosure of which is incorporated herein by reference in its entirety.

Scale-up of nozzle systems can be accomplished by either selecting a nozzle with a larger capacity or by increasing the number of nozzles used in parallel. Typically, the droplets produced by nozzles are larger than those produced by ultrasonic transducers. Particle size is also dependent on the gas flow rate. For a fixed liquid flow rate, an increased airflow decreases the average droplet size and a decreased airflow increases the average droplet size. It is difficult to change droplet size without varying the liquid or airflow rates. However, two-fluid nozzles have the ability to process larger volumes of liquid per time than ultrasonic transducers.

Ultrasonic spray nozzles also use high frequency energy to atomize a fluid. Ultrasonic spray nozzles have some advantages over single or two-fluid nozzles such as the low velocity of the spray leaving the nozzle and lack of associated gas flow. The nozzles are available with various orifice sizes and orifice diameters that allow the system to be scaled for the desired production capacity. In general, higher frequency nozzles are physically smaller, produce smaller droplets, and have a lower flow capacity than nozzles that operate at lower frequencies. A drawback of ultrasonic nozzle systems is that scaling up the process by increasing the nozzle size increases the average particle size. If a particular particle size is required, then the maximum production rate per nozzle is set. If the desired production rate exceeds the maximum production rate of the nozzle, additional nozzles or complete production units will be required to achieve the desired production rate.

The shape of the atomizing surface determines the shape and spread of the spray pattern. Conical, microspray and flat atomizing surface shapes are available. The conical atomizing surface provides the greatest atomizing capability and has a large spray envelope. The flat atomizing surface provides almost as much flow as the conical but limits the overall diameter of the spray. The microspray atomizing surface is for very low flow rates where narrow spray patterns are needed. These nozzles are preferred for configurations where minimal gas flow is required in association with the droplets.

Particulate carbon suspensions may present several problems with respect to atomization. For example, submerged ultrasonic atomizers re-circulate the suspension through the generation chamber and the suspension concentrates over time. Further, some fraction of the liquid atomizes without carrying the suspended carbon particulates. Other problems encountered when using submerged ultrasonic transducers is that the transducer discs can become coated with the particles over time. Further, the generation rate of carbon suspensions is very low using submerged ultrasonic transducer discs. This is due in part to energy being absorbed or reflected by the suspended particles.

Submerged ultrasonic transducers are useful for the production of electrocatalyst aggregate particles having a low carbon support phase content, such as not greater than about 40 wt. %, more preferably not greater than 20 wt. % and even more preferably not greater than 10 wt. % carbon in the final electrocatalyst. They are also preferred for particles that are formed exclusively from dissolved precursors as opposed to particulate precursors.

For spray drying, the aerosol can be generated using three basic methods. These methods differ in the type of energy used to break the liquid masses into small droplets. Rotary atomizers (utilization of centrifugal energy) make use of spinning liquid droplets off of a rotating wheel or disc. Rotary atomizers are useful for co-current production of droplets in the range of 20 to 150 μm in diameter. Pressure nozzles (utilization of pressure energy) generate droplets by passing a fluid under high pressure through an orifice. These can be used for both co-current and mixed-flow reactor configurations and typically produce droplets in the range of 50 to 300 μm. Multiple fluid nozzles such as a two fluid nozzle (utilization of kinetic energy) produce droplets by passing a relatively slow moving fluid through an orifice while shearing the fluid stream with a relatively fast moving gas stream. As with pressure nozzles, multiple fluid nozzles can be used with both co-current and mixed-flow spray dryer configurations. This type of nozzle can typically produce droplets in the range of 5 to 200 μm.

For example, two-fluid nozzles are used to produce aerosol sprays in many commercial applications, typically in conjunction with spray drying processes. In a two-fluid nozzle, a low-velocity liquid stream encounters a high-velocity gas stream that generates high shear forces to accomplish atomization of the liquid. A direct result of this interaction is that the droplet size characteristics of the aerosol are dependent on the relative mass flow rates of the liquid precursor and nozzle gas stream. The velocity of the droplets as they leave the generation zone can be quite large which may lead to unacceptable losses due to impaction. The aerosol also leaves the nozzle in a characteristic pattern, typically a flat fan, and this may require that the dimensions of the reactor be sufficiently large to prevent unwanted losses on the walls of the system.

Thus, a variety of atomization techniques for spray conversion processes is possible for electrocatalyst powder production and different versions are preferred for different feed streams and products.

The atomized precursor must be heated to remove solvents and react precursor components. For example, a horizontal, tubular hot-wall reactor can be used to heat a gas stream to a desired temperature. Energy is delivered to the system by maintaining a fixed boundary temperature at the wall of the reactor and the maximum temperature of the gas is the wall temperature. Heat transfer within a hot wall reactor occurs through the bulk of the gas. Buoyant forces that occur naturally in horizontal hot wall reactors aid this transfer. The mixing also helps to improve the radial homogeneity of the gas stream. Passive or active mixing of the gas can also increase the heat transfer rate. The maximum temperature and the heating rate can be controlled independent of the inlet stream with small changes in residence time. The heating rate of the inlet stream can also be controlled using a multi-zone furnace.

The use of a horizontal hot-wall reactor according to the present invention is preferred to produce particles with a size of not greater than about 5 μm. Above about 5 μm, settling of particles can cause significant material losses. One disadvantage of such reactors is the poor ability to atomize particulate carbons when using submerged ultrasonics for atomization. As is discussed above, this approach is preferred for products with high metal loadings corresponding to low carbon contents where atomization is sufficient to enable economical production.

Alternatively, the horizontal hot-wall reactor can be used with a two-fluid nozzle to atomize the droplets. This approach is preferred for precursor feed streams containing higher levels of carbon. A horizontal hot-wall reactor can also be used with ultrasonic nozzle atomization techniques. This allows atomization of precursor containing particulate carbons, however the large droplet size leads to losses of materials on reactor walls and other surfaces making this an expensive method for powder production.

While horizontal hot-wall reactors are useful according to the present invention, spray processing systems in the configuration of a spray drier are the generally preferred production method for large quantities of electrocatalyst powders useful in accordance with the present invention.

Spray drying is a process wherein powders are produced by atomizing a precursor to produce droplets and evaporating the liquid to produce a dry aerosol, wherein thermal decomposition of one or more precursors may take place to produce the powder. The residence time in the spray dryer is the average time the process gas spends in the drying vessel as calculated by the vessel volume divided by the process gas flow using the outlet gas conditions. The peak excursion temperature (i.e., the reaction temperature) in the spray dryer is the maximum temperature of a particle, averaged throughout its diameter, while the particle is being processed and/or dried. The droplets are heated by supplying a pre-heated carrier gas.

Three types of spray dryer systems are useful for the spray drying of electrocatalyst powders according to the present invention. An open system is useful for general spray drying of electrocatalyst powders using air as an aerosol carrier gas and an aqueous feed solution as a precursor. A closed system is useful for spray drying of electrocatalyst powders using an aerosol carrier gas other than air. A closed system is also useful when using a non-aqueous or a semi-non-aqueous solution as a precursor. A semi-closed system, including a self-inertizing system, is useful for spray drying of electrocatalyst powders that require an inert atmosphere and/or precursors that are potentially flammable.

In addition, two spray dryer designs, are particularly useful for the production of electrocatalyst powders. A co-current spray dryer is useful for production of electrocatalyst powders that are sensitive to high temperature excursions (e.g., greater than about 350° C.) or that require a rotary atomizer to generate the aerosol. Mixed-flow spray dryers are useful for producing powders that require relatively high temperature excursions (e.g., greater than about 350° C.) or require turbulent mixing forces.

In a co-current spray dryer, the hot gas is introduced at the top of the unit where the droplets are generated with any of the atomization techniques mentioned above. The maximum temperature that a droplet/particle is exposed to in a co-current spray dryer is the temperature of the outlet. Typically, the outlet temperature is limited to about 200° C., although some designs allow for higher temperatures. In addition, since the particles experience the lowest temperature in the beginning of the time-temperature curve and the highest temperature at the end, the possibility of precursor surface diffusion and agglomeration is high.

A more preferred spray conversion system is based on a mixed-flow spray dryer. A mixed-flow spray dryer introduces the hot gas at the top of the unit and the precursor droplets are generated near the bottom and are directed upwardly. The droplets/particles are forced towards the top of the unit then fall and flow back down with the gas back down, increasing the residence time in the spray dryer. The temperature the particles experience is also higher as compared to a co-current spray dryer. This is important, as most spray dryers are not capable of reaching the higher temperatures that are required for conversion of some precursor salts.

These conditions are advantageous for aggregate electrocatalyst particle synthesis at a wide range of metal active species loadings, such as up to about 90 wt. % metal on carbon. For mixed flow spray dryers the reaction temperatures can be high enough for the decomposition of metal active species precursors such as Pt precursors (e.g., between 250° C. and 300° C.). The highest temperature in these spray dryers is the inlet temperature (e.g., 600° C. and higher), and the outlet temperature can be as low as 90° C. Therefore, the electrocatalyst particles reach the highest temperature for a relatively short time, which advantageously reduces precursor migration or surface diffusion. This spike of high temperature quickly converts the metal or metal oxide precursor and is followed by a mild quench since the spray dryer temperature quickly decreases after the maximum temperature is achieved. Thus, the spike-like temperature profile is advantageous for the generation of highly dispersed metal or metal oxide active species clusters on the surface of the support phase.

The range of useful residence times for producing electrocatalyst powders depends on the spray dryer design type, atmosphere used, nozzle configuration, feed liquid inlet temperature and the residual moisture content. In general, residence times for the production of electrocatalyst powders can range from 5 seconds up to 5 minutes. According to one embodiment, the residence time is from about 15 to about 45 seconds using a mixed flow spray dryer with air as a carrier gas, a two-fluid nozzle with greater than 2:1 air to feed mass ratio and an aqueous feed solution at a 530° C. inlet temperature with less than 2% residual moisture content.

The range of inlet temperatures for producing electrocatalyst powders depends on the spray dryer design type, atmosphere used, nozzle configuration, feed liquid, and energy required to perform drying and/or decomposition functions. Useful inlet temperatures should be sufficiently high to accomplish the drying and/or decomposition functions without promoting significant surface diffusion of catalytic material to reduce its performance.

In general, the outlet temperature of the spray dryer determines the residual moisture content of the powder. For the production of electrocatalyst powder, the range of useful outlet temperatures depends on the spray dryer design type, atmosphere used, nozzle configuration, feed liquid, inlet temperature, and residual moisture content. For example, a useful outlet temperature according to one embodiment of the present invention ranges from about 200° C. to about 350° C.

Other equipment that is desirable for producing electrocatalyst powders using a spray dryer includes a heater for the gas and a collection system. Either direct heating or indirect heating, including burning fuel, heating electrically, liquid-phase heating or steam heating, can accomplish heating of the gas. The most useful type of heating for the production of electrocatalyst powders processed with an inlet temperature greater than 350° C. is direct fuel burning.

Many collection methods are useful for collecting electrocatalyst powders produced on a spray dryer. These methods include, but are not limited to those using cyclone, bag/cartridge filter, electrostatic precipitator, and various wet collection techniques.

A particularly preferred spray process for producing electrocatalyst particles is disclosed in commonly owned U.S. patent application Ser. No. 09/815,380, which is incorporated herein by reference in its entirety.

In addition to electrocatalyst particles, the electrocatalyst layer may also include other functional materials such as proton-conducting polymer materials (PCPs), hydrophobic materials (HPOs) and/or electrically conductive materials (ELCs). PCPs facilitate the transport of protons to the PEM in the anode and to the active sites in the cathode. HPOs are used to facilitate the transport of water and methanol to the active sites within the anode electrocatalyst layers and away from the PEM to prevent cross-over. HPOs are also used in the cathode electrocatalyst layer to facilitate the removal of water from the cathode. ELCs are used to facilitate the transport of electrons to the bipolar plate and electrocatalyst layers in the cathode.

PCPs are materials which are capable of selectively transporting protons. Preferred PCP materials include polymers created from poly[perfluorosulfonic] acid, polysulfones, perfluorocarbonic acid, PBI, PVDF and styrene-divinylbenzene sulfonic acid. A particularly preferred PCP is NAFION, described above with respect to PEMs. The PCP can be comprised of any material, organic or inorganic, that has proton conducting properties including proton conducting metal oxides embedded in other materials such as organic polymers. The PCP may be incorporated into an ink composition according to the present invention by using multi-component particles, described below, or by directly incorporating the PCP within the ink composition, such as in the form of an emulsion or a solution.

Hydrophobic materials (HPOs) prevent certain hydrophilic liquids, such as water and methanol, from reaching or staying within certain areas of the MEA. Hydrophobic means "water fearing" and hydrophilic means "water liking." The standard measure of hydrophobicity for a surface is the contact angle between that surface and a water droplet sitting on it, as determined by a contact goniometer. The angle is measured at the base of the water droplet. A surface is generally considered to be hydrophobic if the contact angle is greater than 90° and hydrophilic if the contact angle is less than 90°.

As is known by those skilled in the art, hydrophobic materials and hydrophilic materials are generally not miscible. As such, a greater amount of energy will be required to transport liquids within or through a hydrophobic material than through a neutral or hydrophilic material. Likewise, less energy is required to remove liquids from hydrophobic areas. In accordance with certain embodiments of the present invention, HPOs are deposited in select areas of the MEA to facilitate transfer of water or methanol to, from or out of certain areas within the MEA. Preferred HPOs include hydrophobic materials such as tetrafluoroethylene (TFE) fluorocarbon polymers, glass, nylon and polyethersulfones. A particularly preferred HPO is a TFE fluorocarbon polymer sold under the name TEFLON (E.I. duPont de Nemours, Wilmington, Del.). The function of the HPO is generally to manage the transport of water or other hydrophilic liquids by repelling them from certain areas within the layer. The HPO may be incorporated into an ink composition according to the present invention by using multi-component particles, described below, or by directly incorporating the HPO within the ink composition, such as in the form of an emulsion or a solution.

Preferred ELCs include electrically conductive carbon such as graphite carbon, acetylene black carbon or activated carbon. The desired properties of these carbon materials are that they be electronically conductive, resistant to corrosion under electrochemical load and that they be dispersable to yield an appropriate viscosity ink composition to be printed by the methods of the present invention.

The PCP, HPO and/or ELC may be deposited using any suitable means including the use of a direct-write tool. When using a direct-write tool, the materials may be in any physical state that allows suitable dispersion in an ink composition, discussed below, without affecting the ability of the ink composition to be deposited using a direct-write tool. In other words, the addition of the PCP, HPO and/or ELC to the ink composition should not materially affect the viscosity, surface tension or solids loading of the ink composition such that the composition cannot be deposited using the selected direct-write tool.

According to one embodiment of the present invention, the electrocatalyst layer is created by depositing an ink composition on a substrate using a direct-write tool. In order to facilitate production of the electrocatalyst layers using a direct-write tool, it may be desirable to deposit two or more of the requisite materials simultaneously. This may be achieved by contemporaneously using two or more direct-write tools or, alternatively, by using a single direct-write tool in conjunction with an ink composition comprising two or more of the foregoing materials. Alternatively, the ink composition may include multi-component particles. In another embodiment of the present invention, two different layers may be deposited sequentially, one on top of the other or in a pattern, such that a concentration gradient is formed in multiple directions.

As used herein, the term multi-component particles refers to particles wherein at least one of a PCP, HPO or ELC is incorporated into the aggregate particle structure. Multi-component particles may solely incorporate only one of a PCP, HPO or ELC into the aggregate particle structure or multi-component particles may incorporate two or more of a PCP, HPO or ELC into the aggregate structure, depending on the type of properties desired to be imparted to the produced layer.

For example, multi-component particles may comprise an electrocatalyst and PCP ("EC-PCP particles"). EC-PCP particles are useful for imparting both electrocatalytic properties and proton-conducting properties to the produced layer and for providing catalyst loading and proton conductivity gradients within the layer.

Multi-component particles may comprise an electrocatalyst, PCP and ELC ("EC-PCP-ELC particles"). EC-PCP-ELC particles are useful for imparting electrocatalytic properties, proton-conducting properties and enhanced electron conducting properties to the produced layer and for providing catalyst loading, proton conductivity and electron conductivity gradients within the layer.

Multi-component particles may comprise an electrocatalyst, PCP and HPO ("EC-PCP-HPO particles"). EC-PCP-HPO particles are useful for imparting electrocatalytic properties, proton-conducting properties and hydrophobic properties to the produced layer and for providing catalyst loading, proton conductivity and hydrophobicity gradients within the layer.

Multi-component particles may comprise an electrocatalyst, PCP, HPO and ELC ("EC-PCP-HPO-ELC particles"). EC-PCP-HPO-ELC particles are useful for imparting electrocatalytic, proton-conducting, hydrophobic and enhanced electron conducting properties to the layer. EC-PCP-HPO-ELC particles provide the ability to deposit the materials necessary to create an electrocatalyst layer with the requisite transport properties in one ink composition and in one deposition step. EC-PCP-HPO-ELC particles also provide the ability to form gradients of catalyst loading, proton conductivity, hydrophobicity and electron conductivity within the layer.

Multi-component particles may comprise ELC and HPO ("ELC-HPO particles") ELC-HPO particles can be made in a similar fashion as was described above for the multi-component complex particles and can be used to modify the properties, of the gas/liquid diffusion layer. They can also be used to create a gradient when deposited in a patterned fashion together with other materials to form a EC-PCP-HPO-ELC structure.

Multi-component particles can be fabricated according to the present invention using a spray processing method, as is discussed above. The components (PCP, HPO and/or ELC) can be included in a precursor solution, with or without an electrocatalyst precursor, which is spray processed at an appropriate temperature to form the multi-component particles. For example, the precursor solution for spray processing can include an appropriate amount of TFE fluorocarbon polymer and particulate carbon to yield ELC-HPO particles.

As used throughout the present specification, the term "electrocatalyst particles" includes multi-component particles.

The arrangement of materials within the electrocatalyst layers is important to achieve optimal functionality of the MEA. As described above, the anode electrocatalyst layer in a DMFC is responsible for oxidizing methanol and therefore the anode electrocatalyst layer must be porous to liquid methanol so that the methanol can reach the active sites within the electrocatalyst layer. Moreover, once the hydrogen ions and electrons have been formed, the electrons should be transported to the bipolar plate, which is generally achieved through a conducting network of electrocatalyst particles. Therefore, the anode electrocatalyst layers must not be so porous that the electrically conductive materials are not well connected. Additionally, the concentration of methanol is not uniform within the anode and the concentration increases with increasing distance from the PEM. It is thus preferred according to one embodiment that the loading of electrocatalyst within electrocatalyst layer decrease with increasing proximity to the PEM.

One way to achieve optimal methanol diffusivity without sacrificing electrical conductivity and while simultaneously achieving sufficient electrocatalyst loading is to optimize the porosity and materials loading within the electrocatalyst layer. According to certain embodiments of the present invention, electrocatalyst layers with deliberate variations in electrocatalyst particle size and/or materials composition can be produced, such as depicted in FIGS. 6 through 10. As used in the subsequent discussion, the term "horizontal" refers to a direction that is predominately parallel to the major plane of the PEM surface and the term "vertical" refers to a direction that is predominately perpendicular to the major plane of the PEM surface.

Figure 6:
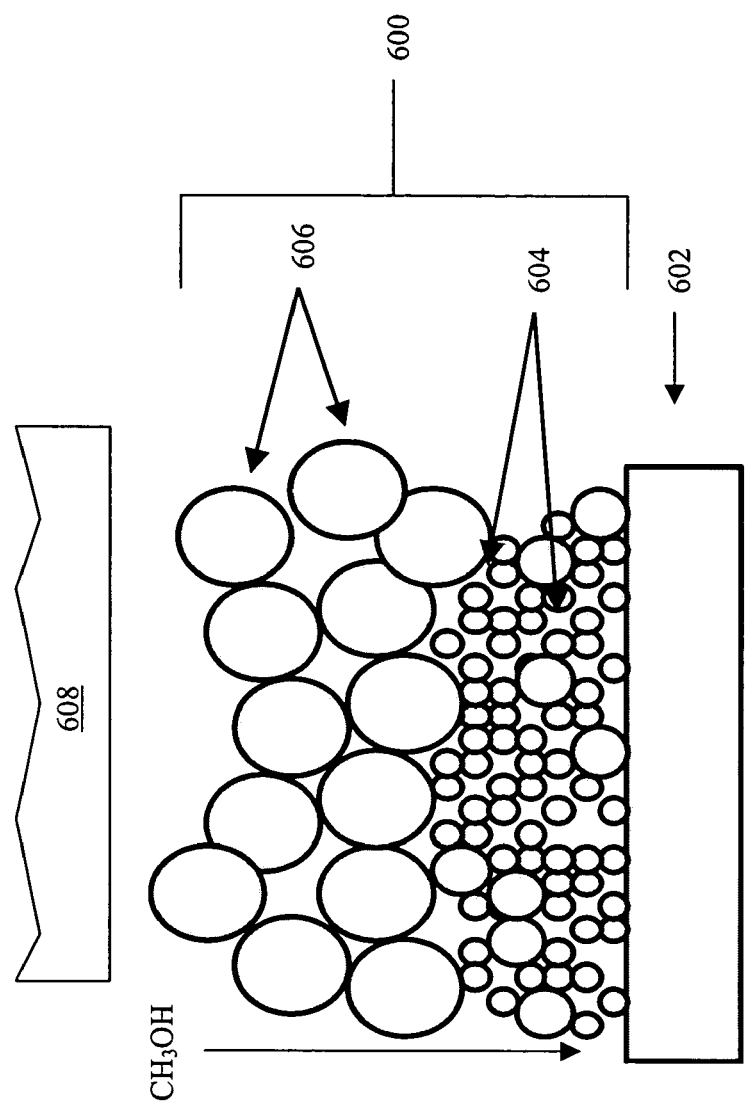
FIG. 6 illustrates a cross-sectional view of a portion of an MEA according to the present invention comprising a vertical gradient in particle size within the electrocatalyst layer.

FIG. 6 illustrates a cross-sectional view of an electrocatalyst layer according to the present invention comprising a gradient in particle size in the vertical direction within the electrocatalyst layer. The electrocatalyst layer 600 is disposed between a PEM 602 and a fluid distribution layer 608 and comprises a first layer of larger electrocatalyst particles 606 proximal to the fluid distribution layer 608 and a second layer of smaller electrocatalyst particles 604 disposed between the layer of larger electrocatalyst particles 606 and the PEM 602. Using the DMFC anode electrocatalyst layer as an example, methanol enters the electrocatalyst layer 600 from the fluid distribution layer 608. The methanol enters the layer of larger electrocatalyst particles 606 and may contact such electrocatalyst particles, thereby becoming oxidized and forming ions, electrons and carbon dioxide. However, due in part to the relatively large voids between the larger electrocatalyst particles, there is a reduced likelihood that methanol will contact the larger electrocatalyst particles and become oxidized. As a result, some of the methanol will diffuse through the layer of larger electrocatalyst particles 606 and reach the layer of smaller electrocatalyst particles 604. However, the change in size of the electrocatalyst particles also reduces the void size and thus the amount of space available for diffusion, which in turn minimizes further methanol diffusion towards the PEM and, in turn, increases the likelihood that methanol will react with an active site within the electrocatalyst layer 600 prior to its reaching the PEM. This structure is also beneficial in that more methanol is likely to react proximal to the PEM, which increases the efficiency of proton transport within the MEA and thus the efficiency of the fuel cell. The electrical conductivity of the electrocatalyst layer is maintained by the intimate contact of the particles. According to a preferred embodiment, the smaller electrocatalyst particles 604 have an average particle size of at least about 0.3 μm and not greater than about 10 μm, such as from about 0.5 μm to about 10 μm, and the larger electrocatalyst particles 606 have an average particle size of not greater than about 200 μm and preferably at least about 1 μm, such as from about 3 μm to about 100 μm. Electrocatalyst layers comprising vertical gradients in particle size can be produced using the methods of the present invention, such as by the use of direct-write tools, described in more detail below, to sequentially deposit the layers. The layers 606 and 604 may also comprise electrocatalyst particles with different compositions and/or mass loadings independent of any difference in size. For example, it may be advantageous to put a thin layer of a highly active electrocatalyst material very close to the PEM to ensure that the methanol is consumed, thereby reducing the amount of methanol crossover. The combined thickness of the electrocatalyst layers can be, for example, not greater than about 200 μm.

Figure 7:
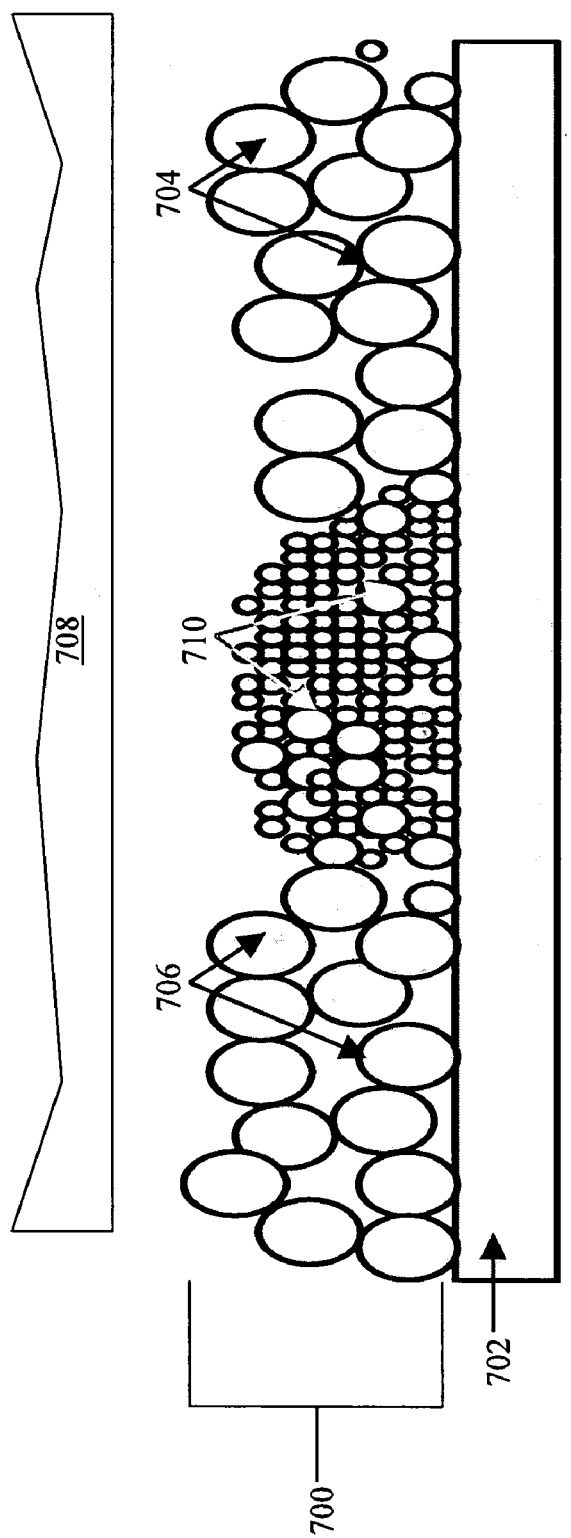
FIG. 7 illustrates a cross-sectional view of a portion of an MEA according to the present invention comprising a horizontal gradient in particle size within the electrocatalyst layer.

FIG. 7 illustrates a cross-sectional view of an electrocatalyst layer comprising a gradient in electrocatalyst particle size, in the horizontal direction within the electrocatalyst layer. The electrocatalyst layer 700 is disposed between a PEM 702 and a fluid distribution layer 708 and comprises first regions of larger electrocatalyst particles 704 and 706 and second regions of smaller electrocatalyst particles 710 disposed among the regions of larger electrocatalyst particles 704 and 706. Using the DMFC anode electrocatalyst layer as an example, methanol enters the electrocatalyst layer 700 from the fluid distribution layer 708. Following the path of least resistance, the methanol is more likely to diffuse away from the regions of smaller electrocatalyst particles 710 and toward the regions of larger electrocatalyst particles 704 and 706. As a result, methanol transport in the horizontal direction will be increased, thereby decreasing the probability of crossover. Preferred particle sizes for the first and second regions are as described above with respect to FIG. 6. The different regions of larger electrocatalyst particles and smaller electrocatalyst particles can be disposed on the PEM in a variety of patterns, such as a checkerboard pattern and the different regions can be of virtually any shape or size. The concentration of the regions on the PEM can also vary—for example, the concentration of regions with larger electrocatalyst particles (e.g., regions 704 and 706) can increase toward the perimeter of the PEM to enhance horizontal transport of the liquid fuel across the full surface of the electrocatalyst layer. In another embodiment of the present invention, the electrocatalyst composition can be different in the region denoted by 710 as compared to the regions denoted by 704 and 706. Electrocatalyst layers comprising horizontal gradients in particle size can be produced using the methods of the present invention, such as by the use of direct-write tools, described in more detail below.

Figure 8:
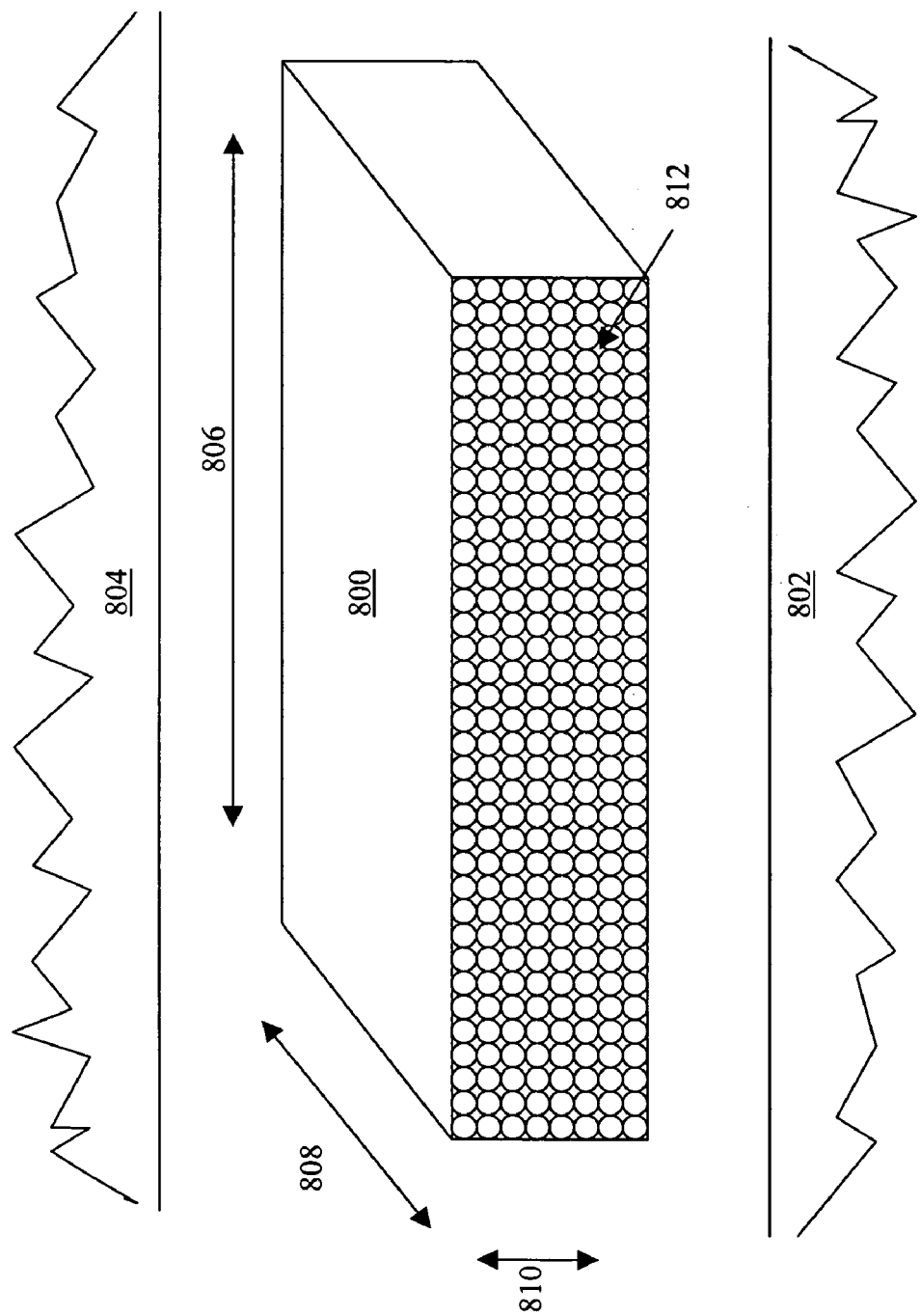
FIG. 8 illustrates an exploded view of a portion of an MEA according to the present invention comprising gradients in concentration within the electrocatalyst layer.

FIG. 8 illustrates an exploded view of a MEA (not to scale) comprising an electrocatalyst layer with one or more concentration gradients within the electrocatalyst layer, such as a gradient in electrocatalyst, PCP, HPO, ELC or a combination thereof. The electrocatalyst layer 800 is disposed between a PEM 802 and a gas or fluid distribution layer 804 and comprises electrocatalyst particles 812, the electrocatalyst layer having a length 806, width 808 and a depth 810. The electrocatalyst layer 800 comprises a deliberate gradient in the concentration of secondary material within the electrocatalyst layer, the layer and gradient being produced using a direct-write tool in accordance with the present invention, as discussed below. In one embodiment of the present invention, the concentration of a material within the electrocatalyst layer varies along at least of the length 806, width 808 or depth 810 of the electrocatalyst layer.

Figure 9A:
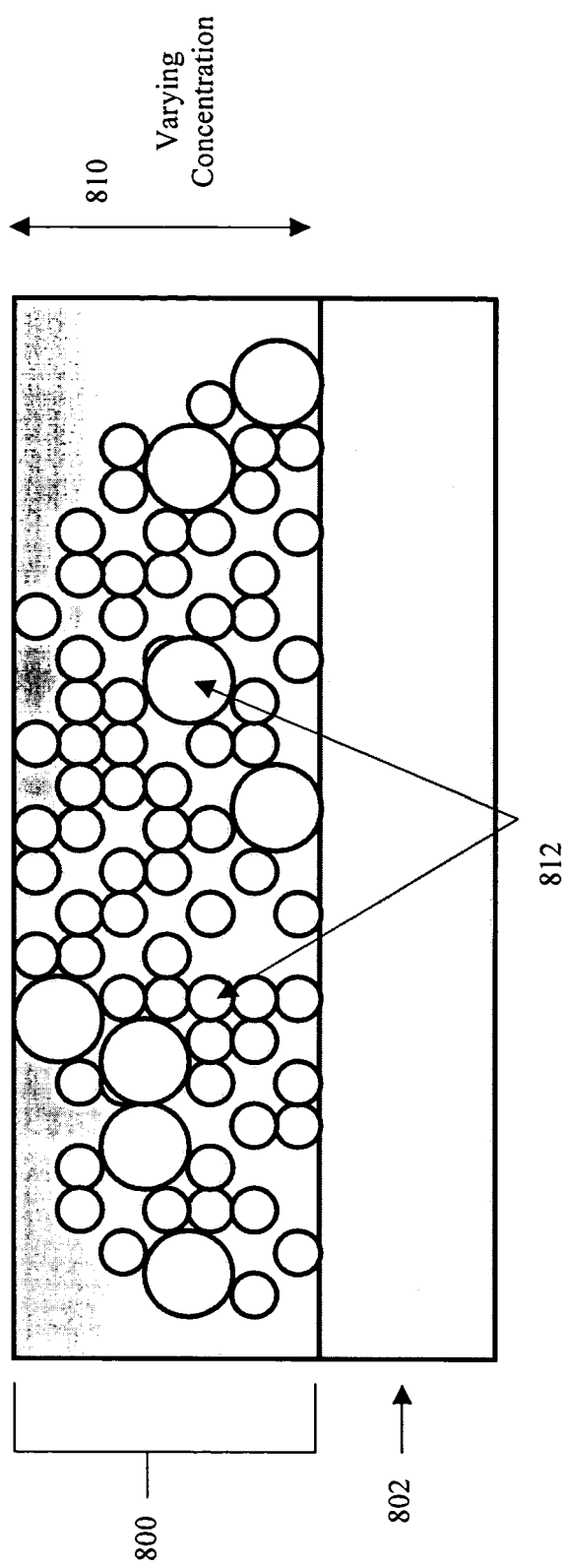
FIGS. 9a and 9b illustrate a cross-sectional view of a portion of an MEA according to the present invention comprising a vertical and horizontal gradient in concentration within the electrocatalyst layer.

In a preferred embodiment, illustrated in cross-section in FIG. 9a, the concentration of one or more materials selected from PCP, HPO or ELC varies along the depth 810 of the electrocatalyst layer 800. In one preferred embodiment, the concentration of one of these materials proximal to the PEM 802 is greater than the concentration of the material proximal to the gas or fluid distribution layer (not illustrated) opposite the PEM. This embodiment is useful, for example, in preventing cross-over without materially limiting the ability of the methanol to reach the active sites within the electrocatalyst layer 800. By depositing a greater concentration of HPO closer to the PEM, a concentration gradient of hydrophobic material is produced. The hydrophobicity of the electrocatalyst layer 800 thus will be greater nearer the PEM, thereby decreasing the likelihood of methanol transport to the PEM, without preventing methanol from reaching active sites located at a distance further from the PEM.

Figure 9B:
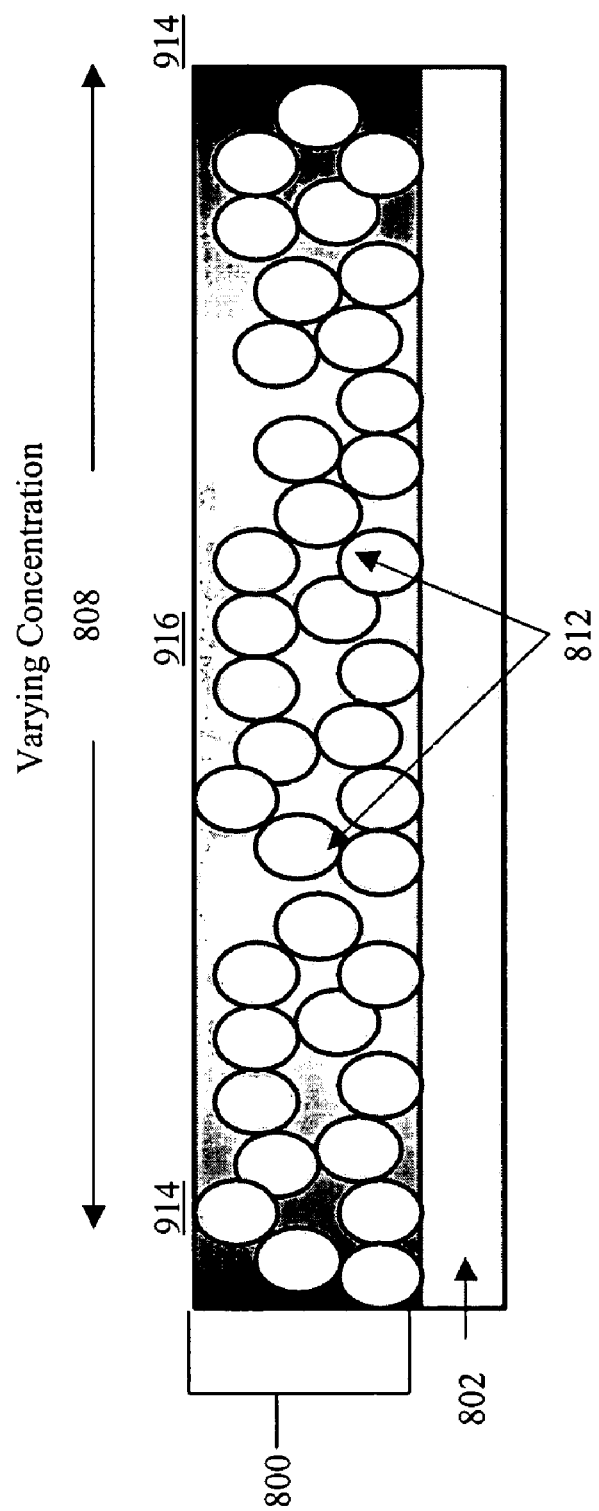

In another preferred embodiment, illustrated in cross-section in FIG. 9b, the concentration of secondary material varies along the width of the electrocatalyst layer. Preferably, there are regions in the electrocatalyst layer 800 where the concentration of the secondary material 914 is greater than the concentration of the secondary material in other regions 916. This embodiment is useful for matching the properties of the electrode layer with the gas or liquid flow. Using HPO as an example, by depositing HPO in some regions at a higher concentration compared to other regions in the electrocatalyst layer, a concentration gradient of HPO is produced. This will produce regions that have differences in hydrophobicity distributed in a predetermined pattern across the surface of the electrode with the advantages that the transport of various gases and liquids can be enhanced or inhibited. The different regions (e.g., 914 and 916) can have a variety of shapes and can be disposed on the PEM in a variety of patterns.

As another example, by depositing ELC in a higher concentration closer to the periphery of the PEM, a concentration gradient of ELC is produced. The periphery of the electrocatalyst layer will thus be more electrically conductive, thereby decreasing electrical contact resistance and increasing the likelihood of electron transport to/from the bipolar plates from/to the electrocatalyst particles.

The concentration gradients described above can be produced according to the present invention by depositing electrocatalyst particles, PCP, HPO, ELC, multi-component particles, and combinations thereof, as necessary, in varying amounts within the electrocatalyst layer using a direct-write tool. While simple 1-dimensional concentration gradients along the width and depth of the electrocatalyst layer are illustrated, the concentration gradient may be produced in any direction within the electrocatalyst layer and in two or three-dimensions. For example, a concentration gradient could be deliberately varied in both X and Y directions or along X, Y and Z directions. Moreover, the concentration gradients described above may be used in combination with the particle gradients described above to create an electrocatalyst layer which includes deliberate gradients in both particle size and concentration of functional materials within the layer.

The gradient layers described above can be produced by sequential coating/printing of ink compositions comprising the appropriate functional material(s) such as electrocatalyst, PCP, HPO and/or ELC in different concentrations. For example, a gradient layer can be formed by printing or coating three inks having three different compositions, for example where: a first ink composition is comprised of functional material A and functional material B in a relative ratio of 90:10, respectively; a second ink composition is comprised of functional material A and functional material B in a relative ratio of 50:50, respectively; and a third ink composition is comprised of functional material A and functional material B in a relative ratio of 10:90, respectively. The layer is preferably constructed from ink compositions delivered using a direct-write tool to allow the maximum flexibility in producing the gradient composition. If each ink composition is printed one on top of the other and the inks are dried between each consecutive printing/coating, then the compositional interface between the layers derived from each ink composition will be sharp. However, if the each ink composition is printed one on top of the other, and the inks remain at least partially wet during the deposition steps, then there will be diffusion between the layers derived from each ink composition resulting in a gradient in composition rather than a sharp concentration change at the layer interface. Direct-write, non-contact printing/coating methods such as ink-jet deposition and syringe dispensing enable sequential printing of wet layers to achieve a gradient in composition at the interface between the ink layers and therefore within the electrode layer. Spray methods can also be used to create such gradients. Other printing methods, particularly contact printing methods such as screen printing, slot-dye and gravure can be useful for printing/coating layers where the ink compositions are dried between coating steps, leading to a sharp concentration change at the interface.

Figure 10:
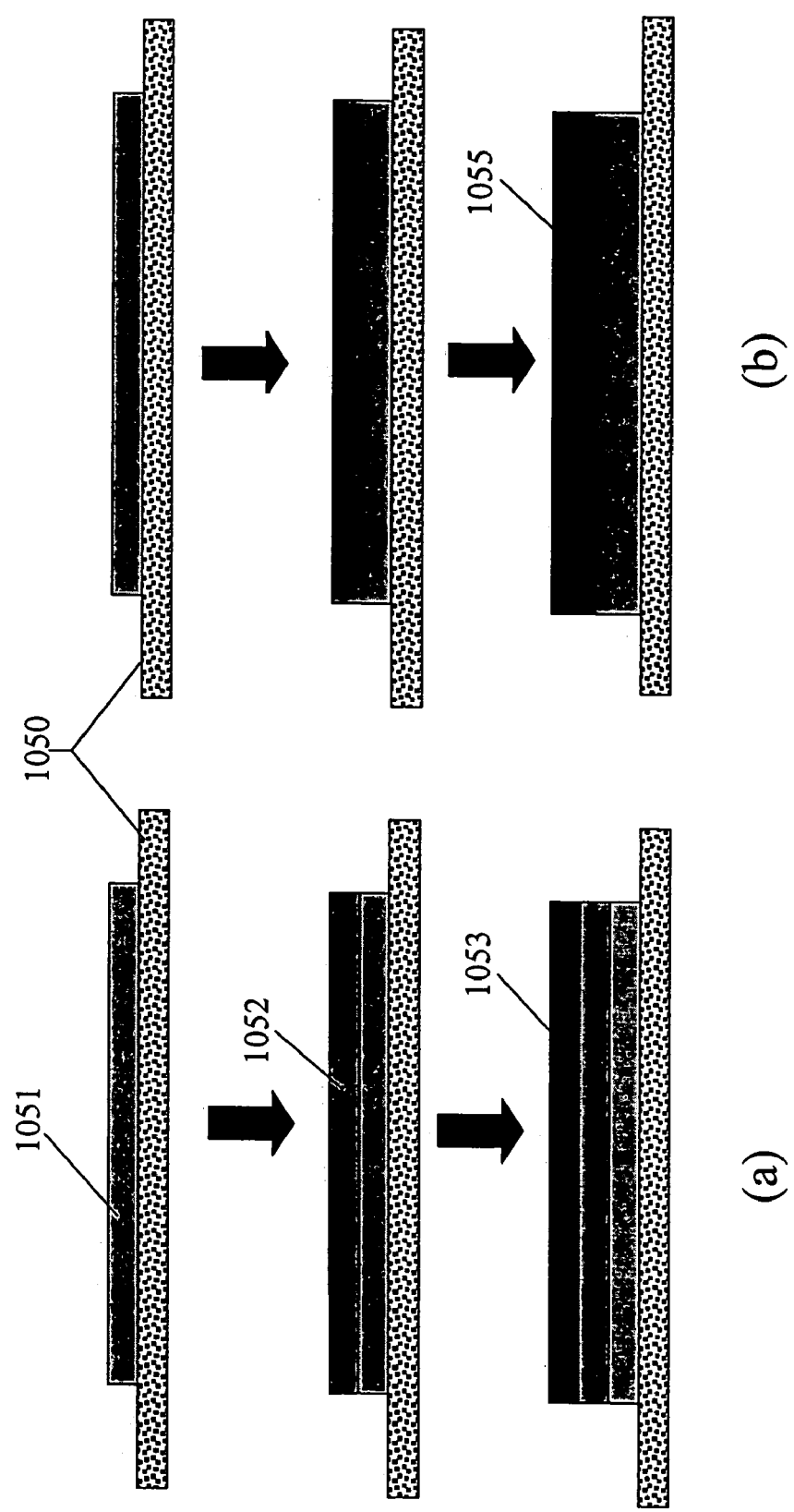
FIGS. 10a and 10b illustrate a cross-sectional view of two methods of creating MEA structures with varying gradients in concentration in the vertical direction according to an embodiment of the present invention.
Figure 11:
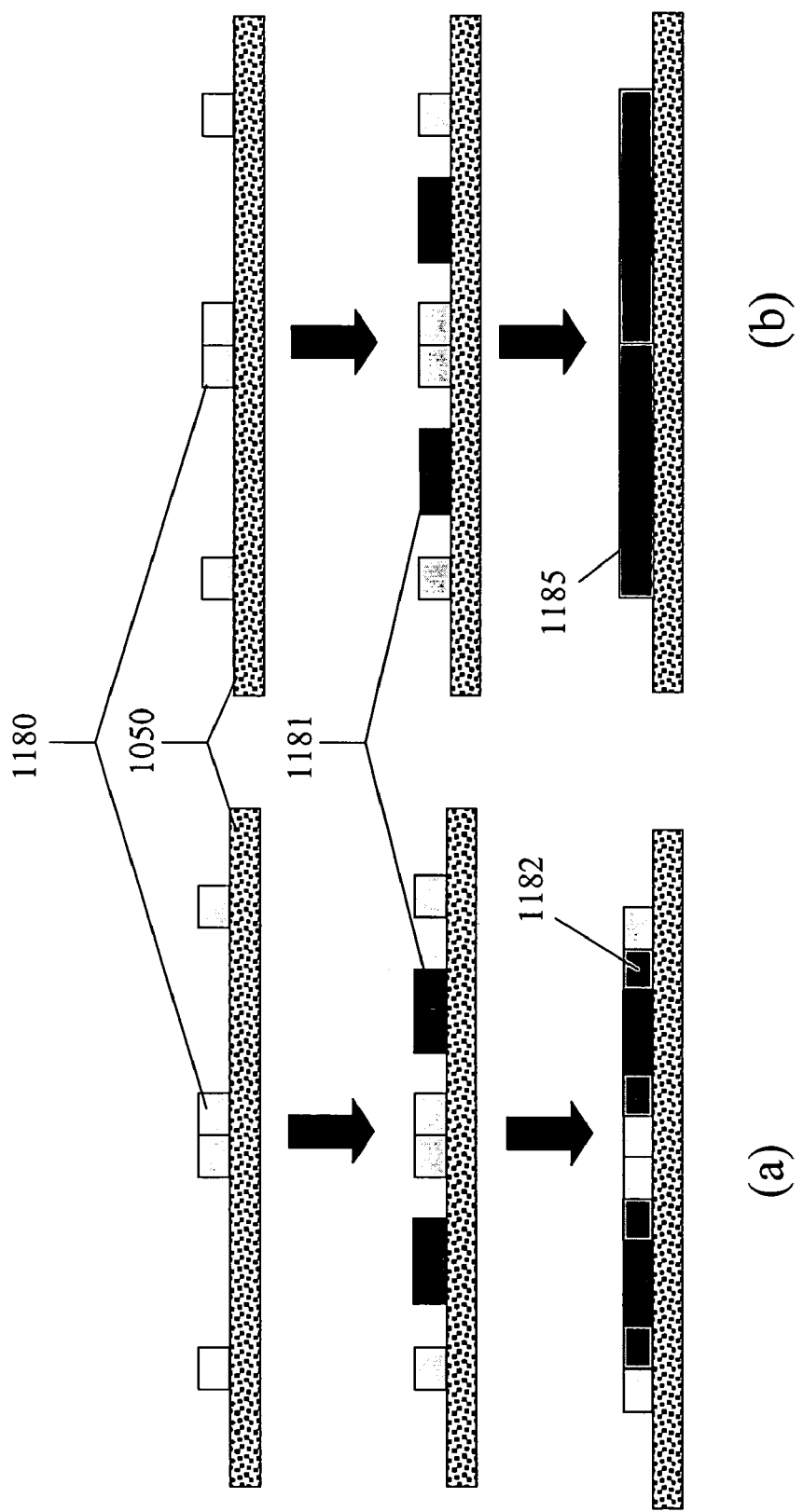
FIGS. 11a and 11b illustrate a cross-sectional view of two methods of fabricating MEA structures with horizontal gradients in concentration according to an embodiment of the present invention.
Figure 12:
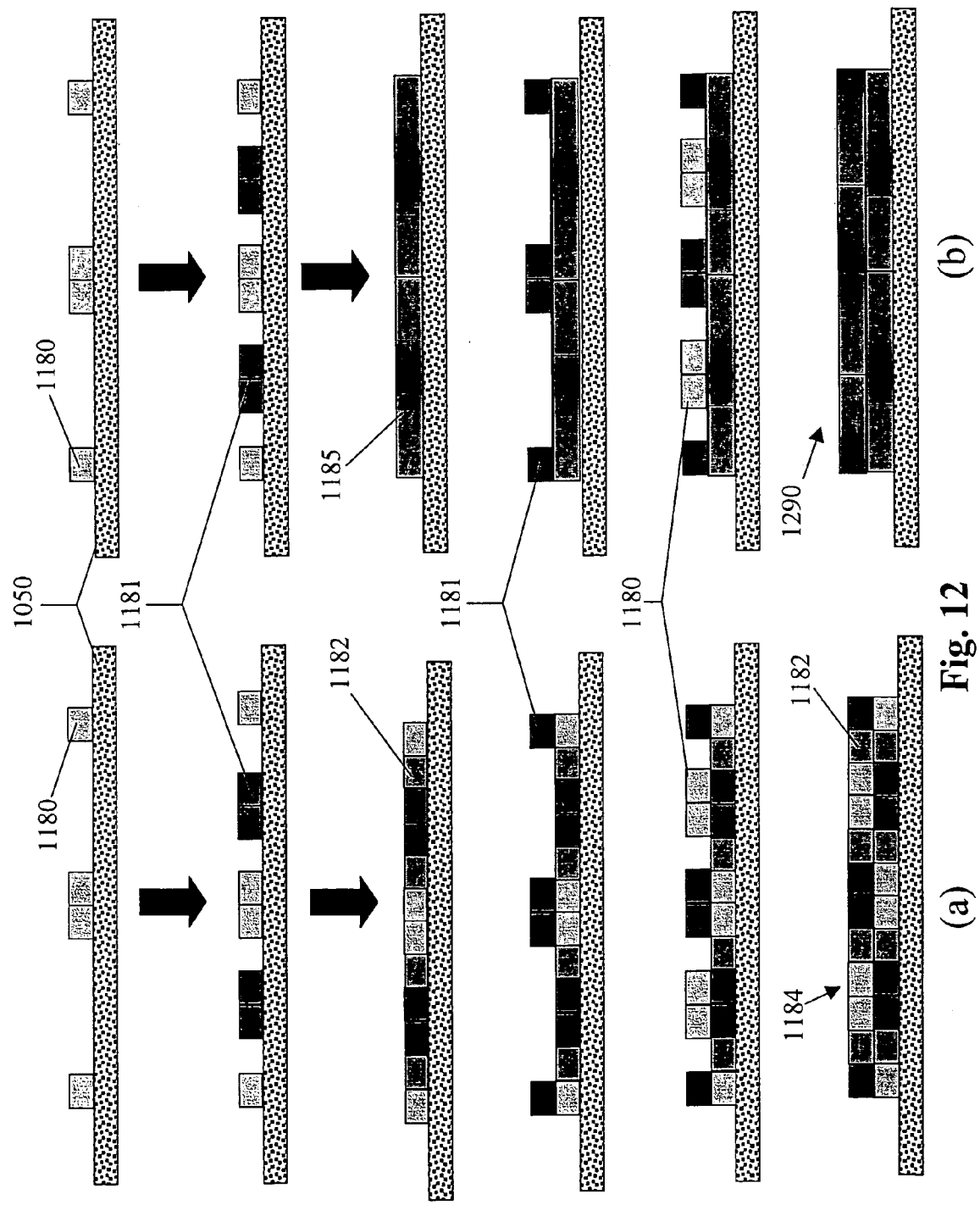
FIGS. 12a and 12b illustrate a cross-sectional view of two methods of fabricating MEA structures with vertical and horizontal gradients in concentration according to an embodiment of the present invention.

The layer fabricated from three inks with different ink compositions described above can be constructed such that is has a gradient in composition in the vertical direction, the horizontal direction or a combination of vertical and horizontal directions. Schematic illustrations of different types of direct-write printed structures that can be created are shown in FIGS. 10 to 12. FIG. 10 shows the construction of a concentration gradient in the vertical direction, FIG. 11 shows a concentration gradient constructed in the horizontal direction and FIG. 12 shows concentration gradients constructed to be a combination of the vertical and horizontal directions.

Referring to FIG. 10a, the substrate 1050, preferably either the PEM or a fluid distribution layer, has a first material layer 1051 printed onto its surface with a first ink composition that includes at least a first functional material. The first layer/ink is dried and then a second layer 1052 derived from a second ink composition is coated onto the surface of the first layer 1051. The second layer 1052 is then dried and a third layer 1053 is deposited from a third ink composition and the layer is dried. Each of the first, second and third inks has a different composition and each composition can include different functional materials and/or different concentrations of functional materials. The resulting structure is comprised of three individual layers with sharp changes in concentrations at the interface.

FIG. 10b shows a similar strategy, but where the three different inks are printed in layers and the inks are not allowed to completely dry between printing and there is significant diffusion between the individual layers resulting in the formation of a final structure 1055 which has a more uniform gradient distribution across the depth of the structure.

FIGS. 11a and 11b show a similar direct-write approach for printing gradients in composition along the horizontal direction using three different ink compositions. In FIG. 11a, three different ink compositions are printed in the three different areas indicated 1180, 1181 and 1182 and allowed to dry between each printing step, resulting in sharp compositional interfaces between the different printed regions. In FIG. 11b, the three different ink compositions are printed in a similar pattern but remain wet and when the final ink is printed the contents of the layers are able to diffuse to form a more uniform gradient structure 1185. In contrast to FIG. 10, FIG. 11 shows how a gradient structure can be formed horizontally on the substrate surface versus vertically with respect to the substrate surface.

FIGS. 12a and 12b illustrate an extension of the construction of the gradient compositional structure shown in FIGS. 10 and 11. The top three structures of FIGS. 12a and 12b are constructed analogously to FIGS. 11a and 11b from three different inks with concentration variation dictated by the drying steps. A first pattern of regions 1180 is formed from a first ink composition by depositing onto a substrate 1050. A second pattern of regions 1181 is formed from a second ink composition that is different than the first ink composition. A third pattern of regions 1182 can then be formed, the third ink composition being different than the first and second ink compositions. The lower three structures of FIGS. 12a and 12b are printed using the same three inks as the top three structures, where the structures in FIG. 12a are dried prior to printing the next ink versus not drying the ink between the steps in FIG. 12b. The result is two different 3-dimensional structures with concentration gradients controlled both vertically and horizontally with respect to the substrate surface 1050, where the final structure 1184 is highly segmented in the case of FIG. 12a, but the structure 1290 is more uniform in the case of FIG. 12b.

The vertical concentration gradients can be described in terms of each components composition change in the layer thickness (d). The layer thickness can vary from sub-micron to several microns. The concentration at the edges of the layer can vary from concentration A1 to concentration A2. Therefore the concentration gradient can be described in terms of concentration difference of a component over the layer thickness, namely:

$$\frac{(A1 - A2)}{d} \quad (5)$$

As a result of the ability to rapidly determine the optimum structure-performance relationship, a complete gas diffusion electrode can be constructed using the foregoing approaches.

Figure 13:
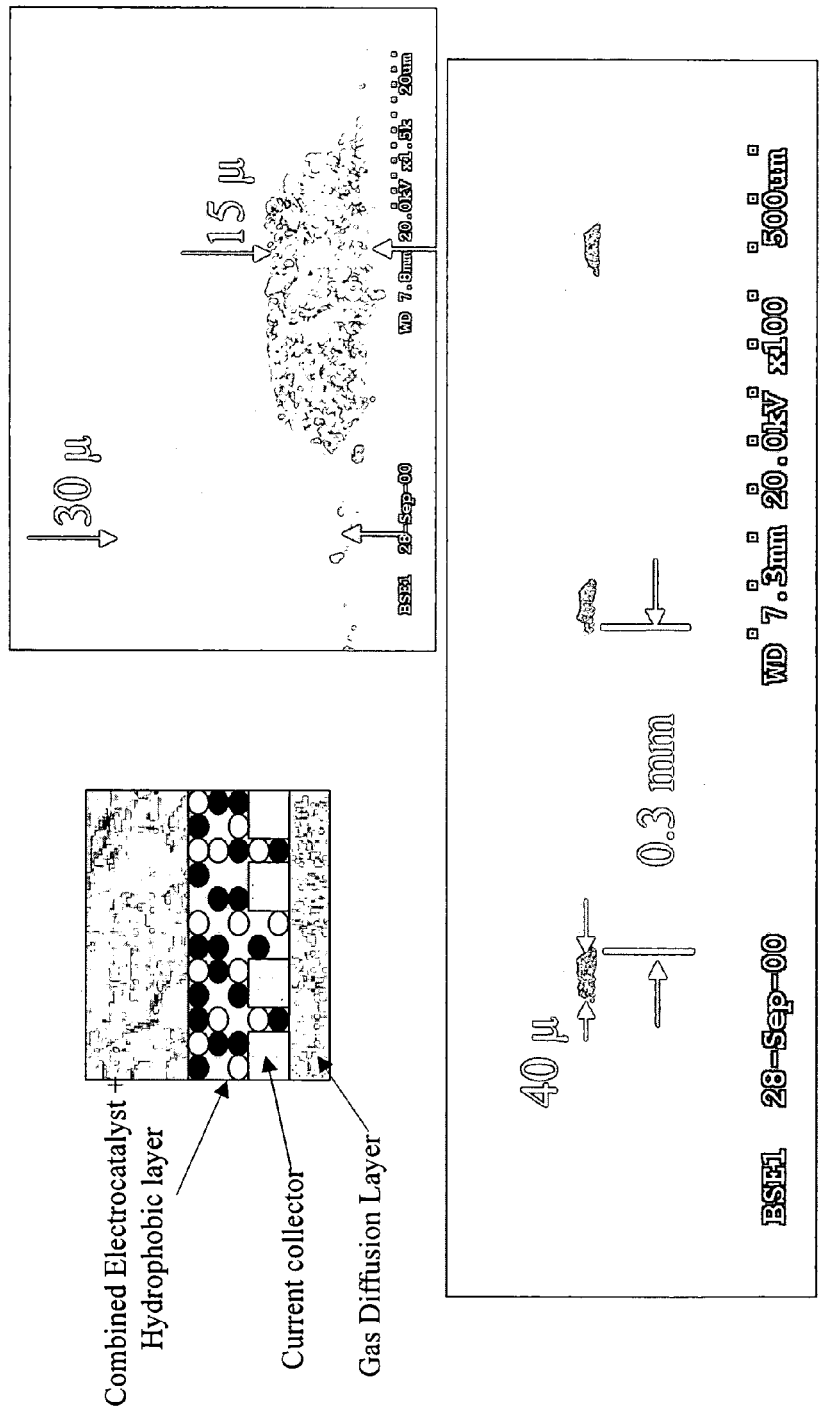
FIG. 13 illustrates a printed gas-diffusion electrode according to the present invention.

A printed gas diffusion electrode in cross-section is illustrated in FIG. 13. The gas diffusion electrode is comprised of a porous gas diffusion layer on which a silver current collector has been printed. The current collector lines (lighter areas in FIG. 13) have dimensions of 40 μm wide, 15 μm in height with a 300 μm spacing between lines. The active layer deposited onto the current collector/gas diffusion layer includes functional materials that catalyze the chemical conversion of the gas and materials that control the hydrophobicity of the layer. The active layer illustrated in FIG. 13 is about 30 μm thick. The control over hydrophobicity in these layers is important to control the transport of liquid water in the presence of a gas such as oxygen or hydrogen to avoid flooding or drying out of the electrode layer.

As is discussed above, gradient hydrophobicity layers can include unmodified carbon material, such as activated carbon, or an electrocatalyst such as one including an active species dispersed on a carbon support phase. Gradient hydrophobicity layers having an average layer thickness of from 5 μm up to 200 μm for each individual layer can preferably be formed in accordance with the present invention for a total layer thickness of 5 μm up to 1 mm or higher.

If the gradient hydrophobicity layer consists of a single sublayer and this layer is placed between the electrocatalyst layer and a gas diffusion layer, the hydrophobicity of this layer is preferably substantially different than the hydrophobicity of the gas diffusion layer or the electrocatalyst layer. For example, if the electrocatalyst layer contains 5 wt. % TFE fluorocarbon polymer and the gas diffusion layer is pure TFE fluorocarbon polymer, the graded hydrophobicity layer would preferably contain at least 25 wt. % and less than 95 wt. % of the TFE fluorocarbon polymer. In another example, if the electrocatalyst layer contains 20 wt. % TFE fluorocarbon polymer and the gas diffusion layer contains 35 wt. % of the TFE fluorocarbon polymer, the graded hydrophobicity layer would preferably have a TFE fluorocarbon polymer content anywhere between 25 wt. % and 95 wt. %. These examples are suitable for fuel cell as well as metal-air battery applications.

For applications using liquid electrolytes, the graded hydrophobicity layer may consist of more than one sublayer. The sublayer with the highest hydrophobicity would interface the gas diffusion layer and the lowest hydrophobicity layer would interface the electrocatalyst layer. For example, if the electrocatalyst layer includes 10 wt. % TFE fluorocarbon polymer and the graded hydrophobicity layer consists of 3 sublayers, the sublayer interfacing the electrocatalyst layer would preferably have at least 25 wt. % TFE fluorocarbon polymer or more, the intermediate sublayer would preferably have 30 wt. % TFE fluorocarbon polymer or more and the sublayer interfacing the gas diffusion electrode would preferably have at least 35 wt. % TFE fluorocarbon polymer or more.

The graded hydrophobicity layer may serve as a microscopic fluid diffusion layer in combination with macroscopic fluid distribution layers such as carbon cloth or carbon paper. For example, if the electrocatalyst layer does not include a HPO but includes a PCP, and the fluid distribution layer is a carbon cloth or carbon paper with hydrophilic properties, the graded hydrophobicity layer can consist of several sublayers with increasing or decreasing HPO content towards the gas distribution layer.

In a PEMFC MEA in which the electrocatalyst layer contains a PCP and a carbon cloth or carbon paper is used for a fluid distribution layer, the graded hydrophobicity layer can consist of a single sublayer with, e.g., 35 wt. % TFE fluorocarbon polymer and 65 wt. % carbon black, or can include several sub layers wherein the one with the lowest HPO content interfaces the electrocatalyst layer, and the one with the highest HPO content interfaces the gas distribution layer.

In another embodiment for DMFCs, and more specifically for the anode of a DMFC, the graded hydrophobicity layer may consist of several sublayers, where the lowest hydrophobicity sublayer interfaces the fluid distribution layer at the anode side and the highest hydrophobicity layer interfaces the electrocatalyst. Alternatively, there can be a single layer having a HPO concentration between 5 and 95 wt. % HPO, such as a TFE fluorocarbon polymer.

In one embodiment the graded hydrophobicity layer can be combined with the current collector of the electrochemical device and serve as a fluid distribution layer with hydrophilic/hydrophobic properties tailored to the particular application.

The ultimate goal of the graded hydrophobic layers is to provide an electrode design solution for humidity control. Hydrophobicity gradients developed within an intermediate layer between the electrocatalyst and the gas-diffusion layers enables conditions that permit capillary condensation of water to take place within its length. Such conditions create a difference in the rate of transport of water through the gas-diffusion electrode and the transport of oxygen or other gas species not subject to capillary condensation.

Figure 14:
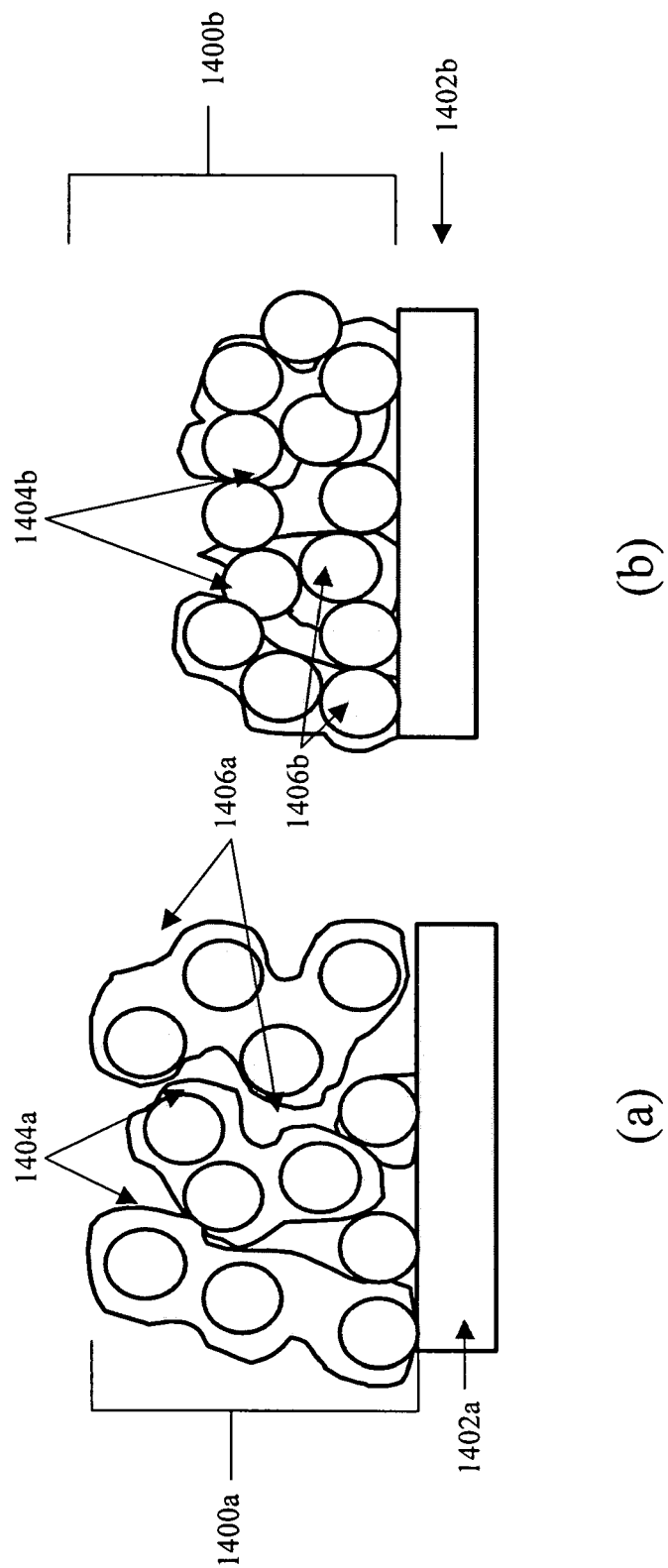
FIGS. 14a and 14b illustrate two cross-sectional views of a portion of an electrocatalyst layer according to the present invention having differing degrees of electrocatalyst particle contact.

The porosity of the electrocatalyst layers should also be controlled to maintain the electrical conductivity of the layer. FIGS. 14a and 14b illustrate a cross-sectional view of two electrocatalyst layers having varying degrees of electrical conductivity. In FIG. 14a, the electrocatalyst layer 1400a is proximal to a PEM 1402a and comprises electrocatalyst particles 1404a in a matrix of proton-conducting polymer materials 1406a. Within the electrocatalyst layer 1400a, a majority of individual electrocatalyst particles are not in significant contact with one another. In this case, the electrocatalyst layer will have poor electrical conductivity leading to ohmic losses within the fuel cell. Decreased contact between electrocatalyst particles could be caused by the simultaneous deposition of both the PCP material and the electrocatalyst particles, causing the PCP to encapsulate the electrocatalyst particles.

In FIG. 14b, the electrocatalyst layer 1400b is proximal to a PEM 1402b and comprises electrocatalyst particles 1404b and proton-conducting materials 1406b. Within the electrocatalyst layer 1400b, the individual electrocatalyst particles are in contact within at least one other particle. In this case, the electrocatalyst layer 1406b will have good electrical conductivity which helps to minimize the ohmic losses within the fuel cell. The electrocatalyst particles can maintain contact with each other through the use of the manufacturing methods of the present invention. In a preferred embodiment, an ink composition including electrocatalyst particles is deposited using a direct-write tool. Subsequently, an ink composition including PCP is deposited onto the electrocatalyst layer using a direct-write tool. In another preferred embodiment, the electrocatalyst layer can be created using multi-component particles including PCP materials, which can be cured after deposition to create an integrated electrocatalyst and proton conducting polymer electrocatalyst layer.

Aside from optimizing the ohmic and transport characteristics of the MEA, as detailed above, the amount of catalyst loading in the electrocatalyst layer should be reduced while maintaining adequate kinetic performance. One method for maintaining or increasing cell performance without increasing cell cost is by using the aggregate electrocatalyst particles disclosed above. Another method for maintaining cell performance is to deposit electrocatalyst materials only where necessary. Electrocatalyst materials are most useful if deposited at the 3-phase interface.

Figure 15:
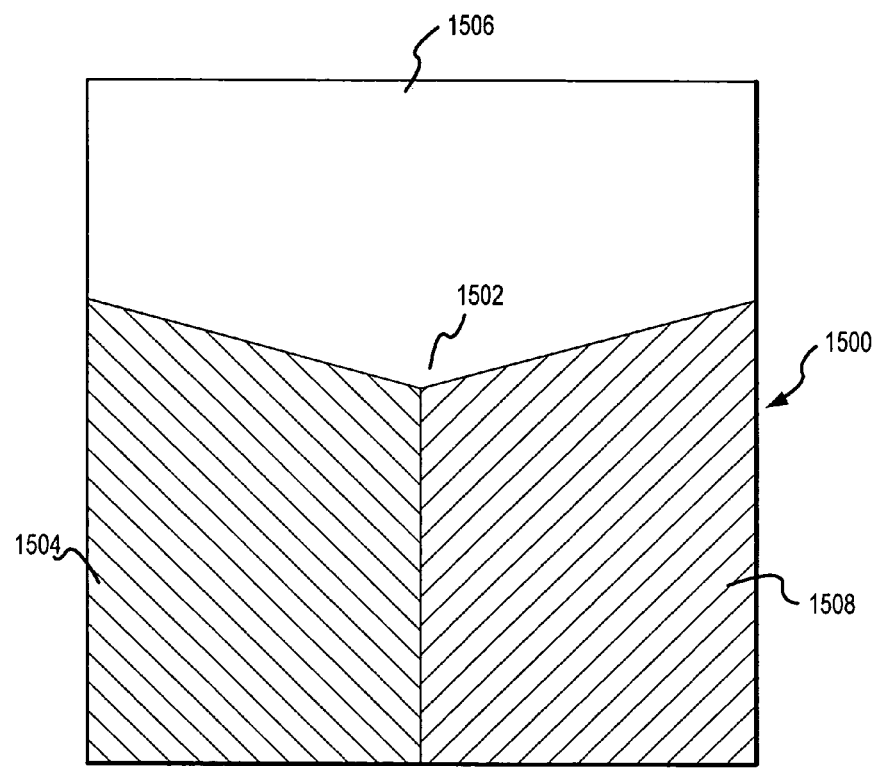
FIG. 15 illustrates the 3-phase interface within a fuel cell.

FIG. 15 illustrates the 3-phase interface 1500. The 3-phase interface 1500 is where the electrocatalyst 1502 is in electrical contact with the electron conducting portions of the fluid distribution layer/bipolar plate, 1504, as appropriate, and diffusional contact with the PEM 1506 and the appropriate electrode fluid 1508, i.e., methanol, hydrogen or oxygen. To accomplish this, conventional DMFCs include a gas-diffusion layer, a catalytic layer and a current collection system without regard to the optimization of the placement of the electrocatalyst in relation to the other layers. With the method of the present invention, both the gas or fluid diffusion layers and the electrocatalyst layers can be deposited only where necessary within the MEA and within tolerable distances from one another, the bipolar plate and the PEM to maximize the concentration of three-phase interfaces within the MEA.

Conventional fluid distribution layers are responsible for both distributing fluid (i.e., a gas or a liquid) to and from the electrocatalyst layers and conducting electrons to the current collectors in the bipolar plates. As a result, the layers are typically porous, which enables the diffusion of reactants and products, and made of carbon or metals which are good electrical conductors. Conventional fluid distribution layers usually consist of substrates (fluid distribution substrates) made of porous carbon paper or carbon cloth and have a thickness of between about 100 µm and 300 µm. However, these fluid distribution substrates are typically suited for the distribution of a gaseous reactant, such as hydrogen or reformed fuel feeds, and are ineffective for distributing liquid methanol mainly due to their thickness and inability to separate fluid transport areas from electron transport areas. Moreover, conventional fluid distribution substrates are typically placed over the entire surface area of the anode, which wastes valuable material.

Using the manufacturing method of the present invention, fluid distribution layers having reduced thickness can be deposited in select locations using a direct-write tool to deposit one or more ink compositions on select areas of a recipient material, such as a electrocatalyst layer, bipolar plate or fluid distribution substrate. In some situations, the fluid distribution layer may be used in conjunction with a bipolar plate, while in other circumstances, the fluid distribution layer may eliminate the need for a bipolar plate. These fluid distribution layers minimize ohmic and transport losses by decreasing diffusional and electron transport distances, resulting in increased MEA efficiency. The fluid distribution layers of the present invention also decrease capital costs since the fluid distribution materials are only deposited in the required areas within the MEA.

Referring back to FIG. 2, the anode fluid distribution layer 206 should be tailored for the transport of hydrophilic liquids, such as methanol, to the anode electrocatalyst layer 220 as opposed to gaseous reactants such as hydrogen. $CO_2$ generated from the oxidation of methanol at the anode electrocatalyst layers 220 can diffuse through the anode fluid distribution layers 206, through bipolar plate 208 and out of the MEA 200. Therefore, the anode fluid distribution layers preferably include materials which balance the hydrophobic properties of the layer and porosity such that the generated $CO_2$ does not inhibit the transport of water and methanol to the anode electrocatalyst layers and vice-versa. Preferably, the anode fluid distribution layers are capable of evenly distributing the methanol over the surface of the anode electrocatalyst layers. To this end, the fluid distribution layer may include hydrophobic polymers, such as. TEFLON and NAFION, carbon particles and powders, and combinations thereof such as with the use of ELC-HPO particles. Hydrophobic materials help ensure that the hydrophilic liquids used to supply the electrocatalyst layer with fuel are displaced from the fluid distribution material, which reduces clogging of the pores within the fluid distribution layer. In some embodiments, the fluid distribution layer will include a fluid distribution substrate, discussed above. The thickness of the fluid distribution layer can vary from several microns to tens of microns. The fluid distribution layer materials that can be used at the anode for DMFC applications are preferably the hydrophilic type.

Cathode fluid distribution layers 212 are preferably capable of transporting gaseous oxygen to the cathode electrocatalyst layers 222. The water generated from the reduction of oxygen to oxygen ions and subsequent reaction with the ionized hydrogen and the electrons at the cathode electrocatalyst layers 222 rapidly diffuse through the cathode fluid distribution layers 212, through bipolar plate 214 and out of the MEA 200 to prevent back-pressure on the water flowing from the anode 204 through the PEM 202 and to the cathode 210. To this end, the cathode fluid distribution layers preferably comprise materials which balance the hydrophobic properties of the layer and porosity such that the generated water does not inhibit the transport of oxygen to the cathode electrocatalyst layers and vice-versa. Preferably, the cathode fluid distribution layer is capable of evenly distributing the oxygen over the surface of the cathode electrocatalyst layers. Fluid distribution layer materials used at the cathode layer are preferably the hydrophobic type.

According to one embodiment of the present invention, fluid distribution layers are manufactured by depositing the an ink composition on a recipient material (e.g., a fluid distribution substrate, bipolar plate, or electrocatalyst layer) using a direct-write tool. These fluid distribution layers may comprise tailored gradients in particle size and materials concentration or both, as described above. Such gradients are sometimes useful in creating the necessary properties within the fluid distribution layer, such as hydrophobicity and electrical conductivity.

An ink composition that is suitable according to the present invention for the construction of a fluid distribution layer is a conductive ink comprising conductive particles such as carbon or silver, or precursors that can be converted to conductive features such as silver. The direct-write deposition of conductive features is described in commonly-owned U.S. patent application Ser. No. 10/265,351.

The conductive particles for the fluid distribution layer may be incorporated into an ink composition that also includes polymers to provide either function or structure to the layer. These polymers can be thermoplastic polymers or thermoset polymers. Thermoplastic polymers are characterized by being fully polymerized. They do not take part in any reactions to further polymerize or cross-link to form a final product. Typically, such thermoplastic polymers are melt-cast, injection molded or dissolved in a solvent. Examples include polyimide films, ABS plastics, vinyl, acrylic, styrene polymers of medium or high molecular weight, and the like.

The polymers can also be thermoset polymers, which are characterized by not being fully polymerized or cured. The components that make up thermoset polymers must undergo further reactions to form fully polymerized, cross-linked or dense final products. Thermoset polymers tend to be resistant to solvents, heat, moisture and light.

A typical thermoset polymer mixture initially includes a monomer, resin or low molecular weight polymer. These components require heat, hardeners, light or a combination of the three to fully polymerize. Hardeners are used to speed the polymerization reactions. Some thermoset polymer systems are two part epoxies that are mixed at consumption or are mixed, stored and used as needed.

Specific examples of thermoset polymers include amine or amide-based epoxies such as diethylenetriamine, polyglycoldianine and triethylenetetramine. Other examples include imidazole, aromatic epoxies, brominated epoxies, thermoset PET, phenolic resins such as bisphenol-A, polymide, acrylics, urethanes and silicones. Hardeners can include isophoronediamine and meta-phenylenediamene.

The polymer can also be an ultraviolet or other light-curable polymer. The polymers in this category are typically UV and light-curable materials that require photoinitiators to initiate the cure. Light energy is absorbed by the photoinitiators in the formulation causing them to fragment into reactive species, which can polymerize or cross-link with other components in the formulation. In acrylate-based adhesives, the reactive species formed in the initiation step are known as free radicals. Another type of photoinitiator, a cationic salt, is used to polymerize epoxy functional resins generating an acid, which reacts to create the cure. Examples of these polymers include cyanoacrylates such as z-cyanoacrylic acid methyl ester with an initiator as well as typical epoxy resin with a cationic salt.

The polymers can also be conductive polymers such as intrinsically conductive polymers. Conductive polymers are disclosed, for example, in U.S. Pat. No. 4,959,430 by Jonas et al., which is incorporated herein by reference in its entirety. Other examples of intrinsically conductive polymers are listed in Table 1 below.

There are a variety of ways to manufacture an MEA. Conventional methods of manufacturing MEAs generally include starting with a prefabricated substrate, such as a PEM or a fluid distribution substrate, and then depositing materials onto the substrate to fabricate additional MEA layers. Methods of depositing materials onto the substrate according to the present invention include physical vapor deposition, spraying, screen printing, electrostatic printing, decal printing, extrusion techniques, such as slot die, and direct-write deposition, such as ink-jet printing and syringe printing. Direct-write deposition processes are particularly preferred.

Producing cost-effective MEAs generally requires a manufacturing method that is able to deposit the desired materials in a desired pattern and in a short amount of time, is able to adapt to changes in materials and deposition patterns quickly, is cost-effective in terms of both materials used and down-time, and has the ability to align the various layers of the MEA within given tolerances, all without sacrificing the performance of the MEA. The methods according to the present invention using direct-write processes allow not only the flexibility to produce the patterns required to achieve the structures indicated but enable the printing of multiple layers in which the drying characteristics can be controlled. For example, printing one wet layer on top of another wet layer enables diffusion of the materials between the layers to create a compositional gradient. There are relatively few printing processes which enable the sequential deposition of wet layers. At the opposite extreme,

TABLE 1

Intrinsically Conductive Polymers

| Examples | Class/Monomers | Catalyst/Dopant |
|---|---|---|
| | Polyacetylene | |
| Poly[bis(benzylthio) acetylene] | Phenyl vinyl sulfoxide | Ti alkylidene |
| Poly[bis(ethylthio)acetylene] | | |
| Poly[bis(methylthio)acetylene] | 1,3,5,7-Cyclooctatetraene | |
| | Polyaniline | |
| Fully reduced | | organic sulfonic acids such as: |
| Half oxidized | | Dinonylnaphthalenedisulfonc acid |
| | | Dinonylnaphthaleneusulfonic acid |
| | | Dodecylbenzenesulfonic acid |
| | Poly(anilinesulfonic acid) | |
| Self-doped state | | |
| | Polypyrrole | |
| | | Organic sulfonic acid |
| | Polythiophene | |
| Poly(thiophine-2.5-diyl) | 2,5-Dibromo-3-alkyl/arylthiophene | |
| Poly(3-alkylthiophene-2.5-diyl) | alkyl = butyl, hexyl, octyl, | |
| alkyl = butyl, hexyl, octyl, | decyl,dodecyl | |
| decyl, dodecyl | aryl = phenyl | |
| Poly(styrenesulfonate)/poly | Dibromodithiophene | |
| -(2,3-dihydrothieno-[3,4-b]-1,4- | Terthiophene | |
| dioxin) | Other substituted thiophenes | |
| | Poly(1,4-phenylenevinylene) (PPV) | |
| | p-Xylylenebis (tetrahydrothiopheniumchloride)) | |
| | Poly(1,4-phenylene sulfide) | |
| | Poly(fluroenyleneethynylene) | | the layers can be dried between the sequential printing steps to provide a sharp interface in the composition between the two layers.

According to one preferred embodiment of the present invention, it is advantageous to manufacture one or more layers of the MEA by depositing an ink composition comprising a material selected from the group consisting of electrocatalyst particles, PCP, HPO, ELC and combinations thereof using a direct-write tool. As used herein, a direct-write tool is a device that deposits a liquid or liquid suspension (e.g., an ink composition) onto a surface by ejecting the liquid through an orifice toward the surface without the tool making substantial contact with the surface (non-contact printing). The direct-write tool is preferably controllable over an x-y grid relative to the printed surface (i.e., either or both the substrate and device can be controllably moved) such that patterns can be formed on the substrate.

One preferred direct-write tool according to the present invention is an ink-jet device. Other examples of direct-write tools include aerosol jet devices, automated syringes, such as the MICROPEN tool, available from Ohmcraft, Inc., of Honeoye Falls, N.Y. and the DOTLINER dispense system (Manncorp, Huntingdon Valley, Pa.) which is capable of dispensing lines, dots and areas down to 200 μm or smaller at speeds of up to 10,000 dots/hour.

According to one embodiment of the present invention, the MEA is constructed by using a direct-write tool to deposit the desired functional materials, e.g., electrocatalyst particles, in a desired pattern on a substrate. Constructing the MEA using a direct-write tool offers a number of advantages. Direct-write tools can deposit the minimum amount of materials and can deposit the materials only in the desired locations. Direct-write tools are capable of forming layers that are thinner and with smaller feature sizes, down to a few microns, compared to those that can be produced by current manufacturing methods such as rolling and pressing. Thinner layers result in reduced mass and volume and therefore an increase in the volumetric and gravimetric energy density of the device. Thinner layers can also facilitate faster transport of species such as ions, electrons and fluids due to the reduced diffusional distances. This can lead to improved performance where, for example, the diffusion of a chemical species is an otherwise rate-limiting factor. Limiting the deposition of materials to only those regions where the material is necessary also further reduces capital costs associated with the production of the MEA.

Direct-write tools can also be controlled using digital technology, which enables digital printing. Digital technology, as used herein, means any technological device which is capable of generating and/or sending one or more digital signals to a direct-write tool to control the tool and includes the use of computers. As used herein, the term digital printing means the use of digital technology in conjunction with a direct-write tool to deposit materials on a substrate.

Digital printing is advantageous for several reasons. Digital printing enables the deposition of materials on a substrate without direct human interaction. This increases safety in the manufacturing facility by minimizing human interaction with machinery and harmful chemicals. Minimizing human interaction with the manufacturing process also eliminates the probability of human error during printing.

Digital printing also enables the use of computer generated deposition patterns. With the use of digital printing, the use of a physical material with an engraved deposition pattern is no longer necessary to enable the deposition of materials in a desired pattern. With digital printing, deposition patterns can be created in a computer software environment ("digital patterns") making the design and generation of deposition patterns easy and cost-effective. Digital patterns can also be changed quickly and without requiring a change to an engraved physical material, which further reduces capital costs. Such a pattern change may be made during manufacture or design with little or no difficulty.

The use of digital printing can achieve changes in deposition patterns very quickly, often less than a second, leading to minimal manufacturing down-time and increased productivity. According to one embodiment of the present invention the time to switch between deposition patterns and resume deposition of the ink composition is very small, on the order of a few seconds. Preferably, the time elapsed from the end of the deposition of an ink composition in a first deposition pattern to the start of the deposition of an ink composition in a second deposition pattern is less then 5 seconds, more preferably is less than 3 seconds and even more preferably is less than 1 second.

Digital printing also facilitates the contemporaneous deposition of more than one ink composition in one or more deposition patterns. Often it may be necessary to deposit more than one material in order to manufacture a fuel cell with the desired transport characteristics. It is often desirable to deposit all materials at a single manufacturing station to decrease the time of manufacture.

Digital printing also facilitates the contemporaneous deposition of one or more ink compositions in one or more deposition patterns on opposing sides of a substrate which increases the probability of proper material alignment within the MEA. Alignment of the electrocatalyst layers with the PEM and corresponding gas or fluid distribution layers is critical to ensure optimal functionality of the fuel cell. Moving the substrate between deposition steps can lead to alignment discrepancies between the various deposition steps. Contemporaneous materials deposition on one or opposing sides of a substrate (e.g., the PEM) according to the present invention helps increase the probability of correct alignment between the various components of the fuel cell by eliminating the need to move the substrate between deposition steps. For these and other reasons, digital printing makes the manufacturing process easier and more cost-effective.

According to one embodiment of the present invention, a method is provided wherein the substrate is not moved between manufacturing stations between two or more deposition steps. As used herein, a manufacturing station is any location within a facility wherein material(s), (e.g., a PEM, bipolar plate, gas or fluid distribution substrate, or an electrocatalyst layer or fluid distribution layer thereon) are expected to undergo treatment and/or be combined with another substrate with the purpose of effecting the construction of an MEA.

Direct-write tools are also advantageous in that they are generally capable of depositing most or all materials necessary to create the various layers and components of the MEA. This enables the use of a single manufacturing step to deposit most or all of the materials required for the construction of the MEAs. As discussed above, a variety of materials are necessary to successfully fabricate an MEA. Direct-write tools are generally compatible with the necessary functional materials and thus can complete the deposition of such materials at a single manufacturing station. This increases the productivity of the manufacturing process by decreasing the amount of steps and manufacturing stations necessary to fabricate the MEA. Deposition at a single manufacturing station also increases the probability that the deposited materials will be located within tolerable proximities by eliminating errors in substrate alignment created from moving the substrate between stations. As used herein, the term "compatible" generally refers to the fact that the materials used during the deposition by the direct-write tool are capable of being deposited by the direct-write tool and the direct-write tool is generally inert to the materials.

The use of direct-write tools also facilitates better control over the construction of interfaces and layer compositions enabling the formation of tailored gradients in composition and enabling the formation of a layer surface morphology that facilitates chemical transport and electrochemical reactions as described above. The use of a direct-write tool facilitates the construction of features with combined functionalities such that multiple layers can now be combined into a single layer with multiple functionalities thereby providing benefits in both performance and energy density.

Direct-write tools are also advantageous in that it is possible to print gradient layers of material wherein the composition of the printed layer varies, as is discussed above. Direct-write tools are also advantageous in that they do not contact the surface on which the ink composition is deposited. It is therefore possible to form features and create device components on a non-planar surface, if required, for a specific application or product geometry.

Direct-write tools are also capable of depositing fine features, which makes them ideal for creating tailored layers within the MEA which maximize performance and minimize materials loading. The linear features deposited by the direct-write tool may be any size which will enable sufficient deposition of the requisite materials to create the desired transport, ohmic and kinetic properties within the MEA while minimizing materials loading within the MEA. Preferably, the linear features have an average width of from about 10 μm to about 1 millimeter. To enable the deposition of these fine features, the orifice from which the ink composition is ejected from the direct-write tool preferably has a diameter of less than about 300 μm.

Direct-write tools are also advantageous in that they do not require the substrate to be oriented horizontally to deposit the ink compositions. The substrates may be in a vertical or horizontal position or any position there between, in relation to the floor of the facility.

One preferred direct-write tool according to the present invention is an ink-jet device. Ink-jet devices operate by generating droplets of ink and directing the droplets toward a surface and can use particulate suspensions as a means for delivering controlled quantities of the functional materials to a variety of substrates. With ink-jet printing, the position of the ink-jet head is carefully controlled and can be highly automated so that discrete patterns of the ink can be applied to the surface. Ink-jet devices are capable of printing at a rate of 10,000 drops per second or higher and can print linear features with good resolution at a rate of 10 cm/sec or more, up to about 1000 cm/sec. Each drop generated by the ink-jet head includes approximately 2 to 200 picoliters of the liquid that is delivered to the surface. For these and other reasons, ink-jet devices are a highly desirable means for depositing the functional materials of the present invention onto a surface.

Typically, an ink-jet device includes at least one print head with one or more orifices having a diameter of less than about 100 μm, such as from about 50 μm to 75 μm. Many ink-jet devices include multiple print heads to increase the total deposition rate. Ink droplets are generated and are directed through the orifice toward the surface being printed. Ink-jet devices typically utilize a piezoelectric driven system to generate the droplets, although other variations are also used. Preferably, the inkjet heads are capable of recirculating the ink composition to help maintain the suspension of the ink composition. Ink-jet devices are described in more detail in, for example, U.S. Pat. No. 4,627,875 by Kobayashi et al. and U.S. Pat. No. 5,329,293 by Liker, each of which is incorporated herein by reference in their entirety. However, such devices have primarily been used to deposit inks of soluble dyes.

Ideally, the droplet generated by the print head is identical in composition to the bulk fluid. However, some filtration of the ink composition may occur if the particles are too large to pass through the channels or onboard filters. Preferably, the ink compositions include particles having a small particle size and a reduced number of aggregate particle agglomerates to reduce the amount of particles collected by the filter, and preferably allows the removal of the filter.

The ink-jet device should be capable of depositing an ink composition on a material with minimal line width. In one embodiment of the present invention, the line width of the deposited ink composition can be less than about 100 μm, such as less than 75 μm, such as less than 50 μm, such as less than about 25 μm and even less than about 10 μm.

In one embodiment of the present invention, an ink-jet device is used to deposit two or more ink compositions contemporaneously. The ink compositions may be contemporaneously deposited on a single side of a substrate or on opposing sides of a substrate. The deposition may comprise the use or one or more ink-jet devices. If a single ink-jet device is used, the ink-jet device preferably includes two or more print heads.

Figure 16:
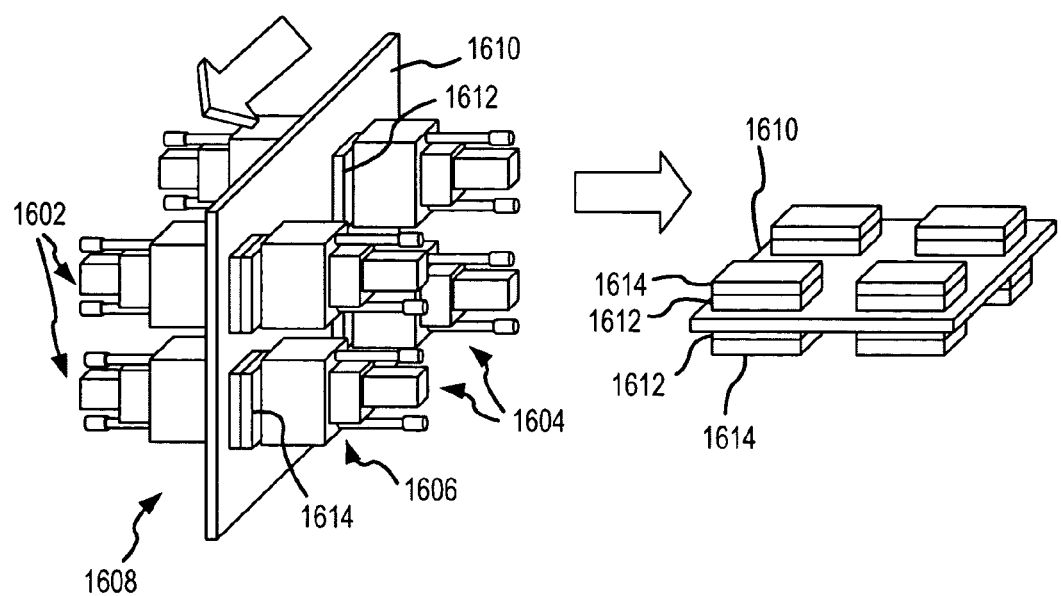
FIG. 16 illustrates an ink-jet device useful for the fabrication of MEAs in accordance with an embodiment of the present invention.

An ink-jet device for the deposition of ink compositions in accordance with one embodiment of the present invention is illustrated schematically in FIG. 16. Ink-jet devices 1602 and 1604 with corresponding ink-jet print heads 1606 and 1608 are used to deposit ink compositions on a substrate 1610 to create layers 1612 and 1614. In one embodiment of the present invention, the ink-jet devices contemporaneously deposit a first ink composition on both sides of a substrate to create layers on the opposed surfaces. The ink-jet devices can then contemporaneously deposit a second ink composition on the first layers to create second layers. Consequently, the MEA layers are produced rapidly due to the contemporaneous deposition and no movement between manufacturing stations. Moreover, the probability that the layers are aligned within tolerable proximities is increased by the contemporaneous deposition. In one embodiment, the deposition layers deposited by the ink-jet devices preferably include electrocatalyst layers, e.g., 1612 and fluid distribution layers, e.g., 1614.

The ink compositions according to the present invention can also be deposited by aerosol jet deposition. Aerosol jet deposition can enable the formation of features having a feature width of not greater than about 200 μm, such as not greater than 100 μm, not greater than 75 μm and even not greater than 50 μm. In aerosol jet deposition, the ink composition is aerosolized into droplets and the droplets are transported to the substrate in a flow gas through a flow channel. Typically, the flow channel is straight and relatively short.

The aerosol can be created using a number of atomization techniques. Examples include ultrasonic atomization, two-fluid spray head, pressure atomizing nozzles and the like. Ultrasonic atomization is preferred for compositions with low viscosities and low surface tension. Two-fluid and pressure atomizers are preferred for higher viscosity compositions. Solvent or other components can be added to the ink composition during atomization, if necessary, to keep the concentration of ink components substantially constant during atomization.

The size of the aerosol droplets can vary depending on the atomization technique. In one embodiment, the average droplet size is not greater than about 10 μm and more preferably is not greater than about 5 μm. Large droplets can be optionally removed from the aerosol, such as by the use of an impactor.

Low aerosol concentrations require large volumes of flow gas and can be detrimental to the deposition of fine features. The concentration of the aerosol can optionally be increased, such as by using a virtual impactor. The concentration of the aerosol can be greater than about $10^6$ droplets/$cm^3$ and more preferably is greater than $10^7$ droplets/$cm^3$. The concentration of the aerosol can be monitored and the information can be used to maintain the mist concentration within, for example, 10% of the desired mist concentration over a period of time.

The droplets are deposited onto the surface of the substrate by inertial impaction of larger droplets, electrostatic deposition of charged droplets, diffusional deposition of sub-micron droplets, interception onto non-planar surfaces and settling of droplets, such as those having a size in excess of about 10 μm.

Examples of tools and methods for the deposition of fluids using aerosol jet deposition include U.S. Pat. No. 6,251,488 by Miller et al., U.S. Pat. No. 5,725,672 by Schmitt et al. and U.S. Pat. No. 4,019,188 by Hochberg et al. Each of these U.S. Patents is incorporated herein by reference in their entirety.

Other direct-write deposition tools that are useful according to the present invention include those utilizing a print head having an array of electrostatic drop on demand ejectors. Such devices are available from the Tonejet Corporation Pty Ltd., Eastwood, Australia and are disclosed in U.S. Pat. No. 6,394,583 by Mace et al. and U.S. Pat. No. 6,409,313 Newcombe, each of which is incorporated herein by reference in its entirety. Another type of useful direct-write deposition tool is available from microdrop Gesellschaft fur Mikrodosiersysteme mbH, Norderstedt, Germany under the tradename MICRODROP. This device includes a dispensing head that consists of a glass capillary which is surrounded by a tubular piezo actuator. A nozzle having a diameter of from about 30 to 100 μm is disposed at an end of the capillary. An applied voltage pulse creates a pressure wave which propagates through the glass and into the liquid, causing a small liquid column to leave the nozzle and form a droplet having a volume of from about 30 to 500 picoliters.

As is discussed above, direct-write tools preferably use an ink composition to deposit the functional materials on the substrate. As used herein, an ink composition is flowable liquid useful in the direct-write tools of the present invention to deposit electrocatalyst, PCP, HPO, ELC materials or combinations thereof on the surface of a material. The ink composition can include particles (nanoparticles or micron-size particles) and other additives, as discussed below as well as a liquid vehicle. The ink composition is typically water-based, although other solvents or liquids may be used.

More specifically, ink compositions generally include water and an alcohol. Organic solvent based systems can also be used and ink-jet devices are often tailored for either organic or aqueous systems. Ink compositions can include other additives including, but not limited to, surfactants, dispersants, defoamers, chelating agents, humectants and the like. Surfactants are also used to maintain the particles in suspension. Co-solvents, also known as humectants, are used to prevent the ink from crusting and clogging the orifice of the ink-jet head. Biocides can also be added to prevent bacterial growth over time. Examples of such ink-jet liquid vehicle compositions are disclosed in U.S. Pat. No. 5,853,470. by Martin et al.; U.S. Pat. No. 5,679,724 by Sacripante et al.; U.S. Pat. No. 5,725,647 by Carlson et al.; U.S. Pat. No. 4,877,451 by Winnik et al.; U.S. Pat. No. 5,837,045 by Johnson et al.; and U.S. Pat. No. 5,837,041 by Bean et al.: Each of the foregoing U.S. patents is incorporated by reference herein in their entirety. The selection of such additives is based upon the desired properties of the composition. Particles can be mixed with the liquid vehicle using a mill or, for example, an ultrasonic processor or by other means of mixing particulates, reagents and liquid known to those skilled in the art.

The ink compositions according to the present invention have certain physical characteristics that are controlled to within certain ranges, such as surface tension, viscosity and solids loading, to enable the ink composition to be deposited with a direct-write tool. Preferably, the surface tension of the ink composition is not greater than about 50 dynes/cm, such as not greater than about 30 dynes/cm, and in one embodiment is from about 20 to 25 dynes/cm. The ink compositions of the present invention preferably have a viscosity of not greater than about 1000 centipoise, more preferably not greater than about 100 centipoise and even more preferably not greater than about 50 centipoise. For use in an ink-jet device, the viscosity of the ink composition is preferably not greater than about 30 centipoise and more preferably not greater than about 20 centipoise. The solids loading (e.g., electrocatalyst particles and PCP/HPO/ELC materials) either in particulate or soluble form in the ink composition can be as high as possible without adversely affecting the viscosity or other desirable properties of the ink. The ink composition can have a particle loading of up to about 75 weight percent, such as from about 5 to about 50. weight percent. The ink is preferably capable of being printed on any substrate used in an MEA, including a PEM, fluid distribution substrates of the cloth or paper type and bipolar plates.

The particles can be electrocatalyst particles, including multi-component particles, PCP, HPO, ELC, and combinations thereof, as described above. However, the particles may also be a metal powder such as silver (Ag) and nickel (Ni), useful when depositing a layer on the bipolar plates. Preferably, the ink composition includes the particles necessary to impart the desired kinetic, ohmic and transport properties to the substrate. Any combination of the foregoing particles may be used in an ink composition to fabricate the MEA so long as the ink composition retains the requisite viscosity, surface tension and solids loading necessary to enable its use in a direct-write tool. For example, the ink composition can include electrocatalyst particles as the only functional material. Alternatively, the ink composition can include EC-PCP-HPO particles and a ELC powder. The ink composition can include electrocatalyst particles, EC-PCP particles, EC-PCP-HPO particles and EC-PCP-HPO-ELC particles. It should be appreciated that these examples illustrative only a few of the possible combinations and are not meant to limit the present invention in any manner.

Particles useful in the ink composition may be any size so long as the ink composition retains the requisite viscosity, surface tension and solids loading characteristics to enable it to be deposited using a direct-write tool. Preferably, the particles are nanoparticles or micron-sized particles. Nanoparticles have an average size of not greater than about 100 nanometers, such as from about 1 to 50 nanometers. In one embodiment, the nanoparticles have an average size of from about 10 to 80 nanometers and preferably from about 25 to 75 nanometers. Micron-size particles have an average particle size of greater than about 0.1 µm. The nanoparticles and micron-sized particles are preferably spherical, such as those produced by spray processing. Particles in the form of flakes increase the viscosity of the precursor composition and are not amenable to deposition using tools having a restricted orifice size, such as direct-write tool. Typical ink-jet print heads have channels on 80 µm in diameter or less and the particulates in ink-jet ink compositions are preferably an order of magnitude less than the channel diameter. To deposit the ink compositions using an ink-jet device, the d90 particle size is preferably less than 10 µm, more preferably is less than 5 µm and most preferably is less than 3 µm. Therefore, to achieve particle size reduction and/or de-agglomeration of the particles, milling or other suitable techniques may be necessary. One method to decrease the particle size of the original electrocatalyst powder is to mill the powder, such as by wet-milling the powder.

According to one embodiment of the present invention, the ink composition can include low temperature precursors, such as a molecular metal precursor that has a relatively low decomposition temperature. As used herein, the term molecular metal precursor refers to a molecular compound that includes a metal atom. Examples include organometallics (molecules with carbon-metal bonds), metal organics (molecules containing organic ligands with metal bonds to other types of elements such as oxygen, nitrogen or sulfur) and inorganic compounds such as metal nitrates, metal halides and other metal salts.

Particularly preferred molecular metal precursors include precursors to silver (Ag), nickel (Ni), platinum (Pt), ruthenium (Ru), cobalt (Co), iron (Fe), rhodium (Rh), gold (Au), palladium (Pd), copper (Cu), indium (In) and tin (Sn). Other molecular metal precursors can include precursors to aluminum (Al), zinc (Zn), iron (Fe), tungsten (W), molybdenum (Mo), lead (Pb), bismuth (Bi) and similar metals. The molecular metal precursors can be either soluble or insoluble in the ink composition.

In general, molecular metal precursor compounds that eliminate ligands by a radical mechanism upon conversion to metal are preferred, especially if the species formed are stable radicals and therefore lower the decomposition temperature of that precursor compound.

Furthermore, molecular metal precursors containing ligands that eliminate cleanly upon precursor conversion and escape completely from the substrate (or the formed functional structure) are preferred because they are not susceptible to carbon contamination or contamination by anionic species such as nitrates. Therefore, preferred precursors for metals used for conductors are carboxylates, alkoxides or combinations thereof that convert to metals, metal oxides or mixed metal oxides by eliminating small molecules such as carboxylic acid anhydrides, ethers or esters. Metal carboxylates, particularly halogenocarboxylates such as fluorocarboxylates, are particularly preferred metal precursors due to their high solubility.

Particularly preferred molecular metal precursor compounds are metal precursor compounds containing silver, nickel, platinum, gold, palladium, copper and ruthenium. In one preferred embodiment of the present invention, the molecular metal precursor compound comprises platinum.

Various molecular precursors can be used for platinum metal. Preferred molecular precursors for platinum include nitrates, carboxylates, beta-diketonates, and compounds containing metal-carbon bonds. Divalent platinum(II) complexes are particularly preferred. Preferred molecular precursors also include ammonium salts of platinates such as ammonium hexachloro platinate $(NH_4)_2PtCl_6$, and ammonium tetrachloro platinate $(NH_4)_2PtCl_4$; sodium and potassium salts of halogeno, pseudohalogeno or nitrito platinates such as potassium hexachloro platinate $K_2PtCl_6$, sodium tetrachloro platinate $Na_2PtCl_4$, potassium hexabromo platinate $K_2PtBr_6$, potassium tetranitrito platinate $K_2Pt(NO_2)_4$; dihydrogen salts of hydroxo or halogeno platinates such as hexachloro platinic acid $H_2PtCl_6$, hexabromo platinic acid $H_2PtBr_6$, dihydrogen hexahydroxo platinate $H_2Pt(OH)_6$; diammine and tetraammine platinum compounds such as diammine platinum chloride $Pt(NH_3)_2Cl_2$, tetraammine platinum chloride $[Pt(NH_3)_4]Cl_2$, tetraammine platinum hydroxide $[Pt(NH_3)_4](OH)_2$, tetraammine platinum nitrite $[Pt(NH_3)_4](NO_2)_2$, tetrammine platinum nitrate $Pt(NH_3)_4(NO_3)_2$, tetrammine platinum bicarbonate $[Pt(NH_3)_4](HCO_3)_2$, tetraammine platinum tetrachloroplatinate $[Pt(NH_3)_4]PtCl_4$; platinum diketonates such as platinum (II) 2,4-pentanedionate $Pt(C_5H_7O_2)_2$; platinum nitrates such as dihydrogen hexahydroxo platinate $H_2Pt(OH)_6$ acidified with nitric acid; other platinum salts such as Pt-sulfite and Pt-oxalate; and platinum salts comprising other N-donor ligands such as $[Pt(CN)_6]^{4+}$.

Platinum precursors useful in organic-based ink compositions include Pt-carboxylates or mixed carboxylates. Examples of carboxylates include Pt-formate, Pt-acetate, Pt-propionate, Pt-benzoate, Pt-stearate, Pt-neodecanoate. Other precursors useful in organic ink composition include aminoorgano platinum compounds including Pt(diaminopropane)(ethylhexanoate). Preferred combinations of platinum precursors and solvents include: $PtCl_4$ in $H_2O$; Pt-nitrate solution from $H_2Pt(OH)_6$; $H_2Pt(OH)_6$ in $H_2O$; $H_2PtCl_6$ in $H_2O$; and $[Pt(NH_3)_4](NO_3)_2$ in $H_2O$.

The molecular metal precursor can form essentially the same component as the particles in the ink composition. In such a case, the particles in the liquid vehicle can advantageously catalyze the molecular precursor to form the desired compound. The addition of precursors with decomposition temperatures below about 300° C. allows the formation of functional features on a polymeric substrate, including polyamide, fluoro-polymers (e.g., a PEM), epoxy laminates and other substrates. This enables the liquid vehicle, a precursor to a metal and a polymer material, such as a PCP, HPO and precursors thereof, to be processed at low temperatures to form the desired structure. In one embodiment, the conversion temperature is not greater than about 250° C., such as not greater than about 225° C., more preferably is not greater than about 200° C. and even more preferably is not greater than about 185° C. In certain embodiments, the conversion temperature can be not greater than about 150° C., such as not greater than about 125° C. and even not greater than about 100° C. The conversion temperature is the temperature at which the metal species contained in the molecular metal precursor compound is at least 95 percent converted to the pure metal. As used herein, the conversion temperature is measured using a thermogravimetric analysis (TGA) technique wherein a 50-milligram sample of the precursor composition is heated at a rate of 10° C./minute in air and the weight loss is measured.

Particularly preferred molecular precursors and other additives which are useful in the ink compositions of the present invention are disclosed in commonly-owned U.S. patent application Ser. No. 10/265,351.

The liquid vehicle is a flowable medium that facilitates the deposition of the particles. In cases where the liquid serves only to carry particles and not to dissolve molecular species, the terminology of vehicle is often used for the liquid. However, in compositions including a molecular metal precursor, discussed above, a solvent can also be considered the vehicle.

The liquid vehicle can also include carriers to hold particles together once the ink composition is deposited. Further, the liquid vehicle can also include a molecular species that can react with the dispersed particles to modify the properties of the particles. The ink compositions can also preferably contain carbon particles where the active species phase is dispersed across the surface of the carbon particles while the carbon particles provide a conductive backbone for the electrode layer.

The liquid vehicle may include a solvent capable of solubilizing a molecular metal precursor. The solvent can be water thereby forming an aqueous-based precursor composition. Water is more environmentally acceptable than organic solvents. However, water cannot typically be used for deposition of the precursor composition onto hydrophobic substrates, such as a PEM, without modification of the substrate or the aqueous composition.

The liquid vehicle may be an organic solvent, by itself or in addition to water. The selected solvent should be capable of solubilizing the selected molecular metal precursor to a high level. A low solubility of the molecular metal precursor in the solvent leads to low yields of the deposited material. Preferably, the ink composition combines solvents and precursors which advantageously provide high solubility of the molecular precursor while still allowing low temperature conversion of the precursor to the metal.

The solubility of the molecular metal precursor in the solvent is preferably at least about 5 weight percent metal precursor, more preferably at least 30 weight percent metal precursor, even more preferably at least about 50 weight percent metal precursor and most preferably at least about 60 weight percent metal precursor. Such high levels of metal precursor lead to increased metal yield and the ability to deposit features having adequate thickness.

The solvents can be polar or non-polar. Solvents useful in the ink composition of the present invention including molecular metal precursors include amines, amides, alcohols, water, ketones, unsaturated hydrocarbons, saturated hydrocarbons, mineral acids organic acids and bases, Preferred solvents include alcohols, amines, amides, water, ketone, ether, aldehydes and alkenes. Particularly preferred organic solvents according to the present invention include N,N,-dimethylacetamide (DMAc), diethyleneglycol butylether (DEGBE), ethanolamine, ethylene glycol, acetone, and N-methyl pyrrolidone.

In some cases, the solvent can be a high melting point solvent, such as one having a melting point of at least about 30° C. and not greater than about 100° C. In this embodiment, a heated direct-write tool such as a heated inkjet head can be used to deposit the precursor composition while in a flowable state whereby the solvent solidifies upon contacting the substrate. Subsequent processing can then remove the solvent by other means and then convert the material to the final product, thereby retaining resolution. Preferred solvents according to this embodiment are waxes, high molecular weight fatty acids, alcohols, acetone, N-methyl-2-pyrrolidone, toluene, tetrahydrofuran and the like. Alternatively, the precursor composition may be a liquid at room temperature, wherein the substrate is kept at a lower temperature below the freezing point of the composition.

The solvent can also be a low melting point solvent. A low melting point is required when the precursor composition must remain as a liquid on the substrate until dried. A preferred low melting point solvent according to this embodiment is DMAc, which has a melting point of about –20° C.

In, addition, the solvent can be a low vapor pressure solvent. A lower vapor pressure advantageously prolongs the work life of the ink composition in cases where evaporation in the ink-jet head, syringe or other tool leads to problems such as clogging. A preferred solvent according to this embodiment is terpineol. Other low vapor pressure solvents include diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows rapid removal of the solvent by drying. High vapor pressure solvents include acetone, tetrahydrofuran, toluene, xylene, ethanol, methanol, 2-butanone and water.

Examples of preferred vehicles are listed in Table 2. Particularly preferred vehicles for use with molecular metal precursors include alpha terpineol, toluene and ethylene glycol.

TABLE 2

Organic Vehicles Useful in Precursor Compositions

| Formula/Class | Name |
| --- | --- |
| Alcohols | 2-Octanol |
|  | Benzyl alcohol |
|  | 4-hydroxy-3methoxy benzaldehyde |
|  | Isodeconol |
|  | Butylcarbitol |
| Terpene alcohol | Alpha-terpineol |
|  | Beta-terpineol |
|  | Cineol |
| Esters | 2,2,4 trimethylpentanediol-1,3 monoisobutyrate |
|  | Butyl carbitol acetate |
|  | Butyl oxalate |
|  | Dibutyl phthalate |
|  | Dibutyl benzoate |
|  | Butyl cellosolve acetate |
|  | Ethylene glycol diacetate |
|  | Ethylene glycol diacetate |
|  | N-methyl-2-pyrrolidone |
| Amides | N,N-dimethyl formamide |
|  | N,N-dimethyl acetamide |
| Aromatics | Xylenes |
|  | Aromasol |
| Substituted aromatics | Nitrobenzene |
|  | o-nitrotoluene |
| Terpenes | Alpha-pinene, beta-pinene, dipentene, dipentene oxide |
| Essential Oils | Rosemary, lavender, fennel, sassafras, wintergreen, anise oils, camphor, turpentine |

Other additives can be included in the ink compositions that include molecular metal precursors in accordance with the present invention. Among these are reducing agents to lower the decomposition temperature of the precursors and/or prevent the undesirable oxidation of metal species. Reducing agents are materials that are oxidized, thereby causing the reduction of another substance. The reducing agent loses one or more electrons and is referred to as having been oxidized. Reducing agents are particularly applicable when using molecular metal precursor compounds where the ligand is not reducing by itself. Examples of reducing agents include amino alcohols. Alternatively, the precursor conversion process can take place under reducing atmosphere, such as hydrogen or forming gas.

In some cases, the addition of a reducing agent results in the formation of the metal even under ambient conditions. The reducing agent can be part of the precursor itself, for example in the case of certain ligands. An example is Cu-formate where the precursor forms copper metal even in ambient air at low temperatures. In addition, the Cu-formate precursor is highly soluble in water, results in a relatively high metallic yield and forms only gaseous byproducts, which are reducing in nature and protect the in-situ formed copper from oxidation. Copper formate is therefore a preferred copper precursor for aqueous based precursor compositions. Other examples of molecular metal precursors containing a ligand that is a reducing agent are Ni-acetylacetonate and Ni-formate.

The ink compositions including a molecular metal precursor can also include crystallization inhibitors and a preferred crystallization inhibitor is lactic acid. Such inhibitors reduce the formation of large crystallites directly from the molecular metal precursor. Other crystallization inhibitors include ethylcellulose and polymers such as styrene allyl alcohol (SAA) and polyvinyl pirolydone (PVP). Other compounds useful for reducing crystallization are other polyalcohols such as malto dextrin, sodium carboxymethylcellulose and TRITON X100. In general, solvents with a higher melting point and lower vapor pressure inhibit crystallization of any given compound more than a lower melting point solvent with a higher vapor pressure. Preferably, not greater than about 10 weight percent crystallization inhibitor as a percentage of the total composition is added, preferably not greater than 5 weight percent and more preferably not greater than 2 weight percent.

The ink compositions can also include an adhesion promoter adapted to improve the adhesion of the layer to the underlying substrate. For example, polyamic acid can improve the adhesion of the composition to a polymer substrate. In addition, the ink compositions can include rheology modifiers. As an example, styrene allyl alcohol (SAA) can be added to the ink composition to reduce spreading on the substrate.

The ink compositions including a molecular metal precursor can also include complexing agents. Complexing agents are a molecule or species that binds to a metal atom and isolates the metal atom from solution. Complexing agents are adapted to increase the solubility of the molecular precursors, in the solvent, resulting in a higher yield of metal. One preferred complexing agent, particularly for use with Cu-formate and Ni-formate, is 3-amino-1-proponal. For example, a preferred precursor composition for the formation of copper includes Cu-formate dissolved in water and 3-amino-1-propanol.

The ink compositions can also include rheology modifiers. Rheology modifiers can include SOLTHIX 250 (Avecia Limited), SOLSPERSE 21000 (Avecia Limited), styrene allyl alcohol (SAA), ethyl cellulose, carboxy methylcellulose, nitrocellulose, polyalkylene carbonates, ethyl nitrocellulose, and the like. These additives can reduce spreading, of the precursor composition after deposition, as is discussed in more detail below.

Accordingly, a catalyst layer can be fabricated by depositing an ink composition onto a substrate, where the ink includes a liquid vehicle, a particulate support phase such as carbon or a metal oxide and a molecular precursor to an active species phase, such as platinum metal. The ink composition can then be heated at a low temperature to convert the molecular precursor to the active species, which will be dispersed on the support phase. In one embodiment, the ink composition includes from about 0.1 to about 5 weight percent of a particulate support phase. Other additives and the MEA functional materials can be included in the ink composition. The in-situ formation of the catalyst at low temperatures enables the catalyst to be deposited and formed on a variety of substrates, including polymer membranes.

Figure 17:
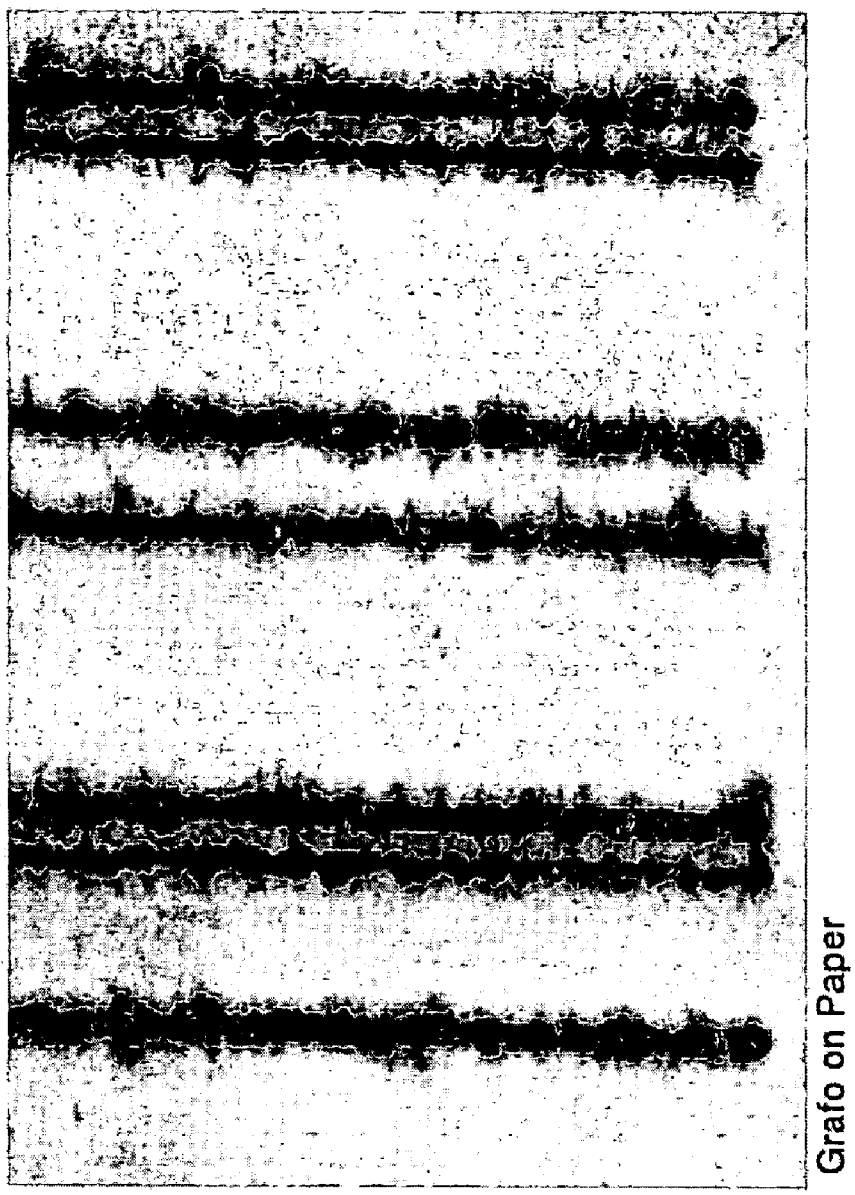
FIG. 17 illustrates a carbon containing ink composition printed on a paper substrate according to an embodiment of the present invention.

Ink compositions that do not include an electrocatalyst or electrocatalyst precursor can contain any of the other functional materials discussed above. An example of conductive carbon (ECL) containing ink composition that has been deposited onto a paper substrate using an ink-jet device is illustrated in FIG. 17.

Preferably, the ink compositions can be confined on the substrate after deposition, thereby enabling the formation of features having a small minimum feature size, the minimum feature size being the smallest dimension in the x-y axis, such as the width of an electrocatalyst layer. If desired, the ink composition can be confined to regions having a width of not greater than 100 µm, preferably not greater than 75 µm, more preferably not greater than 50 µm, even more preferably not greater than 25 µm, and even more preferably not greater than 10 µm, such as not greater than about 5 µm. Small amounts of rheology modifiers such as styrene allyl alcohol (SAA) and other polymers can be added to the ink composition to reduce spreading. The spreading can also be controlled through the use of combinations of nanoparticles and molecular precursors. Spreading can also be controlled by rapidly drying the compositions during printing, such as by irradiating the composition during deposition.

Spreading can also be controlled by the addition of a low decomposition temperature polymer in monomer form. The monomer can be cured during deposition by thermal or ultraviolet means, providing a network structure to maintain feature shape. The polymer can then be either retained or removed during subsequent processing.

A preferred method is to pattern an otherwise non-wetting substrate with wetting enhancement agents that control the spreading and also yield increased adhesion. For example, this can be achieved by functionalizing the substrate surface with hydroxide or carboxylate groups.

In one embodiment of the present invention, an ink composition is applied using a direct-write tool to an unpatterned substrate. Unpatterned refers to the fact that the surface energy (tension) of the substrate has not been intentionally patterned for the sole purpose of confining the ink composition. For substrates with surface tensions of less than about 30 dynes/cm, a hydrophilic ink composition can be based on water, glycerol, glycol, and other solvents or liquids having surface tensions of greater than 30 dynes/cm, more preferably greater than 40 dynes/cm and preferably greater than 50 dynes/cm and even greater than 60 dynes/cm. For substrates with surface tensions of less than 40 dynes/cm, the ink composition should have surface tensions of greater than 40 dynes/cm, preferably greater than 50 dynes/cm and even more preferably greater than 60 dynes/cm. For substrates with surface tensions less than 50 dynes/cm, the surface tension of the ink composition should be greater than 50 dynes/cm, preferably greater than 60 dynes/cm. Alternatively, the surface tension of the composition can be chosen to be 5, 10, 15, 20, or 25 dynes/cm greater than that of the substrate. Continuous ink jet heads often require surface tensions of from 40 to 50 dynes/cm. Bubble-jet ink jet heads often require surface tensions of from 35 to 45 dynes/cm.

In another embodiment, a precursor composition is applied using a direct-write tool to an unpatterned low surface energy (hydrophobic) surface that has been surface modified to provide a high surface energy (hydrophilic). The surface energy can be increased by hydroxylating the surface by various means known to those skilled in the art including exposing to oxidizing agents and water, heating in moist air and the like. The surface tension of the ink composition can then be chosen to be 5, 10, 15, 20, or 25 dynes/cm less than that of the substrate. Piezo-jet ink jet heads operating with hot wax often require surface tensions of 25 to 30 dynes/cm. Piezo-jet ink jet heads operating with UV curable inks often require surface tensions of 25 to 30 dynes/cm. Bubble-jet ink jet heads operating with ultraviolet (UV) curable inks often require surface tensions of 20 to 30 dynes/cm. Surface tensions of roughly 20 to 30 dynes/cm are required for piezo-based ink jet heads using solvents.

In another embodiment of the present invention, a seed layer of a material may be deposited as a catalyst template to define a pattern from which a material layer is subsequently deposited. As an example, a direct-write tool can be used to deposit an ink composition containing a Pt precursor in a specific pattern on the substrate surface where a very small amount of the Pt precursor is deposited corresponding to between one and several monolayers of Pt in that region. Subsequent processing of the dried Pt precursor to form Pt results in very small crystallites. Subsequent exposure of that surface to reagents that can selectively react on the surface of the Pt crystallites results in selective reaction only in the area where the Pt seed layer was deposited. Examples of methods by which the selective deposition can take place are both solution and gas phase processes including electroless deposition, selective chemical reactions and redox reactions from solution and chemical vapor deposition (CVD) from the gas phase. A direct-write tool as described above can be used to deposit the seed layer.

Figure 18:
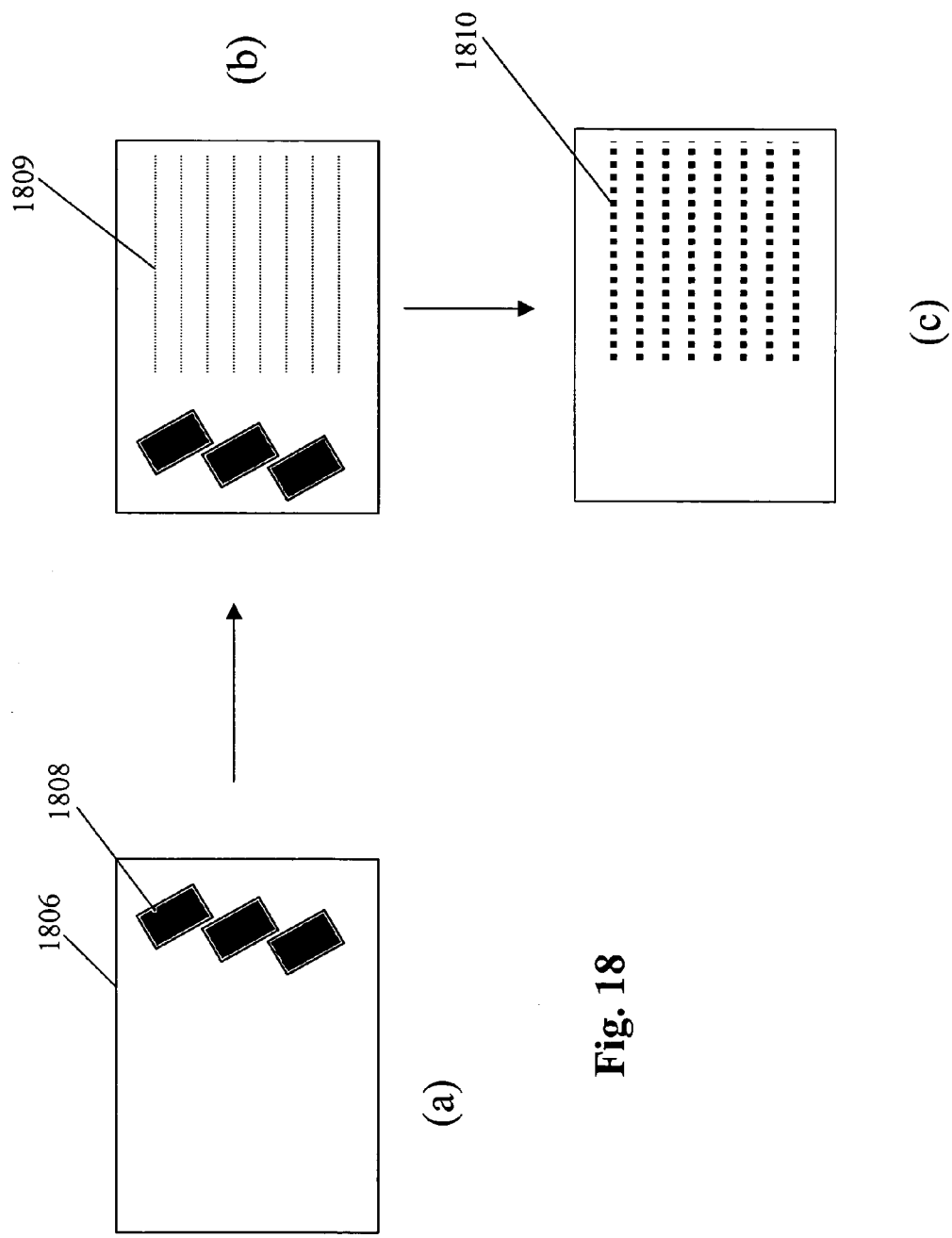
FIG. 18 illustrates a schematic view of an embodiment of the present invention for manufacturing an MEA using a seeding material and multiple direct-write tool deposition heads.

A schematic diagram illustrating this process is shown in FIGS. 18a to 18c. In FIG. 18a, a plurality of direct write deposition heads 1808 are combined to provide the capability to coat a large area of the surface of substrate 1806. The direct write tool is operated in a way that delivers a small amount of the material, the seed particles, 1809 to be delivered over a predetermined part of the substrate as illustrated in FIG. 18b. FIG. 18c shows the substrate after the seed particles 1809 have been used as a template to grow the second material 1810.

Examples of the seed materials include metals, metal alloys, metal oxides, metal-metal mixtures or metal-metal oxide mixtures. Metals that are particularly useful as seed layers are transition metals and precious metals including platinum, palladium, rhodium, nickel, copper, gold and zinc. Metal alloys that can be used include alloys between the precious metals, alloys between the transition metals, alloys between the main group elements, as well as alloys between these categories. Examples of preferred alloys or mixtures are PtSn, PdSn, RhSn, NiSn, PtCo, PtNi, PtCoNi, PdZn, PtRu and PdCaO. Seed materials can also contain preformed sols of nanoparticles including carbon particles, metal particles, metal oxide particles or combinations thereof. Materials that can be grown from the seed layer preferably include metal or metal oxide catalyst compositions such as Pt, PtNi or PtRu.

In another embodiment of the present invention, a direct-write tool can be used to deliver solutions containing volatile precursors to a desired region on the surface such that chemical vapor deposition (CVD) occurs between the direct-write tool orifice and the substrate. Direct-write tools that can be used include ink-jet printing devices as well as spray systems. The ink composition include volatile reagents specifically chosen as precursors for the chemical vapor deposition of a target material, such as $Pt(acac)_2$ as a precursor for the deposition of Pt, but can also contain involatile materials that deposit simultaneously without evaporation. Involatile materials can include carbon and various polymers such as PCPs and HPOs described above.

The volatile reagents may be thermally reacted to produce the desired phase or may be reacted with another chemical reagent to lower the temperature at which the transformation occurs to the desired product. Typical chemical reagents include reducing agents such as hydrogen, or other metal hydrides such as boron or silicon hydrides or other reducing agents as described above such as alcohols or formaldehyde. Aerosol-assisted chemical vapor deposition (AACVD) has been used previously to transport volatile reagents to a surface and perform chemical vapor deposition at a heated substrate. A novel aspect of this embodiment of the present invention is the use of a direct-write tool to generate the droplets in very close proximity of the desired surface such that the geometric area of the deposited material is defined by the spatial location of the droplet generation system (such as the ink-jet print head).

In a further aspect of this embodiment of present invention, the volatile reagent may only be partially evaporated and delivered to the substrate surface where it reacts to form the final product. In the case of the deposition of a metal, the deposited metal may further act as a catalyst for the reaction of the volatile reagent to form the desired metal.

Figure 20:
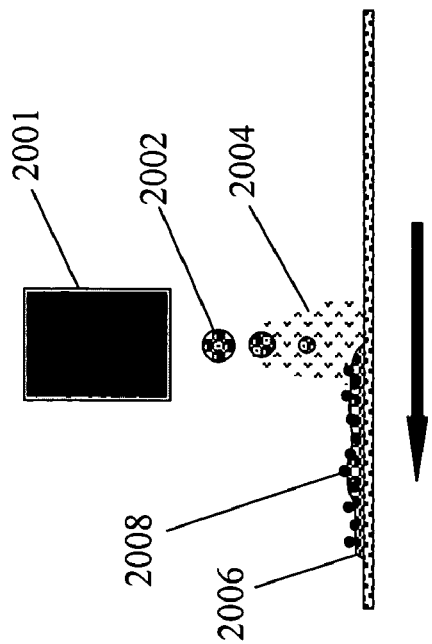
FIG. 20 illustrates a cross-sectional view of an MEA layer manufactured in accordance with an embodiment of the present invention using an aerosol including a volatile reagent and a suspended or dissolved material.
Figure 19:
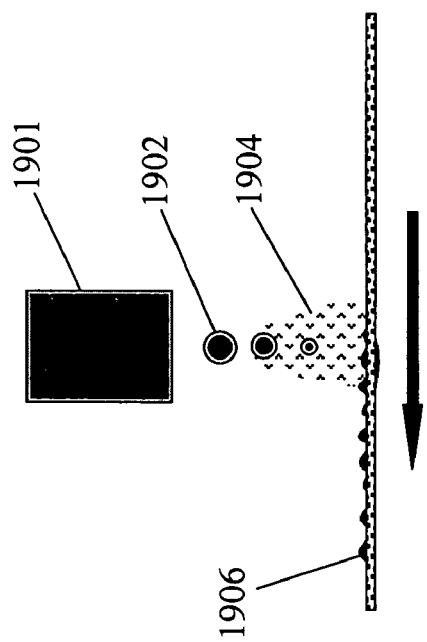
FIG. 19 illustrates a cross-sectional view of an MEA layer manufactured in accordance with an embodiment of the present invention using an aerosol including a volatile reagent.

A schematic diagram illustrating this embodiment of the present invention is shown in FIGS. 19 and 20. As illustrated in FIG. 19, the direct write tool 1901 produces droplets 1902 which are directed at the moving substrate surface. The droplets 1902 contain at least one volatile reagent. As the droplets 1902 move towards the substrate surface at least a portion of the volatile reagent evaporates into the gas phase to form a molecular species 1904, which reacts on the substrate surface to form a deposit 1906. As a specific example, the volatile species may be a volatile Pt compound such as $Pt(acac)_2$ which is soluble in toluene and reacts on the substrate surface either thermally or in the presence of a reducing agent to form a Pt deposit. As a further embodiment of this embodiment of the invention, the ink composition can contain a volatile reagent and other involatile materials that may either be dissolved or suspended in the ink. As illustrated in FIG. 20, the direct-write tool 2001 produces droplets 2002 which are directed at the moving substrate surface. The droplets contain at least one volatile reagent and either a dissolved or suspended material such as carbon or an organic polymer. As the droplets move towards the substrate surface at least a portion of the volatile reagent evaporates into the gas phase to form molecular species 2004, which reacts on the substrate surface to form a deposit. The deposited material is now comprised of the involatile material 2006 that was either dissolved or suspended in the ink composition with the product of conversion of the volatile reagent deposited within the pore structure of the involatile material. As a specific example, the volatile species may be a volatile Pt compound such as $Pt(acac)_2$ which is soluble, in toluene and reacts on the substrate surface either thermally or in the presence of a reducing agent to for a Pt deposit. The involatile material could be carbon which is suspended in the ink, or it could be a polymer such as NAFION or TEFLON. Other metal-containing compounds may be used to deposit other metals via chemical vapor deposition. Examples of suitable volatile reagents are disclosed in "The Chemistry of Metal CVD" by Kodas and Hampden-Smith and are incorporated by reference therein.

As used herein, deposition patterns are the geometric patterns created by depositing an ink composition on a substrate using a direct-write tool. These deposition patterns may simply comprise lines of varying length and curvature. These patterns may also ultimately comprise one or more polygonal shapes. These shapes may be filled or unfilled with the deposited materials. The shape and form of these patterns are determined by the ink composition, the direct write tool and the spreading characteristics of the ink on the substrate surface. Examples of the patterns that are desirable as part of this invention are represented schematically in FIGS. 10 to 12.

In a particularly preferred embodiment, the deposition patterns have a circular, square or rectangular shape and the shapes are filled. In this embodiment, the deposition patterns may form a pattern similar to that of a checkerboard. Preferably, the length of one dimension of the patterns ranges from about 50 μm to several centimeters. Preferably, the ratio of the geometric surface area of a singe square or rectangular deposition pattern to the geometric surface area of the substrate is from about 1 to about 1000. As used herein, the length of one dimension and geometric surface area of the deposition pattern are both measured on a single face of the shape, where the face is parallel to the major plane of the substrate. As used herein, the geometric surface area of the substrate is measured on the face of the major plane of the substrate.

In another embodiment, the ratio of the perimeter of a single square or rectangular deposition pattern to the perimeter of the substrate is from about 0.0001 to about 0.1. Preferably, the ratio of the geometric surface area of a singe square or rectangular deposition pattern to the geometric surface area of the substrate is from about $10^{-8}$ to about $10^{-2}$. As used herein, the perimeter and geometric surface area of the deposition pattern are both measured on a single face of the shape, where the face is parallel to the major plane of the substrate. As used herein, the geometric surface area of the substrate is measured on the face of the major plane of the substrate.

The deposition patterns are used to create the shape of the electrocatalyst layers, fluid distribution layers and other layers within the MEA. Ideally, the amount of materials used to create the layers is minimized by selectively depositing the materials only where needed in the MEA. As a result, the volume of the electrocatalyst and other layers is minimized resulting in reduced material and capital costs. As catalyst materials are generally the most expensive materials used in the fabrication of the MEA, it is important to minimize the amount of catalyst loading within the MEA. One way to measure and report the amount of catalyst loading within the MEA is the ratio of mass of catalyst to geometric surface area of the MEA. Preferably, the ratio of mass of catalyst in the MEA to geometric surface area of the MEA is from about 0.05 mg catalyst/cm² to about 20 mg catalyst/cm².

Another way to measure catalyst loading is the ratio of the area of the PEM covered by the electrocatalyst material to the ratio of the PEM not covered by electrocatalyst material. This is best indicated by comparing the area of the electrocatalyst layer in contact with the PEM to the total area of the PEM. As used herein, the "covered area" is the area of a face of the polygon created by a deposition pattern comprising electrocatalyst, wherein the face is parallel to the major plane of the PEM. As used herein, the "total covered area" is the sum of all covered areas. As used herein, the "total substrate area" is the area of a face of the PEM that is parallel to the major plane of the PEM. The "total uncovered area" is the total substrate area minus the total covered area. Preferably, the total uncovered area is at least 20% and more preferably at least 50% when expressed as a percentage of the total. If the loading of the electrocatalyst on the covered area is 1 mg catalyst/cm² and the uncovered area is 50% of the total, then the total loading becomes 0.5 mg catalyst/cm².

In accordance with the present invention, the direct-write tool can deposit an ink composition directly on a substrate useful in an MEA, such as a PEM, a gas diffusion layer or fluid distribution substrate. Alternatively, the manufacturing process can include the use of decalcomania. Decalcomania is generally defined as a process for transferring designs printed on a specially prepared substrate such as paper (a transfer substrate) to materials such as glass or metal. According to one embodiment of the present invention, a direct-write tool deposits an ink composition in a deposition pattern on a transfer substrate. The transfer substrate is then contacted by a second substrate, such as a PEM, fluid distribution substrate, fluid distribution layer or bi-polar plate. The transferring substrate and the second substrate are then sandwiched together and pressed in a heated environment. The heat cures the ink composition to the second substrate thereby releasing it from the transferring substrate and depositing it on the second substrate. The transferring substrate is then removed by peeling it from the deposited ink layer. The second substrate can then be used in conjunction with other processes, e.g., lamination, supplementary decalcomania processes or deposition using a direct-write tool, to further fabricate the MEA. A variety of other deposition techniques can be used in conjunction with direct write and decal transfer including spray, roll techniques, slot die, curtain coating, and pen as well as combinations for direct write techniques.

According to the present invention, one of the benefits of the combination of direct write deposition and the decal transfer process is that the transfer substrate onto which the deposit is written can have characteristics that the target substrate does not possess. For example, the transfer substrate can be chosen to have a tolerance to higher temperatures compared to the target substrate. The transfer substrate can have wetting characteristics that enable the definition of a pattern or a particular gradient structure that is not possible or is economically disadvantageous on the target substrate.

The use of decalcomania for the fabrication of an MEA is illustrated in U.S. Pat. No. 5,211,984 by Wilson which is incorporated herein by reference in its entirety.

According to one embodiment of the present invention, a method for producing an MEA subassembly is provided. As used herein, a subassembly is any portion of the MEA that includes two or more components (e.g., layers), such as an electrocatalyst layer disposed on a PEM. Subassemblies can then be further processed to form a completed MEA. According to one aspect of the present embodiment, a direct-write tool is used to deposit an ink composition on a substrate to create an MEA subassembly. The direct-write tool is preferably an ink-jet device. The ink-composition may be any ink composition which includes the materials necessary to achieve the desired ohmic, kinetic and transport characteristics. The substrate is generally either a PEM, fluid distribution substrate, gas diffusion layer, bi-polar plate, or a transfer substrate, but may be any material which is desirable to use in an MEA.

One preferred subassembly that can be manufactured in accordance with this embodiment of the present invention is a coated membrane subassembly. The method includes depositing one or more ink compositions on a PEM using a direct write-tool. In this method, a first ink composition including electrocatalyst or electrocatalyst precursor and PCP at predetermined concentrations is deposited on at least a portion of a PEM using a direct-write tool to create an electrocatalyst layer. A second ink composition comprising electrocatalyst or electrocatalyst precursor and PCP material each at a different concentration than the first ink composition is deposited on at least a portion of the electrocatalyst layer using a direct-write tool to create a gradient in the composition. Immediately after the layer is deposited, the layer can be passed through a drying region which can be adjusted to completely remove the liquid from the layer at one extreme, or leave the liquid intact to enhance diffusion between the layers at the other extreme.

Figure 21:
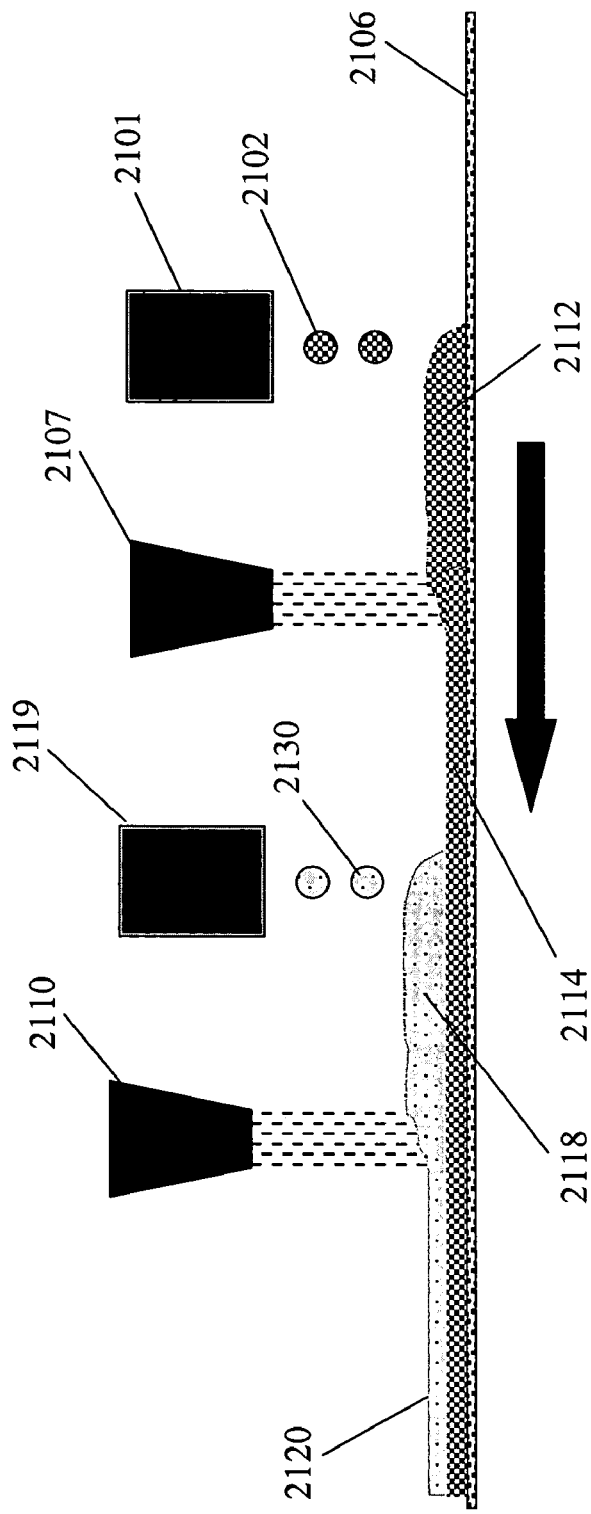
FIG. 21 illustrates a cross-sectional view of MEA layers manufactured in accordance with the present invention using multiple direct-write deposition heads.

FIG. 21 illustrates a schematic view of the above embodiment employing a direct-write tool comprising multiple direct-write printing heads. The deposition system comprises multiple direct write printing heads combined with multiple processing/curing steps. In one embodiment a gradient composition layer can be deposited as follows. Direct-write head 2101 delivers an ink with a first formulation 2102 to a substrate 2106. The deposited layer 2112 is wet and is processed 2107 by a number of possible different methods. The process 2107 may dry the ink by heating to a temperature that removes the solvent; or heating to a higher temperature that induces a chemical reactions such as thermal reaction of a Pt precursor to form Pt metal; or it can deliver a chemical reagent to react further with one or more components in the deposited layer 2112, or it can provide a form or radiation such as UV radiation that can cause chemical reactions and curing in the deposited layer 2112. After this step the processed sublayer 2114 moves on the substrate under a second direct write print head 2119, where an ink 2130 with a second formulation is delivered to deposit a layer 2118 onto the surface of processed sublayer 2114. The layer 2118 can then be processed by passing it under a second processing tool 2110, analogously to the processing effected by first processing tool 2107 to produce a processed layer 2120 onto the surface of processed sublayer 2114. As can be appreciated, the ink formulations, processing conditions, direct write tools and patterns can be varied according to the variables described throughout this invention to create a variety of desirable layer structures.

Figure 22:
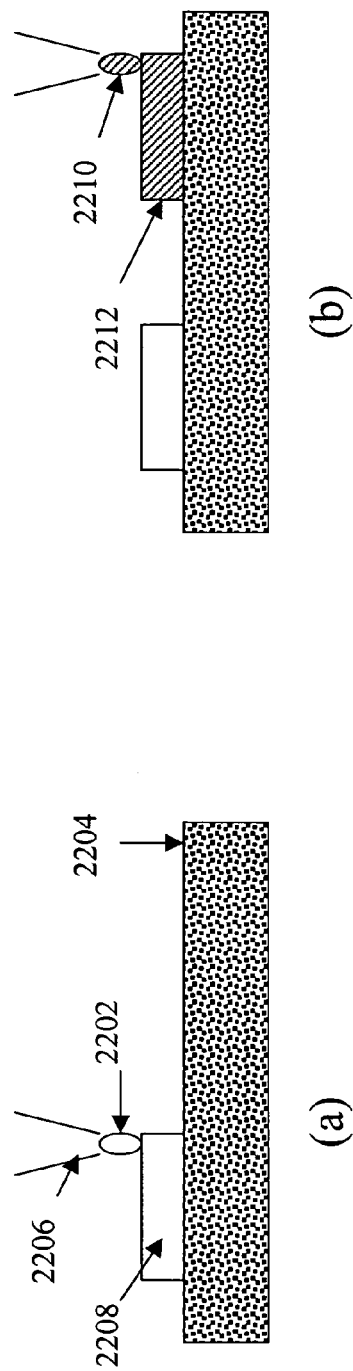
FIG. 22 illustrates a cross-sectional view of MEA layers manufactured in accordance with an embodiment of the present invention using multiple deposition steps.

In another preferred embodiment, illustrated schematically in FIGS. 22a to 22d, a first ink composition 2202 comprising a first electrocatalyst or electrocatalyst precursor is deposited on a first region of a PEM 2204 using a direct-write tool 2206 to create a first electrocatalyst layer 2208. Referring to FIG. 22b, a second ink composition 2210 comprising a second electrocatalyst or electrocatalyst precursor is deposited on a second region of the PEM using a direct-write tool to create a second electrocatalyst layer 2212. Referring to FIG. 22c, a third ink composition 2214 comprising a PCP material is deposited on at least a portion of at least one of the first and second electrocatalyst layers using a direct-write tool to create a PCP layer 2216. Referring to FIG. 22d, a fourth ink composition 2218 including carbon particles or HPO is deposited on at least a portion of the electrocatalyst layer(s) and the PCP layer(s) to create the fluid distribution layer(s) 2220. In each case the deposition can be followed by the appropriate drying and or heating processes necessary to achieve the desired concentration gradients and compositions in the layers. In the case of deposition of an electrocatalyst precursor, the deposited layer may also be exposed to thermal or chemical processing to achieve conversion of a catalyst precursor into the final active form of the catalyst.

Another preferred subassembly that can be manufactured in accordance with the present invention is a coated fluid distribution substrate. The method comprises depositing one or more ink compositions on a fluid distribution substrate using a direct-write tool. In a particularly preferred embodiment, a first ink composition comprising carbon particles or HPO is deposited onto at least a portion of a fluid distribution substrate using a direct-write tool to create a fluid distribution layer. A second ink composition comprising electrocatalyst particles is deposited on at least a portion of at least one of the fluid distribution layer and fluid distribution substrate using a direct-write tool to create an electrocatalyst layer. A third ink composition comprising PCP material is then deposited on at least a portion of the electrocatalyst layer to impregnate the electrocatalyst layer with PCP.

In another preferred embodiment, a first ink composition including a first conductive material such as silver or a silver/carbon mixture at one given ratio of concentrations is deposited on a first area of a fluid distribution substrate using a direct-write tool to create a first fluid distribution layer. A second ink composition including a second conductive material such as silver or a silver/carbon mixture at a second given ratio of concentrations is deposited on a second area of the fluid distribution substrate using a direct-write tool to create a second fluid distribution layer. A third ink composition including electrocatalyst particles is deposited on at least a portion of at least one of the first and second fluid distribution layers using a direct-write tool to create the one or more electrocatalyst layers. A fourth ink composition including an HPO material is deposited on at least a portion of at least one or more of the electrocatalyst layers to create one or more impregnated electrocatalyst layers.

After its manufacture, a subassembly is combined with other MEA components and subassemblies, as described below, as necessary to create an MEA with the desired characteristics.

In the foregoing embodiments, the ink compositions may be deposited by a single direct-write tool or a plurality of direct-write tools, each using one or more print heads. The ink compositions may be deposited on one side of the substrate or both sides of the substrate. The ink compositions may be deposited contemporaneously or sequentially. For example, a first ink composition may be contemporaneously or sequentially deposited on opposing sides of the PEM. Subsequently, a second ink may be deposited on the previously created layer(s) or substrates. The ink compositions may comprise any of the aforementioned electrocatalyst particles, multi-component particles, PCP, HPO and ELC materials and combinations thereof.

Each deposited layer may comprise tailored gradients in particle size, concentration or both within the layer, as described above. For example, the electrocatalyst layer may include deliberate variations in particles size, as described above. Alternatively, the differing layers, e.g., the electrocatalyst and fluid distribution layers, may comprise deliberate gradients in particle size, concentration or both with respect to each other. Accordingly, the electrocatalyst layer may include electrocatalyst particles which have a smaller average aggregate particle size than the particles in the fluid distribution layer. Alternatively, the electrocatalyst layer may comprise a greater concentration of hydrophobic material near the surface of the PEM than at the interface between the electrocatalyst layer and the fluid distribution layer. It should be noted that the foregoing examples are illustrative of only a few of the possible combinations and are not meant to limit the present invention in any manner.

Alignment of the various materials and layers within the MEA is also important. As used herein, alignment means the relative position of differing materials, components, layers and other items within the MEA to each other and also between different components of the MEA structures. Two items that are perfectly aligned would be in alignment to a tolerance of +/−10 μm. Typically, it is important to align the gasket materials, catalyst-coated GDL or PEM to achieve gas-tight and liquid-tight seals, which typically requires a tolerance of +/−300 μm.

As noted, a single direct-write tool may deposit a single ink composition in a deposition pattern on a single side of a substrate. Subsequent deposition steps must ensure alignment with the previously deposited materials. With the method of the present invention, deposition patterns created using a direct-write tool are capable of being produced and aligned within +/−50 μm of the desired alignment.

Alternatively, two or more direct-write tools may be used to deposit one or more ink compositions contemporaneously on either opposing sides or the same side of a substrate in one or more deposition patterns. With the method of the present invention, contemporaneously deposited first and second deposition patterns are capable of being produced and aligned within +/−50 μm of the desired alignment.

In another instance, one or more subassemblies, as described below, must be aligned with another subassembly or bare substrate. A subassembly may comprise layers created from the deposition of ink compositions or may simply be a bare substrate such as a PEM or fluid distribution substrate. When combining subassemblies with each other or with bare substrates, the layers within each subassembly must be aligned with the layers in the other subassemblies or substrates to achieve optimal performance. For example, a first subassembly comprising a first layer and a second subassembly comprising a second layer can be produced and the first and second subassemblies can be combined. With the method of the present invention, the first layer within the first subassembly and the second layer within the second subassembly are located within +/−50 μm of the desired alignment, after the combining.

As used herein a bare substrate is a substrate, such as a PEM, fluid distribution substrate, or bi-polar plate, that is substantially in its original state as received from its original equipment manufacturer, i.e., one that has not been contacted with an ink composition or other material.

After the appropriate subassemblies have been manufactured, it may be necessary to combine them to create the MEA where they have not been constructed in a single printing process. Generally, the subassemblies are combined using lamination.

As described earlier, lamination refers to the process where two or more substrates, e.g., a PEM coated with electrocatalyst materials and a fluid distribution substrate or a gas diffusion layer coated with a catalyst and PEM, are bonded together using heat, pressure and/or an adhesive. In one embodiment of the present invention, a subassembly, created at least in part using a direct-write tool, is combined with at least one of a second subassembly or a bare substrate. For example, the combined substrates can be aligned and pressed at a temperature of approximately 150° C. (for NAFION) and a pressure between 10 and 100 kg/cm² for a time between 1 second and 15 minutes.

In one embodiment of the present invention, a cassette-based process is used during the manufacture of MEAs. Cassettes are advantageous for quick transport between various manufacturing steps. In this embodiment, the PEM and/or fluid distribution substrates are of a selected size and are fabricated prior to the manufacture of the MEA in accordance with the selected size. The cassettes transport the substrates to the relevant locations within the manufacturing facility, where the substrates are processed as necessary to create subassemblies using a direct-write tool. The cassettes then transport the subassemblies to a lamination location within the manufacturing facility where the subassemblies are combined to create the MEA.

As noted, there are many different types of subassemblies that can be created, due in part to the number of available materials and capability of tailoring gradients in particle size and concentration. As a result, there is an even larger number of possible MEAs which can be fabricated using the method of the present invention. Described below are some preferred MEA manufacturing methods, although such descriptions are not intended to be a limitation on the methods of the present invention.

In one preferred embodiment, a method is provided for manufacturing a MEA using a membrane-coated subassembly. Prior to deposition of the ink composition, the printheads of one or more direct write tools and a PEM are aligned. One or more ink compositions are then contemporaneously deposited on opposing sides of the PEM using at least one direct-write tool. After the deposition is completed, the membrane-coated subassembly is then pressed together with a GDL to form the MEA.

In another preferred embodiment, two fluid distribution substrate-coated subassemblies are created using at least one direct-write tool and one ink composition. The two fluid distribution substrate-coated subassemblies may be created contemporaneously or sequentially and at a single print station or multiple print stations. The fluid distribution substrates are pre-sized and each has a smaller geometric surface area than the PEM. Preferably, the fluid distribution substrates have about the same geometric surface area with respect to each other prior to the deposition of the ink composition. After the subassemblies have been created, they are aligned with each other and combined with the PEM in a known manner, such as pressing. After the subassemblies have been combined with the PEM, the geometric surface area of the PEM that extends beyond the geometric surface area of the fluid distribution substrate-coated subassembly is trimmed so that the surface areas of the PEM and an individual fluid distribution substrate-coated subassembly are about equal.

In yet another preferred embodiment, a membrane-coated subassembly is created using a direct-write tool and an ink composition. Two fluid distribution substrate-coated subassemblies are also created. Preferably, the ink composition which is deposited on the membrane-coated subassembly includes electrocatalyst particles or powder and the ink composition which is deposited on the fluid distribution substrate-coated subassemblies includes a HPO and an ELC. After the subassemblies have been created, they are all aligned with each other and then pressed. In this embodiment, the alignment and pressing of the three subassemblies may occur contemporaneously, i.e., all three subassemblies aligned at one time with respect to each other and then pressed. Alternatively, the PEM and one fluid distribution substrate-coated subassembly can be aligned and then pressed and subsequently the second fluid distribution substrate-coated subassembly can be aligned with the opposing side of the PEM and then pressed.

EXAMPLES

In the present specification, TEFLON (E.I. duPont de Nemours, Wilmington, Del.) refers to a hydrophobic polymer, more specifically a tetrafluoroethylene fluorocarbon polymer. NAFION (E.I. duPont de Nemours, Wilmington, Del.) refers to a hydrophobic and proton-conducting polymer, specifically a sulfurated perfluorohydrocarbon polymer.

The description and examples also make reference to various forms of carbon by reference to trade names. The general properties of these carbon supports are listed in Table 3. SHAWINIGAN BLACK is an acetylene black available from Chevron Chemical Co., Houston, Tex. KETJENBLACK is available from Akzo Nobel, Amersfoort, Netherlands. VULCAN XC-72 is a furnace black available from Cabot Corp., Alpharetta, Ga., and is also available in graphitized form. PWA is an activated carbon available from Calgon Carbon Corp., Pittsburgh, Pa.

TABLE 3

Carbon Blacks used as Catalyst Supports

| Carbon Source | Particle Size (micrometers) | BET Surface Area ($m^2/g$) |
| --- | --- | --- |
| SHAWINIGAN BLACK | 0.055 | 80 |
| KETJENBLACK | 0.4* | 1400* |
| VULCAN XC-72 | 0.039 | 240 |
| PWA | 22 | 820 |

*These values are approximate.

Example

Particle Size Reduction for Ink-Jet Deposition

A 500 ml alumina mill was charged with 100 grams of 6 mm glass spheres and a slurry consisting of 50 grams of a supported catalyst made by spray processing and 100 grams of deionized $H_2O$. The supported catalyst was 60 wt. % PtRu supported on KETJENBLACK. The mill was placed on a mill stand and the jar was rotated a 45 rpm and wet samples were drawn from the jar at intervals for particle size distribution measurements. After 20 hours of milling there was little further change in the particle size and size distribution, but a reduction of the average particle size (d50) from 6.17 µm for the original powder to a d50 of 3.52 µm was obtained. The results are shown in Table 4. The particle size distribution of the milled powder was measured using laser scattering equipment (Microtrac, Inc., Montgomeryville, Pa.) without further ultrasonication of the suspension.

TABLE 4

Effect of Milling on Particle Size

| Time (hrs) | PSD 90% pass (µm) | PSD 50% pass (µm) | PSD 10% pass (µm) |
| --- | --- | --- | --- |
| 0 | 18.10 | 6.17 | 3.160 |
| 2 | 11.95 | 5.41 | 2.150 |
| 4 | 9.80 | 4.84 | 1.986 |
| 8 | 8.74 | 4.48 | 1.980 |
| 12 | 8.00 | 4.20 | 1.920 |
| 20 | 7.10 | 3.83 | 1.710 |
| 28 | 6.90 | 3.60 | 1.550 |
| 52 | 6.80 | 3.52 | 1.550 |

Table 4 is representative of the typical changes in the particle size distribution as a function of milling time and that particle size reduction at milling times longer than 20 hours (in this particular example) is negligible. Therefore, if the particle size distribution of the original powder is too broad and large aggregates are present, ball milling can be used to reduce the aggregate particle size and achieve particle size distributions amenable to formulating ink compositions useful for ink-jet printing. However, ball milling is only one way to achieve de-agglomeration and is used to describe a possible method for reduction of the electrocatalyst particle size, but is not meant to limit the present invention to this particular method of particle de-agglomeration.

Example

Dispersing Electrocatalyst Powders for Ink-Jet Deposition

Control of particle size is only one factor in preparing an inkjet composition containing particulates and soluble precursors to electrocatalysts, polymers and other functional materials required in the MEA electrode layer structures of the present invention. The EC/PCP/HPO/ELC-containing ink composition must be a stable solution of particles for successful deposition. Dispersants, surfactants and deflocculants are used to help form stable suspensions, but often the addition of these materials interferes with the catalytic action unless removed by washing, chemical reaction or thermal decomposition. These processes add additional steps to the fabrication of the MEA and so additives that do not have to be removed are preferred.

A variety of dispersants/additives to the inks can be used for achieving stable dispersions of particulate containing ink compositions. Table 5 lists a summary of 14 commercially available dispersants that were studied to determine the best candidates for electrocatalyst-containing ink compositions.

TABLE 5

Evaluated Dispersants

| Dispersant Name | Manufacturer | Compatibility/Solubility | Type of Dispersant |
| --- | --- | --- | --- |
| DARVAN 7 | R. T. Vanderbilt Company | Compatible with alcohols | Sodium salt of polyacrylic acid |
| DARVAN 811 | R. T. Vanderbilt Company | Miscible in water, soluble in methanol and compatible with other alcohols | Sodium polyelectrolyte |

TABLE 5-continued

Evaluated Dispersants

| Dispersant Name | Manufacturer | Compatibility/Solubility | Type of Dispersant |
|---|---|---|---|
| DARVAN 821A | R. T. Vanderbilt Company | Compatible with $H_2O$ | Ammonium polyacrylate |
| DARVAN C | R. T. Vanderbilt Company | Soluble in $H_2O$, compatible with alcohols | Ammonium polymethacrylate |
| DISPERBYK 190 | BYK-Chemie USA, Inc | Compatible with $H_2O$ | High molecular weight copolymer |
| DISPERBYK 191 | BYK-Chemie USA, Inc | Compatible with $H_2O$ | Copolymer with pig-ment affinic groups |
| DISPERBYK 192 | BYK-Chemie USA, Inc | Compatible with $H_2O$ | Copolymer with pig-ment affinic groups |
| SOLSPERSE 20000 | Avecia, Inc. | Miscible in $H_2O$, compatible with alcohols | Polymeric alkoxylate |
| SOLSPERSE 27000 | Avecia, Inc. | Compatible with $H_2O$ | Polymeric alkoxylate |
| SOLSPERSE 38500 | Avecia, Inc. | Compatible with aromatics, aliphatics and esters | 2-methoxy-1-methethyl acetate |
| SOLSPERSE 41090 | Avecia, Inc. | Compatible with $H_2O$ | Polymeric alkoxylate |
| SOLSPERSE 54000 | Avecia, Inc. | Miscible in $H_2O$, compatible with alcohols | Polymeric Dispersant |
| TEGO DISPERS 740W | Degussa Tego | Compatible with $H_2O$ and Isopropyl Alcohol | Non-ionic modified fatty acid derivative |
| TEGO DISPERS 750W | Degussa Tego | Compatible with $H_2O$ and Isopropyl Alcohol | Polymer groups with high pigment affinity |
| TEGO DISPERS 760W | Degussa Tego | Compatible with $H_2O$ and Isopropyl Alcohol | Polymer groups with high pigment affinity |

Samples of each dispersant listed in Table 5 were tested by DTA/TGA (differential thermal analysis/thermogravimetric analysis) to determine the decomposition temperatures. If any were found to decompose at a temperature below 150° C., they could be used in ink compositions applied directly to the membrane and then be eliminated by a thermal decomposition step. Decomposition temperatures between 150° C. and 300° C. would allow application of the inks to a gas diffusion layer (GDL) and heating the GDL to these temperatures in a processing step to remove the surfactants prior to lamination with the membrane.

As seen in Table 6, the TGA analyses of the dispersants did not indicate that any could be thermally decomposed below 330° C., thus eliminating the method of applying the ink composition either onto the membrane or onto the liquid or gas distribution layers and post processing them to remove the surfactants form the electrode layers.

TABLE 6

Decomposition Temperatures of Dispersants

| Dispersant | Decomposition Temperature (° C.) |
|---|---|
| DARVAN 7 | >600 |
| DARVAN 811 | >650 |
| DARVAN 821A | >500 |
| DARVAN C | >500 |
| DISPERBYK 190 | 390 |
| DISPERBYK 191 | 430 |
| DISPERBYK 192 | 430 |
| SOLSPERSE 20000 | 420 |
| SOLSPERSE 27000 | 410 |
| SOLSPERSE 38500 | >600 |
| SOLSPERSE 41090 | 330 |
| SOLSPERSE 54000 | 410 |
| TEGO DISPERS 740W | 430 |
| TEGO DISPERS 750W | 430 |
| TEGO DISPERS 760W | 390 |

Therefore, to evaluate the compatibility of the dispersants used in the inks, the performance of DMFC MEAs was studied when the dispersants were present in the cathode layers. Manufacturer's recommendations for amounts of dispersant were used in the preparation of standard platinum cathode ink compositions using spray processed 60 wt. % Pt on a KETJENBLACK support, the catalyst loaded on the cathode to 2.0 mgPt/cm$^2$. DMFC MEAs were fabricated using these inks and a standard PtRu black electrocatalyst (Johnson Matthey) for the anode ink at 2 mgPtRu/cm$^2$ loading. The MEA's were then conditioned overnight in a 75° C. oven with a flow of 2 M methanol and tested for electrical performance. Testing parameters were 15 mL/hour, 1 M methanol flow and 60 mL/hour air.

The manufacturer's recommended percentage of dispersant was used for the catalyst ink compositions. A solution containing this ratio of catalyst to deionized water (DI H$_2$O) was prepared and the solubility/miscibility of the dispersant was visually checked. A 5% NAFION solution in a ratio equal to the standard ink composition was added and the solution was then visually checked for any obvious interactions. SOLSPERSE 38500 was eliminated from the screening at this point when the dispersant precipitated out of the solution after several hours. The remaining dispersants tested as follows.

DARVAN 7

Manufacturer's recommended levels of this dispersant for ceramic white bodies are 1% to 2% of the dry body weight. A 1.98% solids by weight solution mixed well with DI H$_2$O and with the NAFION 5 wt. % solution. No obvious interactions were observed. The ink composition painted well on the membrane. Performance test of the MEA's yielded a maximum power density of 37.86 mW/cm$^2$.

DARVAN 811

Manufacturer's recommended amount of dispersant for ceramic slips is approximately 0.8%. A 1.05% of solids by weight solution of DARVAN 811 mixed well with DI H$_2$O and with the NAFION 5 wt. % solution. The ink applied well. The MEA's prepared with this ink composition showed a maximum power density of 16.5 mW/cm$^2$.

DARVAN 821A

There were no recommendations for amounts of this dispersant. A 1.1% of solids solution was prepared. This mixed well with DI H$_2$O and with the NAFION 5 wt. % solution. No obvious interactions were observed. The ink composition prepared with this dispersant painted well on the membrane. Performance testing of the MEA's showed maximum power density of 36.8 W/cm$^2$.

DARVAN C

Manufacturer's recommended levels of DARVAN C for ceramic slurries are 0.5% to 2% of solids loadings. A basic viscosity study showed that an ink composition with an amount of DARVAN C equal to 2% of solids gave the lowest viscosity curve indicating the best dispersion. An ink composition prepared with this amount DARVAN C showed no obvious interactions with the NAFION 5 wt. % solution. The ink prepared with this dispersant did not initially wet the membrane well. Once the first complete layer of catalyst was applied, subsequent layers painted well. The MEA delivered maximum power densities of 29.2 mW/cm$^2$.

DISPERBYK 190

BYK-Chemie, recommends for carbon black inks, 100% to 150% of the solids to be used as a deflocculant. A solution with the equivalent of 108.5%. of solids of DISPERBYK 190 was prepared. There did not appear to be any adverse reaction with the 5% NAFION solution. The ink composition prepared with this solution painted very well, wetting the membrane, covering very evenly and drying quickly. Maximum power density was only 3.5 mW/cm$^2$.

DISPERBYK 191

The recommended percentage of DISPERBYK 191 for carbon blacks is 30% to 100% of solids., A solution that would yield a 60.5 wt. % DISPERBYK 191 to solids ratio was prepared. The solution showed no observable interactions with the NAFION 5 wt. % solution. The ink prepared with this dispersant initially did not wet the membrane well. The dried catalyst was dragged by the brush unless very light pressure was used. Once a complete layer was established, subsequent layers applied evenly and easily. The dried catalyst layer on one of the membranes did crack during mask removal, indicating that the catalyst layer was not as robust as with other inks. MEA testing yielded a maximum power density of 2.56 mW/cm$^2$.

DISPERBYK 192

10 wt. % to 20 wt. % of the solids is the usual amount of dispersant for carbon black inks recommended by the manufacturer. A solution with the equivalent of 15.8% of the solids loading was, prepared. This mixed well with DI H$_2$O although the solution had a tendency to form bubbles. No adverse interaction was observed with the NAFION 5 wt. % solution. The ink initially did not wet the membrane well, but once a film was formed, the application was even and easy. MEA testing showed a maximum power density of 20.6 mW/cm$^2$.

SOLSPERSE 20000

A solution of 15% of solids amount of dispersant was miscible with DI H$_2$O, but showed slight clouding when mixed. The solution cleared when NAFION 5 wt. % solution was added. The standard ink formulated with this dispersant could not be applied to the MEA. Material did not adhere to the membrane. The MEA's could not be completed so no electrical data could be obtained.

SOLSPERSE 27000

Avecia, Inc. recommends between 1.44% and 7.26% of solids for dispersing organic and inorganic pigments. A solution representing 4.15% of solids was prepared. This mixed well with DI H$_2$O and with the NAFION 5 wt. % solution. No obvious interactions were observed. The ink painted and dried well on the MEA cathode. The electrical testing showed a maximum power density of 2.77 mW/cm$^2$.

SOLSPERSE 41090

A solution that would provide 1.2% dispersant of the total amount of ink was adjusted to a pH of 7.5 with the addition of diethanolamine (DEA). The actual percentage of dispersant to catalyst was 12.72 wt. %. This solution mixed well with Dl H$_2$O and with the NAFION 5 wt. % solution. No obvious interactions were observed. The ink painted and dried well on the MEA cathode. The electrical testing showed a maximum power density of 26.15 mW/cm$^2$.

SOLSPERSE 54000

The manufacturer suggests a 1.0 weight percent of solution for inks with solids loadings of 10 to 12 percent carbon black pigment. This translates to an amount of dispersant equal to 10 wt. % of the catalyst. A 10.46% loaded solution did not mix well with cold water, forming waxy globules.

After mixing with the ultrasonic horn for 5 minutes, a milky white solution formed. No obvious interaction when the NAFION 5 wt. % solution was observed. The ink did not apply very well with a brush. The dried catalyst tended to be dragged by the brush unless extremely light pressure was used. Once the initial layer of ink was applied and dried, subsequent layers applied evenly and easily. Cracking on one membrane was observed during the mask removal, indicating that the catalyst layer prepared with this dispersant is not as robust as most. Testing of the MEA showed maximum power density of 7.3 mW/cm$^2$.

TEGO DISPERS 740W

Tego recommends levels of 20% to 100% of the weight of carbon blacks for ink dispersions. A solution with the equivalent of 100 wt. % of the platinum catalyst was prepared. This solution was tested for solubility/miscibility with DI H$_2$O and NAFION 5 wt. % solution, and no observable interactions occurred. The solution applied well to the membrane. The maximum power density upon testing was 2.53 mW/cm$^2$.

TEGO DISPERS 750W

The levels for this dispersant for carbon black inks is between 40% and 120% of solids loading. A solution with the equivalent of 121 wt. % of surfactant to electrocatalyst was prepared and then checked for interactions with a NAFION 5 wt. % solution. No interactions or incompatibilities were observed and the ink applied well to the membrane. The maximum power density for the MEA prepared with this dispersant in the catalyst ink was 6.88 mW/cm$^2$.

TEGO DISPERS 760W

A solution with 20% total weight of solution for TEGO DISPERS 760 W, the recommended concentration of this dispersant was prepared, and no observable interaction were seen when checked for miscibility with the NAFION 5 wt. % solution. The actual percentage of solids equaled 216%. The ink painted well on the membrane, and when tested yielded a maximum power density of 11.59 mW/cm$^2$.

As can be seen from the above, testing of the MEA's under standard test conditions yielded two dispersants that did not interfere with the electrical performance of the catalyst, i.e., where the MEAs demonstrated the same performance as standard MEA which did not contain any dispersant. These dispersants were DARVAN 7 and DARVAN 821A. A DARVAN 7 prepared MEA showed a maximum power density of 37.9 mW/cm$^2$, while an MEA with DARVAN 821A had a maximum power density of 36.8 mW/cm$^2$.

Therefore, DARVAN 7, a sodium polymethacrylate, water-soluble dispersant and DARVAN 821A, an ammonium polyacrylate, water soluble dispersant can be left in the MEA and do not interfere adversely with the electrochemical process in a DMFC MEA since electrochemical performance is identical to that of MEA prepared without surfactants in the cathode ink composition.

Further, these two surfactants were used in the corresponding anode ink compositions to observe their effect on the anode catalyst and anode electrode. The compositions of the cathode and anode ink compositions are given in Tables 7 and 8.

TABLE 7

DARVAN 7 Ink Compositions

|  | Weight (g) | Weight (%) |
|---|---|---|
| Cathode Ink | | |
| Pt/C (60/40) Particles | 0.06304 | 9.39% |
| DI H$_2$O | 0.38201 | 56.84% |
| DARVAN 7 | 0.00127 | 0.19% |
| NAFION 5 wt % solution | 0.22534 | 33.58% |
| Anode Ink | | |
| Pt/C (60/40) | 0.06316 | 9.50% |
| DI H$_2$O | 0.38201 | 56.38% |
| DARVAN 7 | 0.00127 | 0.19% |
| NAFION 5 wt % solution | 0.22534 | 33.92% |

TABLE 8

DARVAN 821A Ink Compositions

|  | Weight (g) | Weight (%) |
|---|---|---|
| Cathode Ink | | |
| Pt/C (60/40) | 0.06312 | 9.40 |
| DI H$_2$O | 0.38016 | 56.59% |
| DARVAN 821A | 0.00064 | 0.09% |
| NAFION 5 wt % solution | 0.22788 | 32.92% |
| Anode Ink | | |
| Pt/C (60/40) | 0.06340 | 9.26% |
| DI H$_2$O | 0.38776 | 56.62% |
| DARVAN 821A | 0.00065 | 0.19% |
| NAFION 5 wt % solution | 0.22307 | 34.03% |

Figure 23:
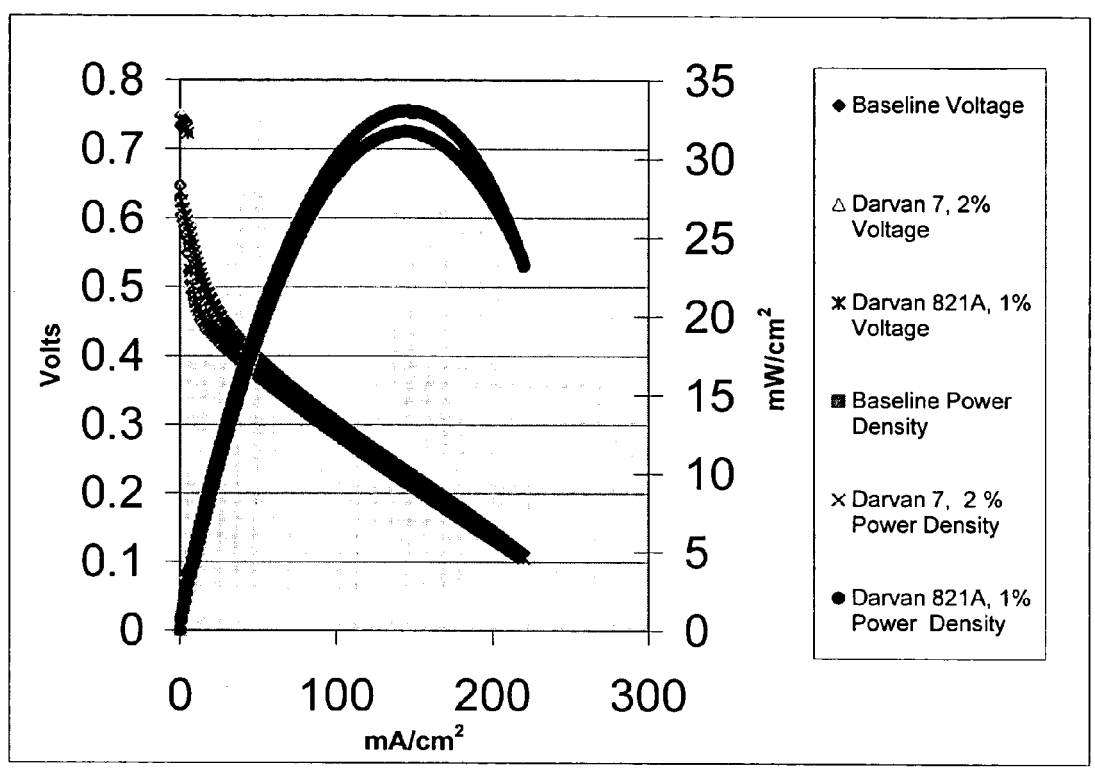
FIG. 23 illustrates polarization curves for MEAs created using ink compositions with and without surfactants according to an embodiment of the present invention.

As FIG. 23 shows, the polarization curves for the MEAs made with the inks containing the above two surfactants and the standard ink without dispersant are identical, indicating that these surfactants do not adversely affect the DMFC performance and can be used in electrocatalyst containing ink compositions.

Example

Dispersion and Settling of an Electrocatalyst Ink Composition

Optimization of the stability of the electrocatalyst ink composition requires establishing a proper amount of dispersant for the electrocatalyst solids loading, which is typically 10 wt. % but could be varied between 5 wt. % and 50 wt. %. The viscosity of a slurry of electrocatalyst materials will change based upon the amount of dispersant added.

Slurries containing about 16.7 wt. % electrocatalyst powder (60 wt. % Pt/C) and varying concentrations of DARVAN 7 dispersant were prepared and the viscosity measured at 100 rpm with a Brookfield DV II+rheometer using a #18 spindle. The shear rate for 100 rpm was constant at 132 s$^{-1}$ and the temperature was in the range of 20.5° C. to 21° C. The results are illustrated in Table 9.

TABLE 9

Effect of Dispersant Loading on Viscosity

| | | Weight Percent DARVAN 7 | | | | |
|---|---|---|---|---|---|---|
| | Speed | 0.53% | 1.28% | 2.00% | 2.51% | 3.06% |
| Viscosity (cP) | 100 rpm | 6.78 | 7.08 | 7.89 | 4.77 | 7.26 |
| | 50 rpm | 10.1 | 9.78 | 11.1 | 6.12 | 10.1 |
| | 20 rpm | 19.2 | 18.9 | 21.4 | No Reading | 18.1 |
| | 10 rpm | 30.3 | 29.7 | 35.1 | No Reading | No Reading |
| | 5 rpm | No Reading | No Reading | No Reading | No Reading | No Reading |
| Shear Stress (dynes/cm$^2$) | 100 rpm | 8.99 | 8.91 | 10.1 | 6.06 | 8.63 |
| | 50 rpm | 6.65 | 6.37 | 7.13 | 4.16 | 6.41 |
| | 20 rpm | 5.07 | 4.87 | 5.58 | No Reading | 4.99 |
| | 10 rpm | 3.92 | 4.12 | 4.63 | No Reading | No Reading |
| | 5 rpm | No Reading | No Reading | No Reading | No Reading | No Reading |
| % Torque | 100 rpm | 22.5 | 26.2 | 26.7 | 15.7 | 23.6 |
| | 50 rpm | 16.7 | 16.8 | 19.1 | 10.5 | 16.9 |

For the measurements of the settling velocities of ink compositions with various concentrations of dispersant, 10 ml of each composition was placed in a 10 ml graduated cylinder and the settling of the solids was observed over a period of 1 hour. Table 10 shows the volume to which the solids settled.

TABLE 10

Settling of Solids as Function of Dispersant Loading

Figure 24:
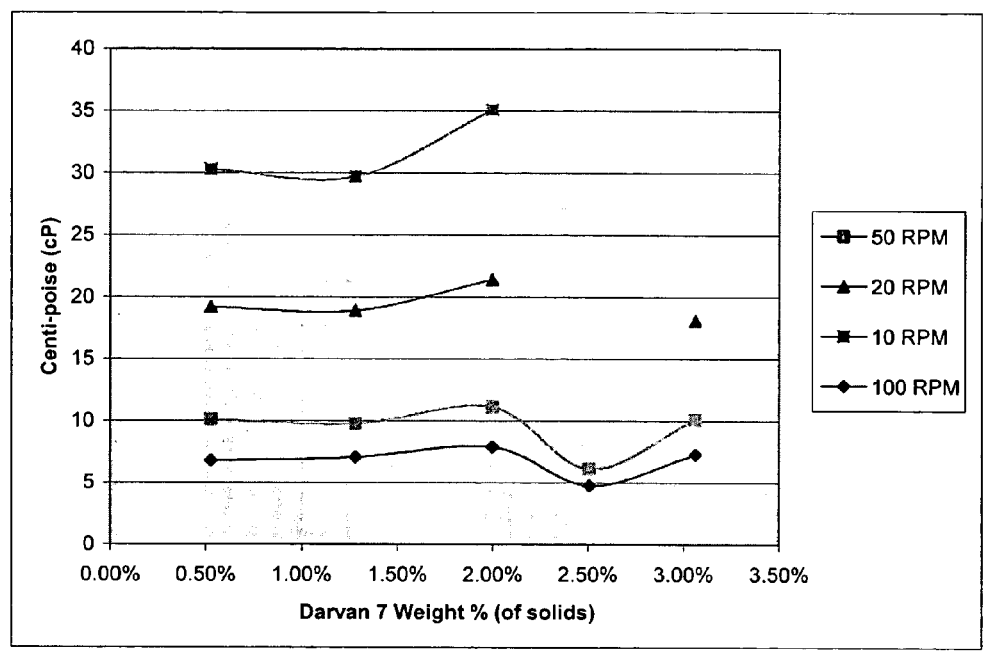
FIG. 24 illustrates the relationship between viscosity and concentration of DARVAN 7 for an ink composition according to an embodiment of the present invention.

| | | Weight Percent DARVAN 7 | | | | |
|---|---|---|---|---|---|---|
| | Time (Minutes) | 0.53% | 1.28% | 2.00% | 2.51% | 3.06% |
| Volume of Dispersed Solids (ml) | 0 | 10.0 | 10.0 | 10.0 | 10.0 | 10.0 |
| | 15 | 7.2 | 8.5 | 8 | 8.9 | 7.9 |
| | 30 | 6.7 | 7.8 | 7.3 | 8.1 | 7.2 |
| | 45 | 6.0 | 7.3 | 6.8 | 7.5 | 6.7 |
| | 60 | 5.8 | 7.0 | 6.4 | 7.2 | 6.4 |

Where the slurry shows the lowest viscosity (see FIG. 24) and where the slurry settles least is the optimum concentration of dispersant. The viscosity and the settling both show that a 2.51% concentration of DARVAN 7 is optimum for this electrocatalyst containing ink composition.

Example

Ink-Jet Deposition of Electrocatalyst Materials

An electrocatalyst ink composition containing 7.7 wt. % solids was deposited using a Spectra Nova 256AQ piezo-electric print head onto paper, KAPTON, glass and carbon paper. The jetting parameters for the Spectra system were:

| | |
|---|---|
| Fire Pulse | 150 V |
| Fire Pulse Duration | 8 μs |
| Fire Pulse Rise Time | 3 μs |
| Fire Pulse Fall Time | 3 μs |
| Fire pulse Frequency | 1 KHz |
| Meniscus Vacuum | 3 inches H$_2$O |
| Print Head Temperature | 40° C. |

The ink had the following composition and properties.

TABLE 11

Ink Composition for Ink-Jet Deposition

| Component | Weight (g) | Weight (%) |
|---|---|---|
| Pt/Ru (60%) on carbon (40%) | 5.715 | 7.7% |
| DI H$_2$O | 14.443 | 19.4% |
| DARVAN 7 (2.02% Solids) | 0.114 | 0.114 |
| Ethylene Glycol | 39.173 | 52.6% |
| Isopropanol | 15.119 | 20.3% |

| Ink Composition Properties | |
|---|---|
| Particle Size of Pt/Ru on Carbon (50%) | 3.520 μm |
| Surface Tension of Ink | 33.1 dynes/cm |
| Viscosity of Ink | 8.1 cP |
| Shear Stress | 10.7 dynes/cm$^2$ |
| Shear Rate (100 rpm) | 132 s$^{-1}$ |

Figure 25:
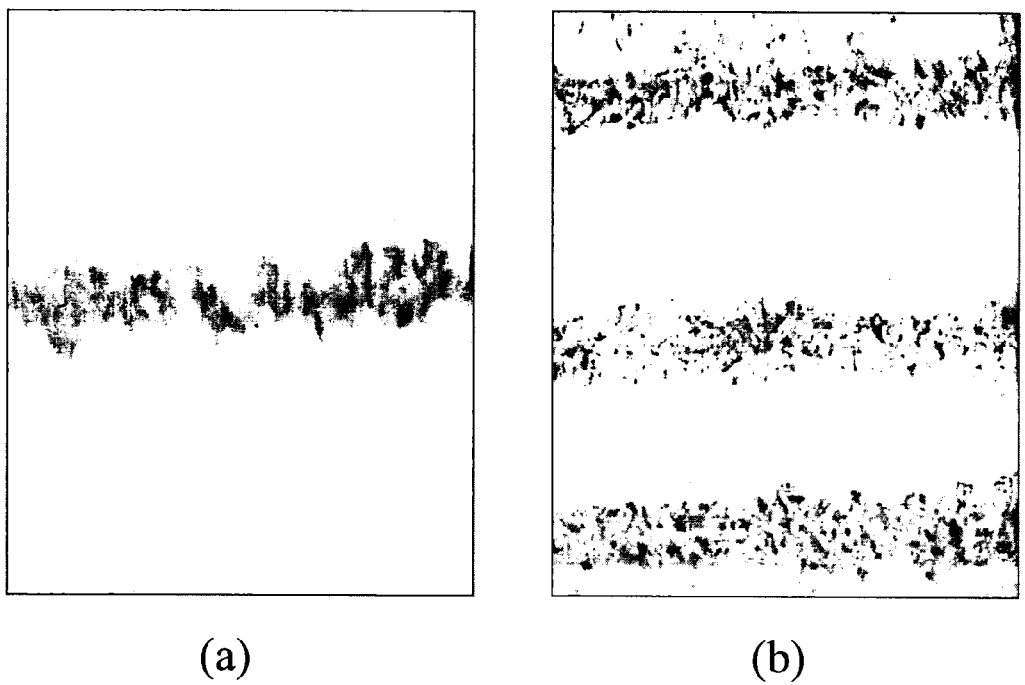
FIGS. 25a and 25b illustrate optical micrographs of dried patterns printed on a paper substrate in accordance with an embodiment of the present invention.
Figure 26:
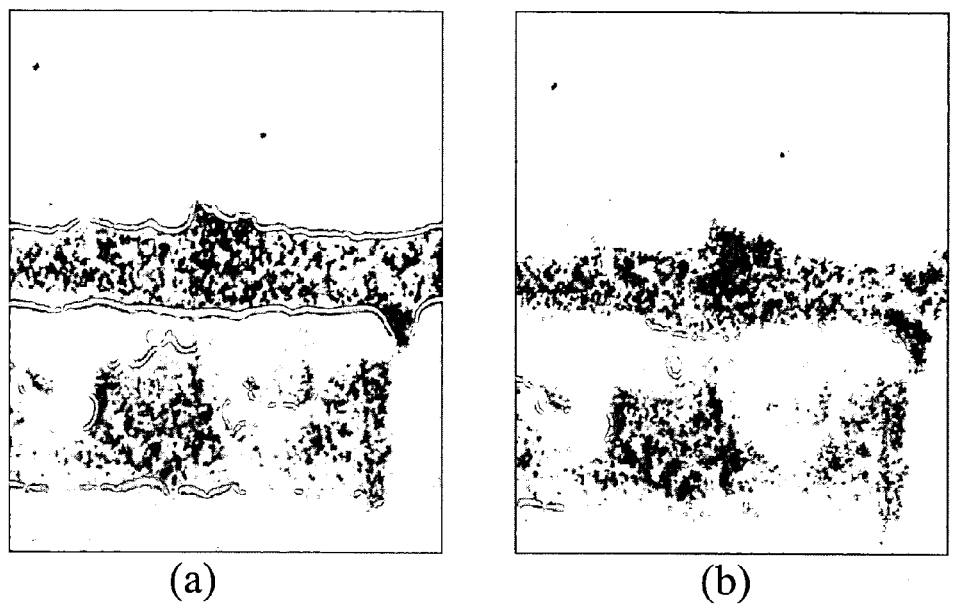
FIGS. 26a and 26b illustrate optical micrographs of dried patterns printed on a KAPTON substrate in accordance with an embodiment of the present invention.
Figure 27:
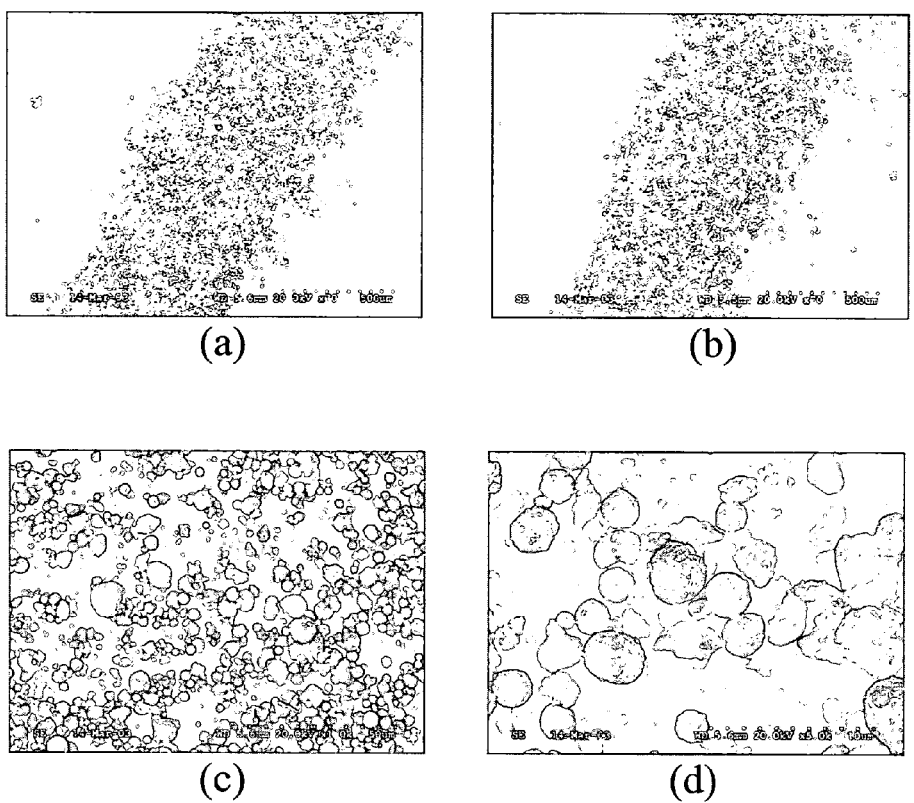
FIGS. 27a to 27d illustrate SEM photographs, of dried patterns and layers printed on glass substrates in accordance with an embodiment of the present invention.

FIGS. 25a and 25b illustrate optical micrographs of the dried patterns on the above substrates when printed on paper, FIGS. 26a and 26b illustrate optical micrographs of the dried patterns on the above substrates when printed on KAPTON and FIG. 27a to 27d show the SEM images of the patterns and layers of inks when printed on glass substrates.

Example

Synthesis of PVP-Stabilized Platinum Nanoparticles 1 gram H$_2$PtCl$_6$ (1.95 mmoles) and 3 grams of 40000 MW PVP (27 mmoles) were added to a mixed solvent of 150 mL H$_2$O and 150 mL ethylene glycol. The resulting solution was refluxed for 3 hours resulting in a black homogeneous dispersion. Nanoparticles can be isolated by crashing out of solution with treatment by a large excess of acetone.

Example

Ink Compositions Containing Metal Precursors 10 grams (NH$_3$)$_4$Pt(OH)$_2$ solution (12.72 wt % Pt), 10 grams ethylene glycol and 2 grams ethanol were combined to form an ink composition. The ink composition contained 5.78 wt % Pt and had a surface tension of 29.6 dynes/cm and a viscosity of 6.48 cP.

Example

Ink Compositions Containing Metal Precursor and Carbon Support 3.64 grams of a $(NH_3)_4Pt(OH)_2$ solution (12.72 wt % Pt), 7.14 grams ethylene glycol, 0.72 grams ethanol, 5 grams KETJENBLACK suspension (6 wt % carbon) and 1.5 grams 2-propanol were combined to form an ink composition. The ink composition contains 4.23% solids at a Pt:C ratio of 60:40. The surface tension of the ink is 36.1 dynes/cm with a viscosity of 12 cP.

Example

Ink Composition with 20 wt. % PtVC Cathode Electrocatalyst 1 gram of electrocatalyst particles was dispersed in 2 ml of de-ionized water and 10 ml of a 5% solution of NAFION to yield final composition after drying of the solvent of 67 wt. % catalyst and 33 wt. % NAFION. The electrocatalyst particles comprised 20 wt. % platinum on carbon (Pt/C) and the carbon support was SHAWINIGAN BLACK. The dispersion was sonicated in a water bath for at least 10 min. The particle size distribution for this composition is a $d_{10}$ of 1.9 µm, a $d_{50}$ of 4.7 µm and a $d_{95}$ of 16.0 µm. The viscosity was measured to be 10 centipoise in the range of 5 to 50 rpm.

Example

Ink Composition with 60 wt. % PtVC Cathode Electrocatalyst 1 gram of electrocatalyst particles was dispersed in 2 ml of de-ionized water and 10 ml of 5 wt. % NAFION solution to yield a final composition after drying the solvent of 60 wt. % catalyst and 40 wt. % NAFION. The electrocatalyst particles were 60 wt. % Pt/C where the carbon support is KETJENBLACK. The dispersion was sonicated in a water bath for at least 10 min. The particle size distribution for this composition is a $d_{10}$ of 3 µm, a $d_{50}$ of 6 µm and a $d_{95}$ of 14 µm.

The following examples illustrate ink-jettable compositions that are useful for the fabrication of DMFC (direct methanol fuel cell) electrodes.

Example

Ink Composition for DMFC Electrodes 1 gram of 60 wt. % precious metals (Pt, PtRu) on carbon electrocatalyst particles, where the carbon support is KETJENBLACK, was dispersed in 6 grams de-ionized water and a 5 wt. % NAFION solution to have a final weight ratio of 85:15 of dry catalyst to NAFION in the final electrode structure. The composition was then mildly sonicated using a bath. The particle size distribution for this composition was a $d_{10}$ of 3.4 µm, a $d_{50}$ of 6.5 µm and a $d_{95}$ of 16.8 µm. Viscosity was measured to be 23 centipoise at 5 rpm and 92 centipoise at 50 rpm. The composition had a surface tension of 30 mN/m.

Example

Ink Composition for DMFC Electrodes 1 gram of porous, micron-sized pure Pt particles prepared by a spray conversion method was dispersed in 10 gram de-ionized water by sonication using an ultrasonic horn. A NAFION solution (5% by weight) was then added to have a final weight ratio of 90:10 of dry catalyst to NAFION in the final electrode structure. The viscosity of this ink was about 7 to 10 centipoise with a surface tension of 30 mN/m. The particle size distribution for this ink was a $d_{10}$ of 1 µm, a $d_{50}$ of 3.2 µm and a $d_{95}$ of 10.6 µm.

Example

Ink Composition for DMFC Electrodes 1 gram of Pt blacks was dispersed in 10 grams de-ionized water by sonication using an ultrasonic horn. A NAFION solution (5% by weight) was then added to have a final weight ratio of 90:10 of dry catalyst to NAFION in the final electrode structure. The particle size distribution for this ink was a $d_{10}$ of 1 µm, a $d_{50}$ of 5 µm and a $d_{95}$ of 20 µm.

Example

Use of Molecular Precursor

As is discussed above, preferred precursors for platinum metal according to the present invention include chloroplatinic acid ($H_2PtCl_6 \cdot H_2O$), tetraamineplatinum (II) nitrate ($Pt(NH_3)_4(NO_3)_2$), tetraamineplatinum (II) hydroxide ($Pt(NH_3)_4(OH)_2$), tetraamineplatinum (II) bis(bicarbonate) ($Pt(NH_3)_4(HCO_3)_2$), platinum nitrate ($Pt(NO_3)_2$), hexa-hydroxyplatinic acid ($H_2Pt(OH)_6$), platinum (II) 2,4-pentanedionate ($Pt(acac)_2$), and platinum (II) 1,1,1,5,5,5-hexafluoro 2,4-pentanedionate ($Pt(hfac)_2$). Other platinum precursors include Pt-nitrates, Pt-amine nitrates, Pt-hydroxides, Pt-carboxylates, $Na_2PtCl_4$, and the like.

The Pt precursor is dissolved in either water or organic based solvent up to 30 wt. % concentration. A portion of appropriate solvent (water or organic based) is slowly added to a carbon dispersion similar to GRAFO 1300 (Fuchs Lubricant, Harvey, Ill.), while being shear mixed to achieve up to 30 wt. % solids loading dispersion. A solution of Pt precursor is then slowly added to the shearing carbon dispersion. The resulting composition is then shear mixed for an additional 10 minutes. The viscosity for a 5 wt. % solids loading dispersion is measured to be 3 to 4 centipoise with surface tension of 77 mN/m.

Example

Graded Hydrophobicity Layers

A number of graded hydrophobicity layers were produced in accordance with the present invention. In a first example, a single layer of TEFLON-modified carbon was printed on top of an electrocatalyst layer, the other side of the electrocatalyst layer interfacing the electrolyte. The TEFLON-modified carbon layer consisted of 35 wt. % TEFLON and 65 wt. % SHAWINIGAN BLACK. The average thickness of the layer was 90 µm and the loading of the TEFLON-modified carbon was about 2.5 mg/cm². The ink composition consisted of SHAWINIGAN BLACK, TEFLON particles, surfactants and water. The printed layer was then subjected to roll pressing and the sample was heated at 300° C. for 5 minutes to drive out surfactants used in the ink composition.

In a second example, two 50 μm thick sublayers of TEFLON-modified carbon were printed on top of an electrocatalyst layer, the other side of the electrocatalyst layer interfacing the electrolyte. The first sublayer of TEFLON-modified carbon interfacing the electrocatalyst layer consisted of 35 wt. % TEFLON and 65 wt. %. SHAWINIGAN BLACK. The second sublayer of TEFLON-modified carbon consisted of 50 wt. % TEFLON and 65 wt. % SHAWINIGAN BLACK. The average thickness of the layer was 90 μm and the loading of the TEFLON-modified carbon was about 2.5 mg/cm². The ink composition consisted of SHAWINIGAN BLACK, TEFLON particles, surfactants and water. The printed layer was subjected to roll pressing and the samples were heated at 300° C. for 5 minutes to drive out surfactants used in the ink composition.

In a third example, the various layers were consecutively added to a nickel mesh. First, a 100 μm electrocatalyst layer and then a 100 μm TEFLON-modified carbon layer. The TEFLON-modified carbon layer consisted of 35 wt. % TEFLON and 65 wt. % SHAWINIGAN BLACK. The electrocatalyst layer consisted of 65 wt. % electrocatalyst (with a ratio of 15 wt. % $MnO_2$ with respect to the PWA activated carbon support) and 35 wt. % TEFLON-modified carbon (35 wt. % TEFLON and 65 wt. % SHAWINIGAN BLACK). The electrocatalyst layer and the TEFLON-modified carbon layers were deposited at 10 mg/cm² loadings. All layers were simultaneously pressed at pressure (600 kg/cm² or 160 kg/cm²) and no heating was employed.

In another example, a nickel mesh was again used and layers were deposited on the nickel mesh. First, a 100 μm thick electrocatalyst layer was deposited and then a 100 μm thick TEFLON-modified carbon layer was deposited. The TEFLON-modified carbon layer consists of 50 wt. % TEFLON and 50 wt. % SHAWINIGAN BLACK. The electrocatalyst layer consists of 65 wt. % electrocatalyst (with a ratio of 15 wt. % $MnO_2$ with respect to the PWA activated carbon support) and 35 wt. % TEFLON-modified carbon (35 wt. % TEFLON and 65 wt. % SHAWINIGAN BLACK). The electrocatalyst layer and the TEFLON-modified carbon layer were deposited at 10 mg/cm². loadings. All layers were simultaneously pressed under pressure (600 kg/cm² or 150 kg/cm²) and no heating was employed.

In yet another example, layers were again deposited on nickel mesh. First, a 100 μm electrocatalyst layer was deposited. Then a first 100 μm thick TEFLON-modified carbon layer was deposited over which a second 100 μm thick TEFLON-modified carbon layer was deposited. The first TEFLON-modified carbon layer consisted of 35 wt. % TEFLON and 65 wt. % SHAWINIGAN BLACK. The second TEFLON-modified carbon layer consisted of 50 wt. % TEFLON and 50 wt. % SHAWINIGAN BLACK. The electrocatalyst layer consisted of 65 wt. % electrocatalyst (with a ratio of 15 wt. % $MnO_2$ with respect to the PWA activated carbon support) and 35 wt. % TEFLON-modified carbon (35 wt. % TEFLON and 65 wt. % SHAWINIGAN BLACK). The electrocatalyst layer and the TEFLON-modified carbon layers were deposited at 10 mg/cm² loadings. All layers were simultaneously pressed under pressure (600 kg/cm² or 150 kg/cm²) and no heating was employed.

In a further example, two layers were deposited on a nickel mesh. First, a 100 μm thick electrocatalyst layer was deposited and then a 100 μm TEFLON-modified carbon layer was deposited. The TEFLON-modified carbon layer consisted of 35 wt. % TEFLON and 65 wt. % VULCAN XC-72. The electrocatalyst layer consisted of 65 wt. % electrocatalyst (15 wt. % $MnO_2$ dispersed on PWA) and 35 wt. % TEFLON-modified carbon (35 wt. % TEFLON and 65 wt. % SHAWINIGAN BLACK). The electrocatalyst layer and the TEFLON-modified carbon layers were deposited at 10 mg/cm² loadings. The layers were simultaneously pressed under pressure (600 kg/cm² or 160 kg/cm²) and no heating was employed.

While various embodiments of the present invention have been described in detail, it is apparent that adaptations and modifications of those embodiments will occur to those skilled in the art. Such adaptations and modifications are within the scope of the present invention.

What is claimed is:

1. A method for the fabrication of a catalyst layer, comprising the steps of:
    a) depositing an ink composition onto a substrate, said ink composition comprising a liquid vehicle, a particulate support phase and a molecular precursor to an active species phase; and
    b) heating said ink composition to a temperature of not greater than about 200° to convert said molecular precursor to an active species phase dispersed on said support phase and form a catalyst layer.

2. A method as recited in claim 1, wherein said depositing step comprises depositing said ink composition using a direct-write tool.

3. A method as recited in claim 1, wherein said depositing step comprises depositing said ink composition using an ink-jet device.

4. A method as recited in claim 1, wherein said substrate is an ion exchange membrane.

5. A method as recited in claim 1, wherein said heating step comprises heating said ink composition to a temperature of not greater than about 150° C.

6. A method as recited in claim 1, wherein said active species phase comprises platinum metal.

7. A method as recited in claim 1, wherein said ink composition comprises a molecular precursor selected from the group consisting of nitrates, carboxylates, beta-diketonates and compounds containing metal-carbon bonds.

8. A method as recited in claim 1, wherein said ink comprises a divalent platinum(II) complex.

9. A method as recited in claim 1, wherein said ink composition has a viscosity of not greater than about 100 centipoise.

10. A method as recited in claim 1, wherein said ink composition has a viscosity of not greater than about 50 centipoise.

11. A method as recited in claim 1, wherein said ink composition further comprises a reducing agent.

12. A method as recited in claim 1, wherein said molecular precursor is a volatile molecular precursor.

13. A method as recited in claim 1, wherein said particulate support phase comprises carbon particles.

14. A method as recited in claim 1, wherein said particulate support phase comprises a metal oxide.

15. A method for the fabrication of an electrocatalyst layer, comprising the steps of:
    a) depositing an ink precursor composition onto a substrate, said ink composition comprising a liquid vehicle, particulate carbon and a molecular precursor to an active species phase; and
    b) reacting said precursor composition with a reducing agent to convert said active species phase precursor to an active species phase and form an electrocatalyst layer.

16. A method as recited in claim 15, wherein said depositing step comprises depositing said ink composition using a direct-write tool.

17. A method as recited in claim 15, wherein said depositing step comprises depositing said ink composition using an ink-jet device.

18. A method as recited in claim 15, wherein said substrate is an ion exchange membrane.

19. A method as recited in claim 15, further comprising the step of heating said ink composition to a temperature of not greater than about 200° C.

20. A method as recited in claim 15, wherein said active species phase comprises platinum metal.

21. A method as recited in claim 15, wherein said molecular precursor comprises a divalent platinum(II) complex.

22. A method as recited in claim 15, wherein said ink composition comprises a molecular precursor selected from the group consisting of nitrates, carboxylates beta-diketonates, and compounds with carbon-platinum bonds.

23. A method as recited in claim 15, wherein said ink composition has a viscosity of not greater than about 100 centipoise.

24. A method as recited in claim 15, further comprising the step of heating said ink composition.

25. A method for the fabrication of an electrocatalyst layer, comprising the steps of:
  a) depositing an ink composition onto a substrate, said ink composition comprising a liquid vehicle, particulate carbon and a molecular precursor to an active species phase; and
  b) reacting said ink composition with a form of radiation to convert said active species phase precursor to an active species phase and form an electrocatalyst layer.

26. A method as recited in claim 25, wherein said radiation is in the form of ultraviolet radiation.

27. A method as recited in claim 25, wherein said depositing step comprises depositing said ink composition using a direct-write tool.

28. A method as recited in claim 25, wherein said depositing step comprises depositing said ink composition using an ink-jet device.

29. A method as recited in claim 25, wherein said substrate is an ion exchange membrane.

30. A method as recited in claim 25, wherein said substrate is a proton exchange membrane.

31. A method as recited in claim 25, wherein said reacting step comprises heating said precursor composition to a temperature of not greater than about 200° C.

32. A method as recited in claim 25, wherein said active species phase comprises platinum metal.

33. A method as recited in claim 25, wherein said molecular precursor comprises a divalent platinum(II) complex.

34. A method as recited in claim 25, wherein said ink composition comprises a molecular precursor selected from the group consisting of nitrates, carboxylates beta-diketonates, and compounds with carbon-platinum bonds.

35. A method as recited in claim 25, wherein said ink composition has a viscosity of not greater than about 100 centipoise.

36. A method as recited in claim 25, wherein said ink composition further comprises a reducing agent.

37. A method for the fabrication of a catalyst layer, comprising the steps of:
  a) depositing an ink composition onto a substrate, said ink composition comprising a liquid vehicle, a first particulate material and a second particulate material comprising nanoparticles; and
  b) converting said ink composition into an catalyst layer.

38. A method as recited in claim 37, wherein said depositing step comprises depositing said ink composition using a direct-write tool.

39. A method as recited in claim 37, wherein said depositing step comprises depositing said ink composition using an ink-jet device.

40. A method as recited in claim 37, wherein said first particulate material is carbon.

41. A method as recited in claim 37, wherein said first particulate material is a metal oxide.

42. A method as recited in claim 37, wherein said substrate is an ion exchange membrane.

43. A method as recited in claim 37, wherein said substrate is gas diffusion layer.

44. A method as recited in claim 37, wherein said substrate is liquid diffusion layer.

45. A method as recited in claim 37, wherein said converting step comprises heating said ink composition to a temperature of not greater than about 150° C.

46. A method as recited in claim 37, wherein said nanoparticles are selected from the group consisting of platinum, rhodium, ruthenium, cobalt, nickel and palladium nanoparticles.

47. A method as recited in claim 37, wherein said ink composition has a viscosity of not greater than about 100 centipoise.

48. A method as recited in claim 37, wherein said ink composition has a viscosity of not greater than about 50 centipoise.

* * * * *